United States Patent
Kondo

(10) Patent No.: US 7,185,248 B2
(45) Date of Patent: Feb. 27, 2007

(54) FAILURE ANALYSIS SYSTEM AND FAILURE ANALYSIS METHOD OF LOGIC LSI

(75) Inventor: Takayuki Kondo, Hyogo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 392 days.

(21) Appl. No.: 10/621,603

(22) Filed: Jul. 18, 2003

(65) Prior Publication Data

US 2004/0044485 A1    Mar. 4, 2004

(30) Foreign Application Priority Data

Sep. 4, 2002   (JP)   ............... 2002-259280

(51) Int. Cl.
  *G01R 31/28*   (2006.01)
  *G06F 11/00*   (2006.01)
  *G11B 5/02*    (2006.01)
  *G11B 5/09*    (2006.01)

(52) U.S. Cl. .................. 714/724; 714/736; 360/27; 360/53

(58) Field of Classification Search ................ 714/724, 714/725, 736
See application file for complete search history.

(56) References Cited

U.S. PATENT DOCUMENTS 5,517,481 A * 5/1996 Kobayashi ............... 369/47.17
6,105,156 A * 8/2000 Yamauchi .................. 714/738
6,192,494 B1  2/2001 Sugimoto
6,438,081 B2 * 8/2002 Jinbo et al. ............... 369/47.28

FOREIGN PATENT DOCUMENTS

JP   05-334120    12/1993
JP   06-095913    4/1994
JP   2001-249823  9/2001

* cited by examiner

*Primary Examiner*—Phung My Chung
(74) *Attorney, Agent, or Firm*—Volentine & Whitt, P.L.L.C.

(57) ABSTRACT

A failure analysis system of a logic LSI incorporates software therein. The analysis system includes a function to record the terminal signal information of said logic LSI in synchronization with a clock and a function to reproduce said recorded terminal signal information in synchronization with the clock. The analysis system further includes a function to compare said reproduced terminal signal information with the terminal signal information of a normal logic LSI.

17 Claims, 55 Drawing Sheets

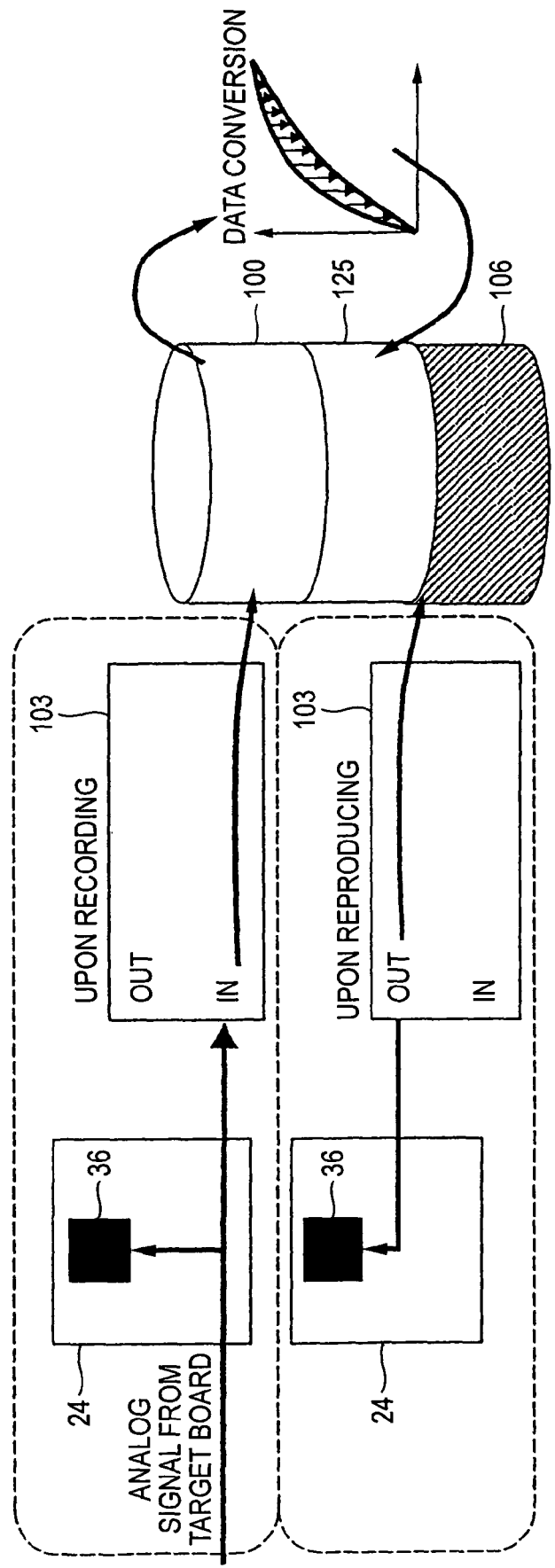

INPUT     OUTPUT

FAILURE ANALYSIS SYSTEM AND FAILURE ANALYSIS METHOD OF LOGIC LSI

BACKGROUND OF THE INVENTION

The present invention relates to a failure analysis system of a logic LSI in which software is incorporated.

A LSI ((Large Scale Integration circuit) such as a microcomputer and a DSP (Digital Signal Processor) is a logic LSI in which software is incorporated. Hereinafter, this will be merely referred to as a "microcomputer". In a system using a microcomputer, due to a defect or the like arising in a wafer process, a defect may arise that cannot be detected by a delivery inspection. Hereinafter, a microcomputer having such a defect will be referred to as a "defective microcomputer" and a microcomputer without a defect will be referred to as a "normal microcomputer".

FIG. 53 typically shows that a defective microcomputer 5 is incorporated in a target system 1 of a failure analysis. The defective microcomputer 5 is connected to a display circuit 2 and an input/output circuit 3 by a signal line through an inner circuit 4, and on the other hand, the defective microcomputer 5 is connected to an interface circuit 6 by the signal line. An arrow in FIG. 53 indicates incomings and outgoings of a signal (information) (hereinafter, this is same in the present specification and present drawings). The defect of the defective microcomputer 5 will be found when the defective microcomputer 5 is incorporated into the target system 1 and the system is inspected or when the target system 1 is used.

Conventionally, in the failure analysis of the microcomputer, the defect is repeated by the system in which the microcomputer is incorporated to seek a cause according to the analysis of a circuit signal configuring this system. For example, in the case that the defect of the microcomputer is proved, the failure analysis of this defective microcomputer is carried out in such a manner that the defective microcomputer is separated from the system and a more detail test program is carried out by a LSI tester.

As a technical literature related to the above described related art, the followings may be considered.

JP-A-6-95913
JP-A-5-334120
JP-A-2001-249823

However, in the defective microcomputer, the defect may arise only when the special conditions not detected on the items of the delivery inspection are met, and this results in making impossible to examine all the possibilities of generation of the defect even by a detailed test program.

For example, according to a conventional failure analysis method to generate a defect artificially with the microcomputer mounted on the system and to analyze a signal by a logic analyzer, the conditions from start of the system till the generation of the defect are not the same at a clock resolution level of the microcomputer. As a result, the conditions of parameters owned by a software are different and thereby, a generation probability of the defect and repeatability of the condition of the defect are not high.

In addition, according to a conventional failure analysis method to mount a single piece of the microcomputer on a tester and to operate a test program, a defect is not repeated in the case that a cause of the defect is not included in the signal to be supplied to the microcomputer by the test program. In addition, this test program is manufactured by predicting a defective signal according to the above described conventional failure analysis method to generate a defect artificially and to analyze a signal by a logic analyzer. Therefore, it takes enormous amounts of man hours to manufacture the test program and further, a ratio of finding the defect is low, and resulting in a low efficiency of the failure analysis.

The cause of generation of the defect in the microcomputer and the process to the detection of the defect will be described in detail below.

FIG. 54 is an inner structural view of a normal microcomputer. As shown in FIG. 54, a microcomputer 7 has a ROM (Road-Only Memory) 8, a CPU 10, a RAM (Random Access Memory) 11, an interface register 12, a peripheral resister 13, an input/output interface 14 such as an IO (Input Output) port, a peripheral 15, an input terminal 16, and an output terminal 17. Then, in the ROM 8, application software 9 is located. An arrow shown in FIG. 54 represents a flow of a signal (information). In the microcomputer 7, the data is written in the RAM 11 and the registers 12 and 13 by the application software 9 so that hardware (the ROM 8, the CPU 10, the RAM 11, the interface 14, and the peripheral 15) maybe controlled.

FIG. 55 is an inner structural view of a defective microcomputer. With reference to FIG. 55, the case will be described in which the defect of some kind is generated in the hardware. An asterisk shown in FIG. 55 represents "defective", "abnormal", or "false". In FIG. 55, since a condition that the defect arises is met assuming that a defect is generated in the peripheral 15, a content of the peripheral resister 13 showing the peripheral condition becomes "abnormal". Then, the application software 9 reads this register 13 and resulting in a false judgment. Then, the false information will be written in the RAM 11. Further, the application software 9 will read the RAM 11 in which this false information is written. Reaching to the process for outputting the value from a port, the false value will be written in the interface register 12 and the interface 14 will output the false information. The defect can be detected from the outside of the defective microcomputer 5 only by outputting this false information.

As described above, in the microcomputer in which the application software lies, even if the defect is generated, time lag may be generated for a period of time from generation of the defect to the detection thereof. Therefore, in order to analyze the cause of the defect, it is necessary to presume a true cause by predicting the operation of the application software on the basis of the detected defective information and predicting the conditions of the RAM and the resistors or the like.

However, the conventional analysis method involves the following problems.

1. The repeatability of the defect is not good.
2. It is difficult to analyze the relevance between the true defect and the detected defect.
3. It is difficult to establish a test method to prevent reappearance of the defect.
4. It is difficult to build an analysis system.

SUMMARY OF THE INVENTION

Therefore, an object of the present invention is to provide a failure analysis system and a failure analysis method of a logic LSI, whereby the above-described problems 1 to 4 can be solved, the repeatability of the defect is excellent, the relevance between the true defect and the detected defect is easily analyzed, the test method to prevent the reappearance of the defect is easily established, and the analysis system is easily built.

In order to solve the above-described problems, a failure analysis system according to the present invention comprises a failure analysis system of a logic LSI having software incorporated therein including: a function to record the terminal signal information of said logic LSI in synchronization with a clock; a function to reproduce the recorded terminal signal information in synchronization with the clock; and a function to compare the reproduced terminal signal information with the terminal signal information of a normal logic LSI. According to such a structure, the repeatability of the defect may be improved.

BRIEF DESCRIPTION OF THE DRAWINGS

FIG. 48 is a conceptual diagram for explaining the operation to compare the comparative analog trace data with the reproduced analog trace data according to the fifteenth embodiment.

DETAILED DESCRIPTION OF THE INVENTION

Figure 1:
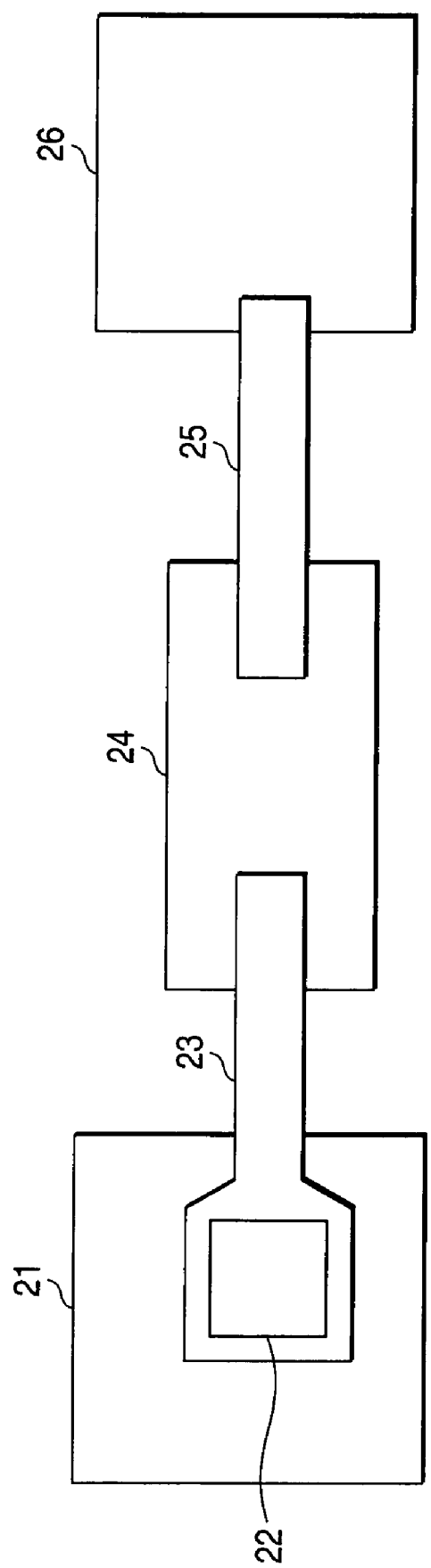
FIG. 1 is a conceptual diagram for showing a structure of a failure analysis system according to a first embodiment.

With reference to the drawings, some embodiments according to the present invention will be described below. By the way, in the present specification and the drawings, the same reference numerals and signs are given to the constituent elements having the substantially same functions and the double explanation is omitted.

(First Embodiment)

A first embodiment may solve the problem 1 that the repeatability of the defect is not good. In order to solve this problem and to certainly repeat the defect, synchronizing the terminal condition of the microcomputer with a clock of the microcomputer and recording it, a failure analysis system of the first embodiment, saves the terminal condition of the microcomputer as the terminal trace data. Then, synchronizing this terminal trace data with the clock and injecting it in the microcomputer, the system will reproduce the recorded terminal trace data.

FIG. 1 shows a structure of a failure analysis system according to a first embodiment. This system may be configured including a work station 26 for controlling the system and an analysis board 24. With a defective microcomputer 22 mounted on a target system 21, all terminals, or the remaining terminals except a VDD and a GND are connected to the analysis board 24 through an inspection probe 23. The defects are not likely to be generated in a VDD terminal of a power source and a GND terminal of earth as compared with a signal terminal, thereby, these VDD terminal and GND terminal may not be applicable. The analysis board 24 and the work station 26 are connected through each signal line in a connection harness 25.

Figure 2:
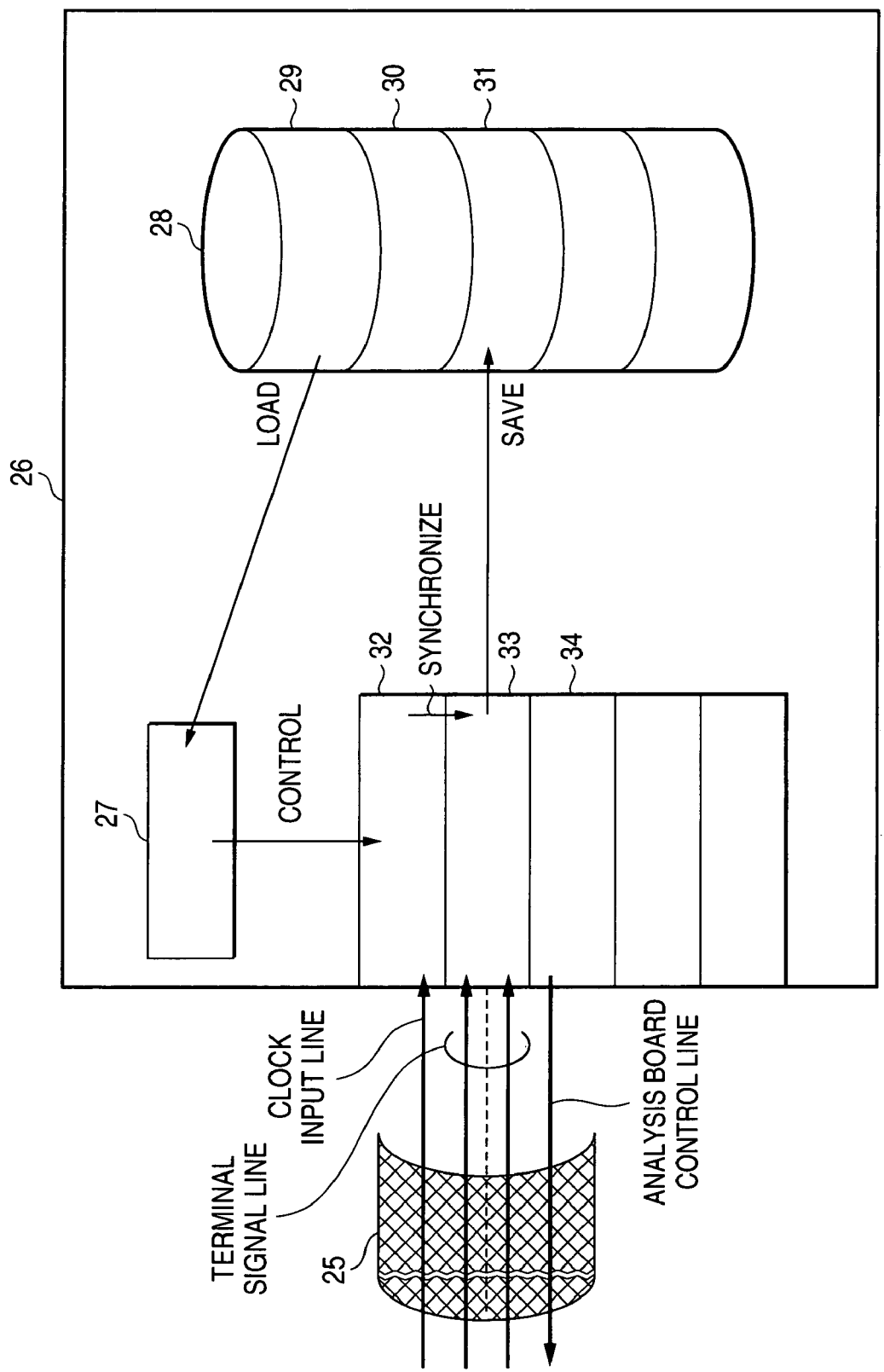
FIG. 2 is a conceptual diagram for showing a structure of a work station upon recording according to the first embodiment.

FIG. 2 is a conceptual diagram for showing a structure of the work station 26 according to the first embodiment. The work station 26 is structured including a CPU 27, a storage 28, a clock control board 32, a terminal digital IO board 33, and a control digital IO board 34. The CPU 27 is a brain of control of the work station 26 and the storage 28 is a high-capacity data storage system for saving the data. The clock control board 32 has a function for oscillating an arbitrary clock frequency by controlling the software and transmitting it to the outside and a function for synchronizing the mounted other board with a clock that is filled from the outside. The terminal digital IO board 33 is a dual-directional digital IO board capable of switching input/output and having channels not less than the terminals of the microcomputer 22. The control digital IO board 34 has a function to control a microcomputer interface module 35 on the analysis board 24. A clock input line is an input line of a clock signal, a terminal signal line is a signal line to connect the terminal of the microcomputer 22 with the terminal digital IO board 33, and an analysis board control line is a signal line to connect a microcomputer interface module 35 of the microcomputer 22 with the control digital IO board 34. The connection harness 25 binds the above-described clock input line, the terminal signal line and the analysis board control line, and connects the analysis board 24 with the work station 26.

Figure 3:
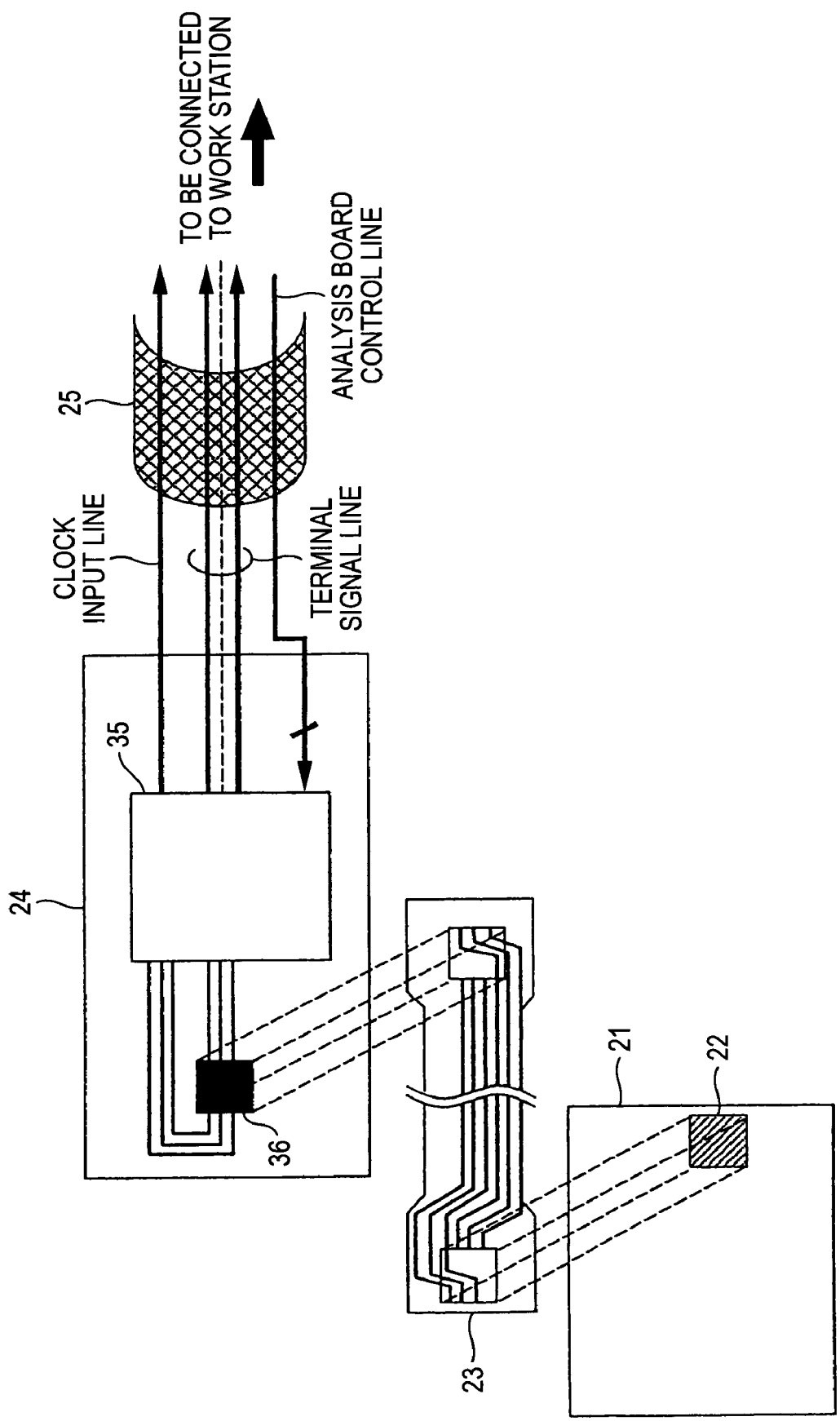
FIG. 3 is a conceptual diagram for showing a structure of an analysis board according to the first embodiment.

FIG. 3 is a structural diagram of the analysis board 24 according to the first embodiment. As shown in FIG. 3, the analysis board 24 may include a microcomputer socket 36 for mounting the microcomputer 22 on the analysis board 24, the inspection probe 23 for connecting the terminal of the defective microcomputer 22 that is mounted on the target system 21 with the terminal of the microcomputer socket 36 that is mounted on the analysis board 24, and the microcomputer interface module 35. The microcomputer interface module 35 is configured so as to control and mediate the terminal signal of the microcomputer socket 36 and a signal to be transmitted from the work station 26 through the connection harness 25.

Figure 4:
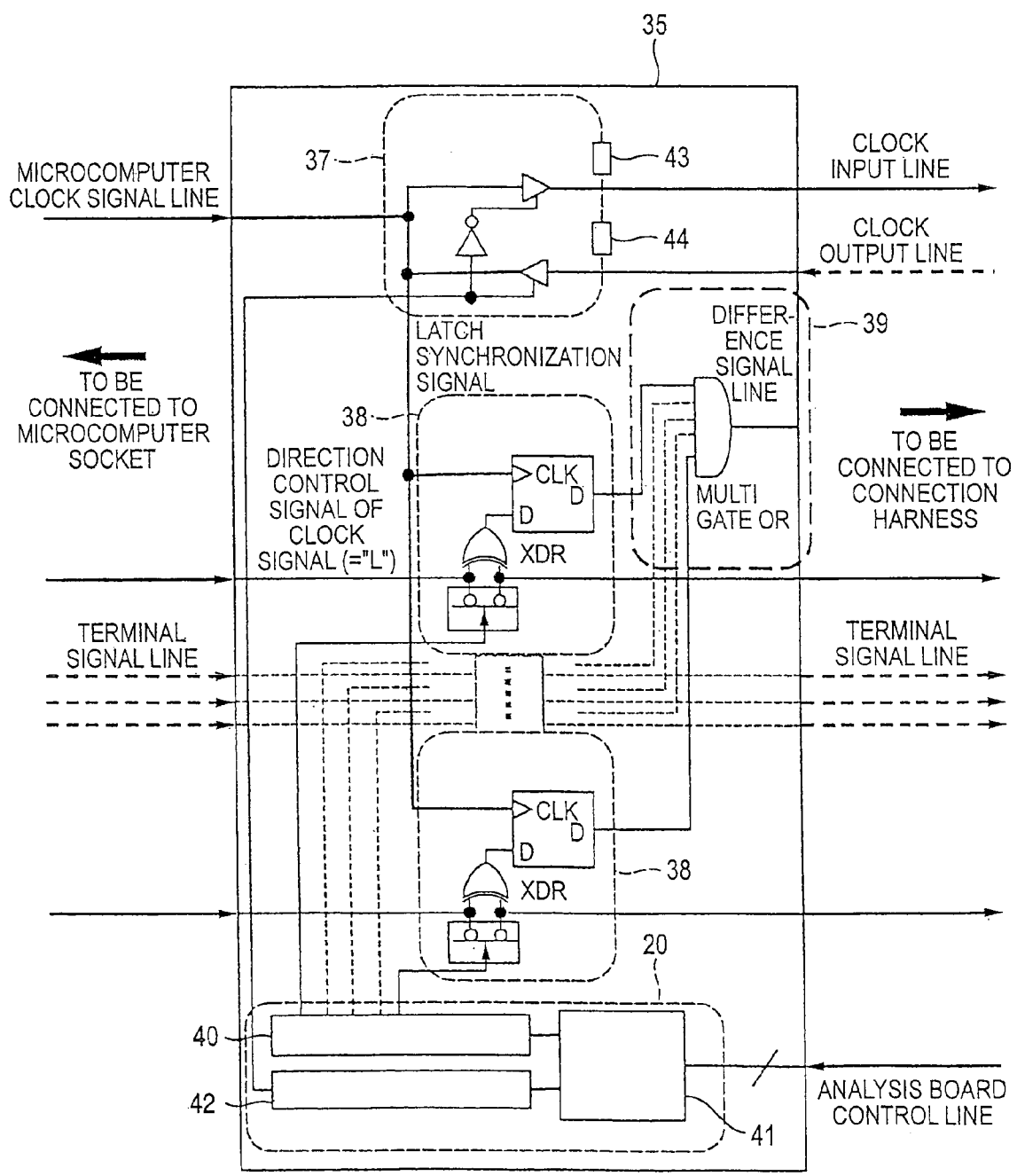
FIG. 4 is a conceptual diagram for showing an inner structure of a microcomputer interface module according to the first embodiment.

FIG. 4 is an inner structural diagram of the microcomputer interface module 35 according to the first embodiment. As shown in FIG. 4, the inside of the microcomputer interface module 35 is roughly divided into the following blocks. A control block 20 receives a control signal of the control digital IO board 34 from the work station 26 to analyze the signal. A clock block 37 controls input/output of the clock signal with respect to the clock terminal of the microcomputer socket to generate a synchronized signal. A plurality of terminal control blocks 38 are given for each microcomputer terminal to control each microcomputer terminal. A terminal signal difference detection block 39 detects the difference between the terminal and the data. A control signal decoder 41 receives and interprets a signal at the side of the work station 26. Then, according to need, the control signal decoder 41 controls a terminal cut control section 40 and transmits a signal for switching connection/cutting of a signal at the side of the microcomputer 22 to each of terminal control blocks 38. A clock direction control section 42 receives a control signal from the control signal decoder 41 and transmits a direction control signal of the clock signal with respect to the clock block 37.

The clock signal inputted from the clock terminal via the microcomputer clock signal line is buffered by the clock input buffer 43 to be outputted as the clock input signal to the clock input port at the side of the work station 26 via the clock input line. In addition, the clock output signal that is outputted from the clock output port at the side of the work station 26 is received by a clock output buffer 44 to be outputted to the clock terminal of the microcomputer socket 36.

The clock input buffer 43 and the clock output buffer 44 may exclusively operate due to the direction control signal of the clock signal. According to the present embodiment, when the direction control signal of the clock signal is "L", the signal is directed from "microcomputer" to "work station" and when it is "H", the signal is directed from "work station" to "microcomputer".

A microcomputer terminal signal is buffered to be transmitted toward the work station 26, and at the same time, the microcomputer terminal signal is transmitted as a synchronized signal of the terminal control block to each of terminal control blocks 38.

The terminal control block 38 lying for each microcomputer terminal may control connection and cutting of the microcomputer terminal signal to be obtained from the terminal of the microcomputer socket 36 and of the terminal signal to be transmitted from the work station 26, by an analog switch. The terminal control block 38 compares the microcomputer terminal signal with the terminal signal to be transmitted from the work station 26 in synchronization with the synchronized signal from the clock block 37. Then, in the case that a difference is generated between the signals, the terminal control block 38 outputs a difference signal as "H". This detection of the difference is carried out by the combination of an exclusive logical addition (XOR) circuit and a D-latch.

Since the difference is not generated under the condition that an analog switch is conducted, "L" is always outputted as a difference signal. A terminal signal difference detection block 39 receives logical addition (OR) of the difference signal that is outputted from the terminal control block 38 at the multi gate OR and outputs it as a difference signal to the work station 26.

The work station 26 and the analysis board 24 are bound by the connection harness 25, so that the signal line in the following direction and number are connected. The number of the terminal signal lines is enough to meet the number of effective terminals in the bi-direction between the analysis board 24 and the work station 26. One clock input line is directed from the work station 26 to the analysis board 24, one clock output line is directed from the analysis board 24 to the work station 26, and one difference signal line is also directed from the analysis board 24 to the work station 26. There are the required number of probe control lines in the bi-direction.

With reference to FIG. 2 and FIG. 3, a flow of a signal upon recording is as follows. Namely, one flow is from the clock terminal of the microcomputer 22 to the inspection probe 23, from the inspection probe 23 to the analysis board 24, from the analysis board 24 to the clock input line, and from the clock input line to the clock control board 32. The other flow is from the terminal of the defective microcomputer 22 to the inspection probe 23, from the inspection probe 23 to the analysis board 24, from the analysis board 24 to the clock input line, and from the clock input line to the terminal digital IO board 33.

Figure 5:
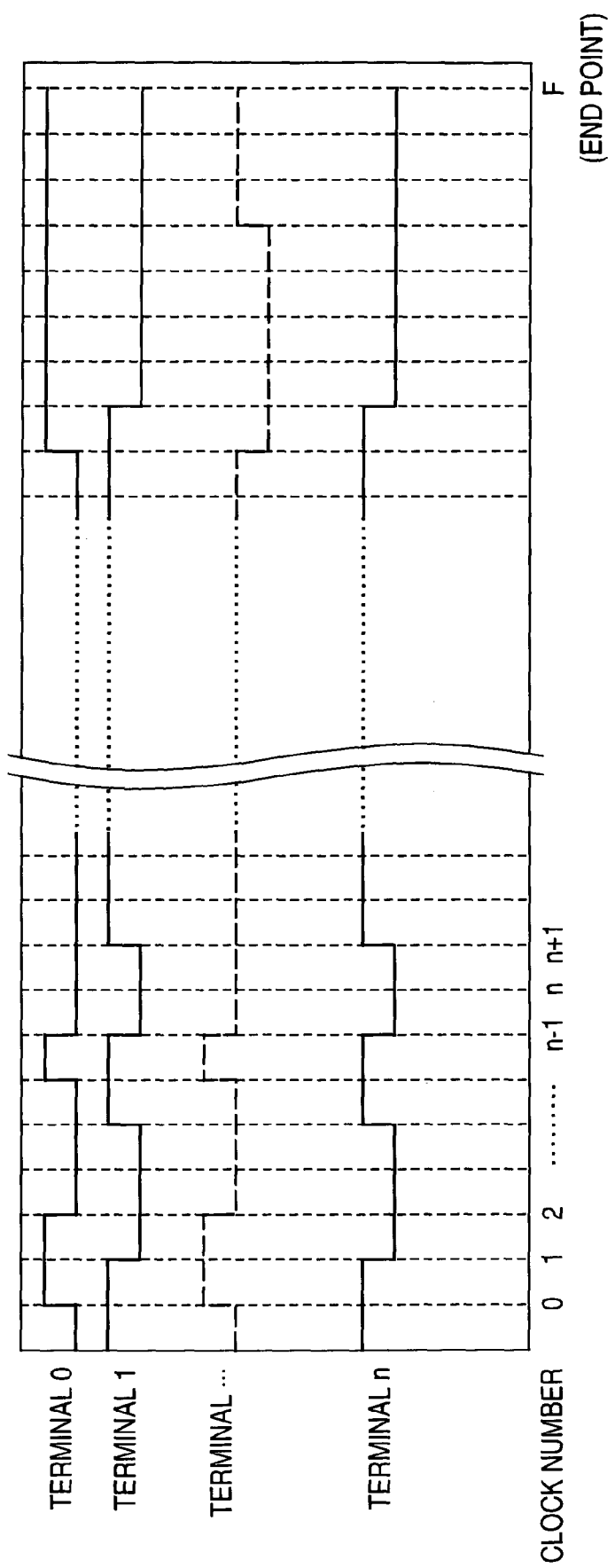
FIG. 5 is a record diagram of a terminal trace data according to the first embodiment.

Upon recording, in the storage 28 of the work station 26, the terminal trace data 31 indicating "H" and "L" conditions (alternatively, 1, 0 conditions) for each terminal from a clock number 0 to an end point as shown in FIG. 5 is recorded.

Figure 6:
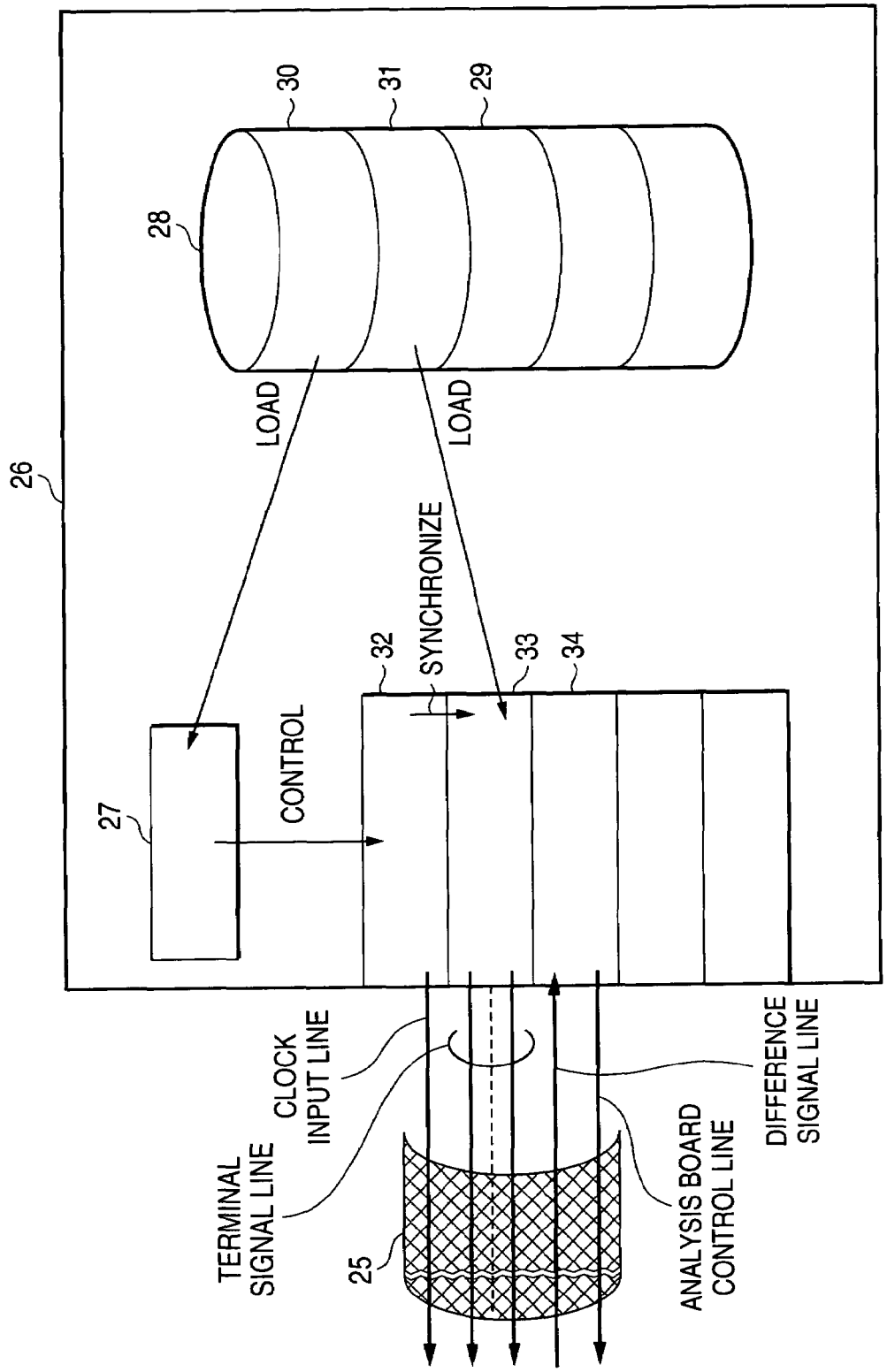
FIG. 6 is a conceptual diagram for showing a structure of a work station upon reproducing according to the first embodiment.

In the next place, the reproduction will be described below. FIG. 6 is a structural diagram of the work station 26 upon reproducing according to the first embodiment. The reproduction is different from the recording in the following points. Upon reproducing, the clock input line is ineffective, the clock output line is effective, and a clock signal is transmitted from the work station 26. A signal direction of the terminal signal line is reversed from the work station 26 to the analysis board 24. The difference signal line was ineffective upon recording, however, turns effective upon reproducing. The difference signal is inputted in the input port of the control digital IO board 34.

Figure 7:
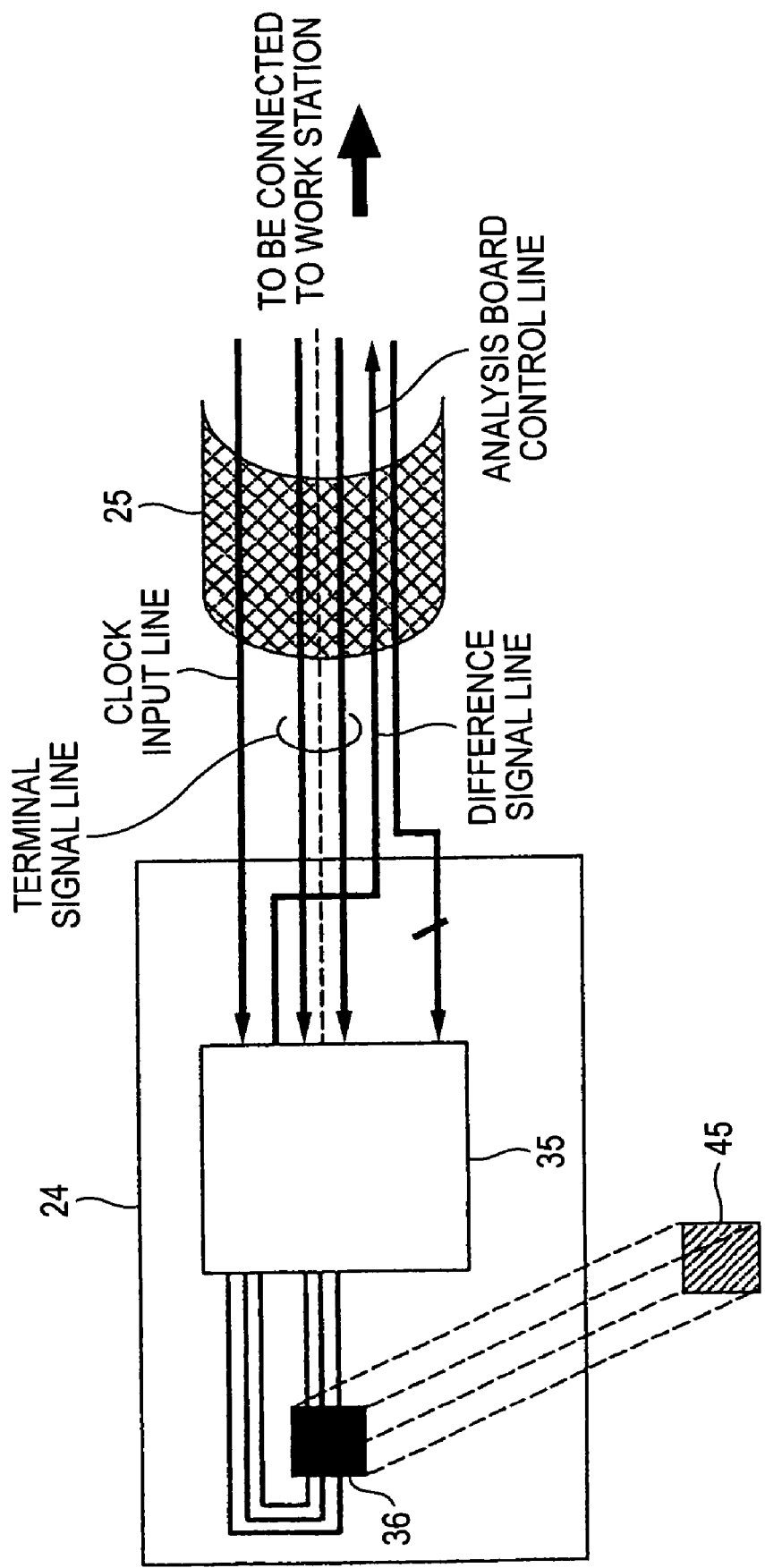
FIG. 7 is a structural diagram of an analysis board upon reproducing according to the first embodiment.

FIG. 7 is a structural diagram of the analysis board 24 upon reproducing according to the first embodiment. As shown in FIG. 7, upon reproducing, the inspection probe 23 is removed and a normal microcomputer 45 is mounted on the microcomputer socket 36 on the analysis board 24. The reproduction in this case is different from the recording in the following points. As described above, upon reproducing, the clock input line is ineffective, the clock output line is effective, and the clock signal is flowed from the work station 26. The signal direction of the terminal signal line is reversed from the work station 26 to the analysis board 24. The difference signal line was ineffective upon recording, however, it effective upon reproducing to be transmitted from the analysis board 24.

Figure 8:
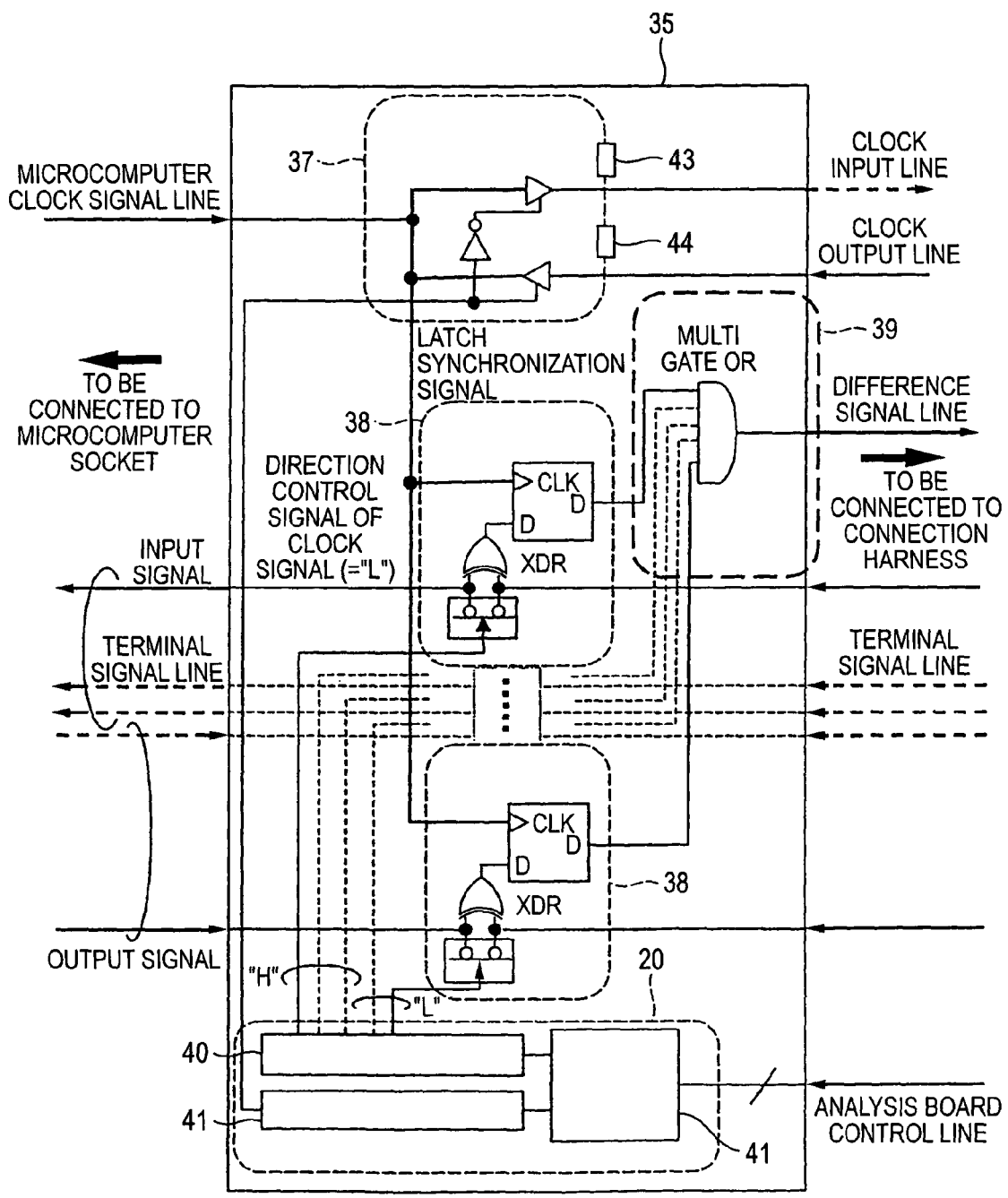
FIG. 8 is a conceptual diagram for showing a structure of a microcomputer interface module upon reproducing according to the first embodiment.

FIG. 8 is a structural diagram of the microcomputer interface module 35 upon reproducing according to the first embodiment. As shown in FIG. 8, since the control signal of the analysis board 24 is modified, the inner condition is modified as compared to the recording time. The reproduction in this case is different from the recording in the following points. Here, the clock direction control signal becomes "H" and a clock signal that is generated at the work station 26 and is flowed into the analysis board 24 via the clock output line is supplied to the normal microcomputer 45. With regard to the output terminal of the normal microcomputer 45, a cut control signal becomes "L" and at the terminal control block 38, the analog switch is cut. In the case that the terminal signal at the side of the normal microcomputer 45 is different from the terminal signal at the side of the work station 26, in synchronization with a latch synchronized signal, the difference signal is changed into "H". Then, due to the terminal signal difference detection block 39, the difference signal line is changed into "H".

Figure 9:
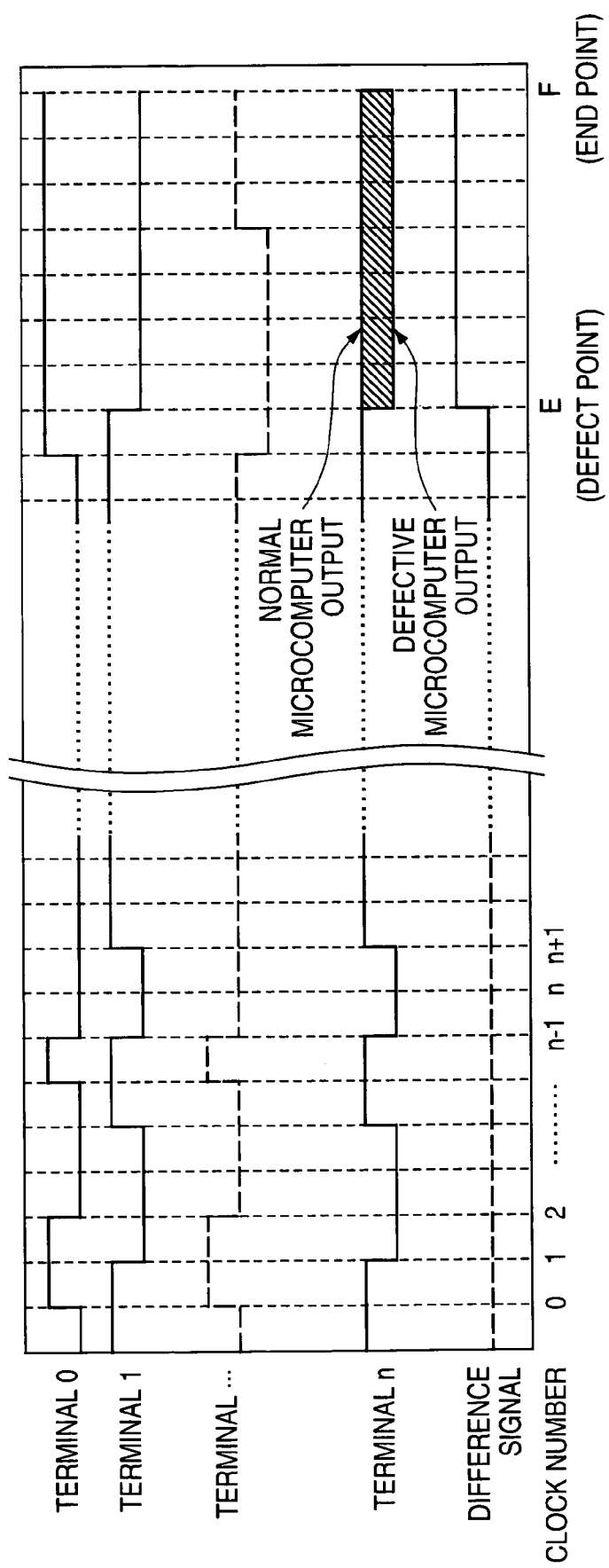
FIG. 9 is a record diagram of a terminal trace data of a normal microcomputer output and a defective microcomputer output according to the first embodiment.

Upon reproducing, in the storage 28 of the work station 26, the terminal trace data 31 of the normal microcomputer output and the defective microcomputer output for each terminal from a clock number 0 to an end point as shown in FIG. 9 is recorded.

In the next place, the operation of the first embodiment will be described below. A system according to the present embodiment may perform the tandem operations, namely, recording of generation of the defect and repetition of generation of the defect.

Upon recording, at the work station 26, a record software 29 is loaded in the CPU 27 to be executed. Record software 29 will perform the following operation to wait starting of recording. At first, operating the control digital IO board 34 so as to set up the microcomputer interface module 35, a set signal is transmitted to the microcomputer interface module 35 via the control line of the analysis board 24. In the next place, all ports of the terminal digital IO board 33 are set at input. Then, the clock input of the clock control board 32 is made effective and the clock signal that is flowed from the clock input line is set so as to synchronously operate the terminal digital IO board 33. In the next place, synchronizing the clock signal with the input, it is prepared that the input conditions of the terminal digital IO board 33 are sequentially saved as the terminal trace data on the storage.

The analysis board 24 may comply with an analysis board control signal and the control block 20 may perform next set up. At first, a direction control signal of the clock signal is set at "L" and the clock block 37 is set so as to flow the clock signal in a direction from the defective microcomputer 22 to the work station 26. In the next place, analog switches of all terminal control blocks 38 are connected with each other, and the terminal of the defective microcomputer 22 is connected to the port of the terminal digital IO board 33. Then, the target system 21 with the defect generated is activated and operated, and this results in generation of the defects.

An operator confirms the generation of the defect, and then, operating the work station 26, the recording will be completed. The operator judges the defect due to display of error, operation error, and alarm of a detection apparatus or the like. At this point, in the data storage system 28, all terminal signals from activation of the defective microcomputer 22 till stop thereof are recorded as the terminal trace data 31 (FIG. 5).

Figure 10:
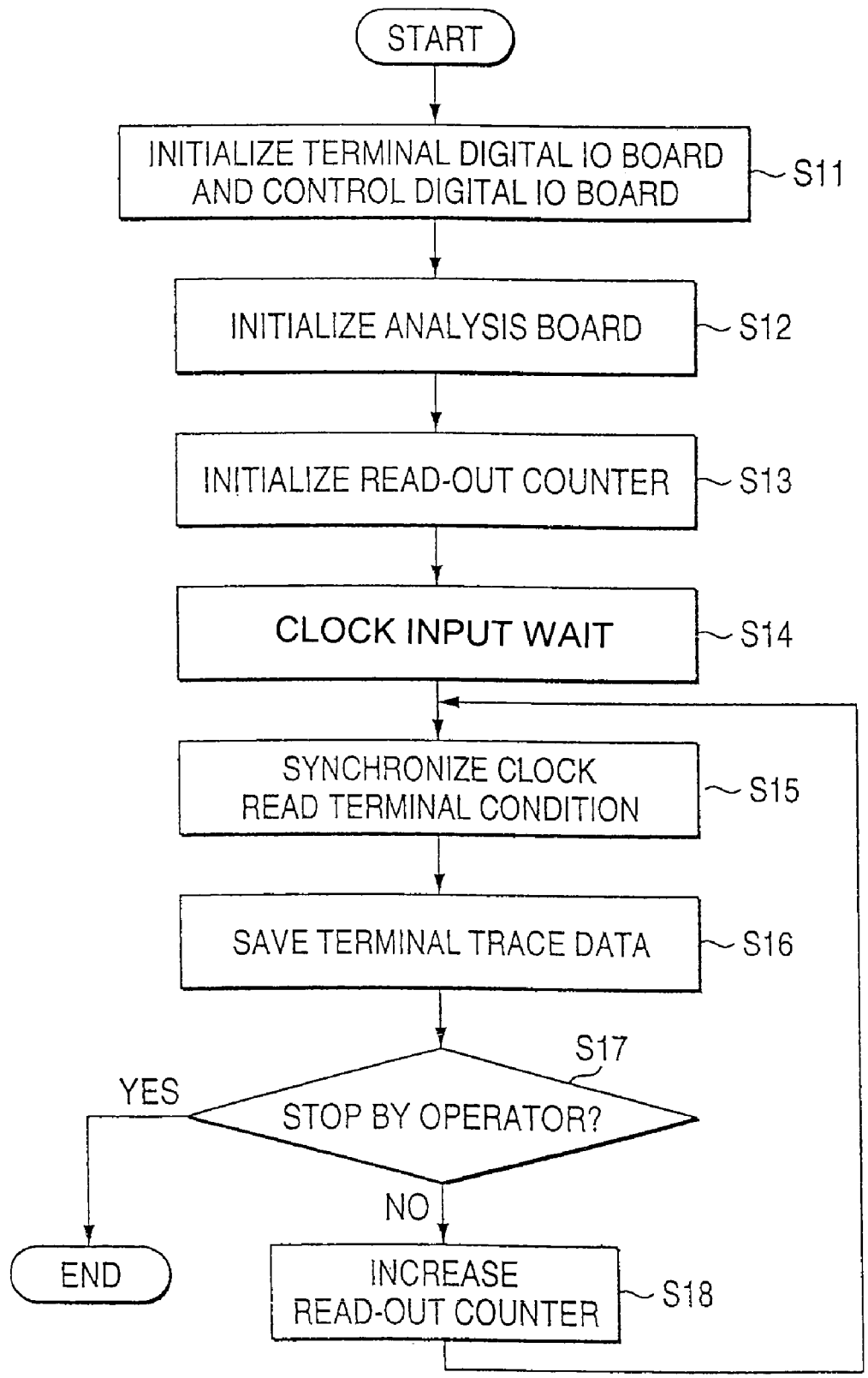
FIG. 10 is a flow chart for showing the operation of record software according to the first embodiment.

The operation of the above described record software 29 will be shown in FIG. 10. The terminal digital IO board 33 and the control digital IO board 34 are initialized (S11), a clock direction of the microcomputer interface module 35 of the analysis board 24 and analog switch setting are initialized (S12), and a read-out counter is initialized (S13). Then, the operator may wait till the clock input is generated at S14 (S14). In the next place, in synchronization with the clock (S15), the terminal condition is latched at the terminal digital IO board 33 (S15). Then, at S16, the terminal trace data that is latched by the terminal digital IO board 33 is saved in the storage 28 (S16). If the operator recognizes the defect at S17, he or she will stop the record software 29, and if the operator does not recognize it, he or she will increase the read-out counter at S18 and return to S15 (S18) to maintain the reading till he or she recognizes the defect.

Upon reproducing, the inspection probe 23 is removed from the analysis board 24 and the normal microcomputer 45 is mounted on the microcomputer socket 36. In the next place, the reproduce software 30 is loaded in the work station 26 to be executed. The reproduce software 30 may perform the following operation and wait detection of the defect. At first, all ports of the terminal digital IO board 33 are set at output. In the next place, the control digital IO board 34 is operated so as to set up the microcomputer interface module 35 and a set signal is transmitted to the microcomputer interface module 35 via the analysis board control line.

Then, the terminal trace data 31 on the storage 28 is set so as to be synchronized with a clock signal and to be sequentially transmitted from the terminal digital IO board 33. In the next place, starting the clock output from the clock control board 32, the reproduction will be started. During reproduction, in the microcomputer interface module 35, with respect to the signal of the microcomputer output terminal, an actual signal level may be compared to the voltage of the terminal signal corresponding to the terminal trace data 31 occasionally. Then, in the case that the difference is found in the signal, the difference signal line is modified from "L" to "H", this is detected by the control digital IO board 34, and the clock transmission is stopped to stop the reproduction operation.

Figure 11:
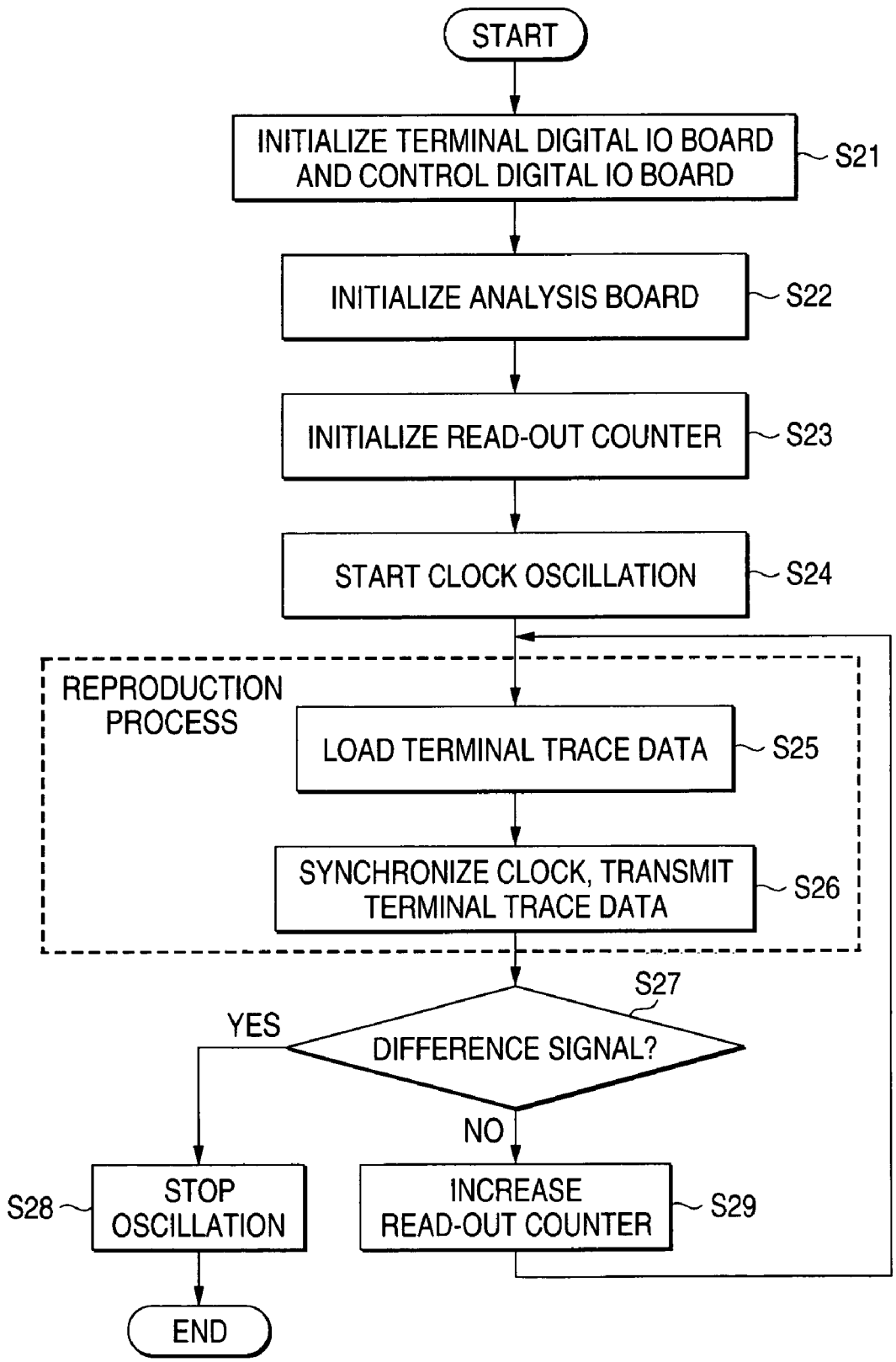
FIG. 11 is a flow chart for showing the operation of reproduce software according to the first embodiment.

The operation of the above described reproduce software 30 will be shown in FIG. 11. At S21, the terminal digital IO board 33 and the control digital IO board 34 are initialized (S21), at S22, the clock direction of the microcomputer interface module 35 of the analysis board 24 and the analog switch setting are initialized (S22), and at S23, the read-out counter is initialized (S23). Then, at S24, the clock oscillation may be started (S24). In the next place, at S25, the terminal trace data 31 is loaded from the storage 28 into the terminal digital IO board 33 (S25). Then, at S26, in synchronization with the clock signal, the terminal signal is transmitted from the terminal digital IO board 33 (S26). At S27, if the difference signal is found, the oscillation is stopped (S28), and if no difference signal is found, the read-out counter is increased at S28 (S29), returning to S25, the reproduction operation will be maintained till the difference signal is found.

Thus, according to the above described structure, the first embodiment leads to a good repeatability of the defect.

(Second Embodiment)

A second embodiment may solve the problem 1 such that the repeatability of the defect is not good. The second embodiment provides a failure microcomputer analysis system depending on the simplified analysis board 24, which does not need the microcomputer interface module 35 on the analysis board 24 as in the first embodiment 1.

Figure 12:
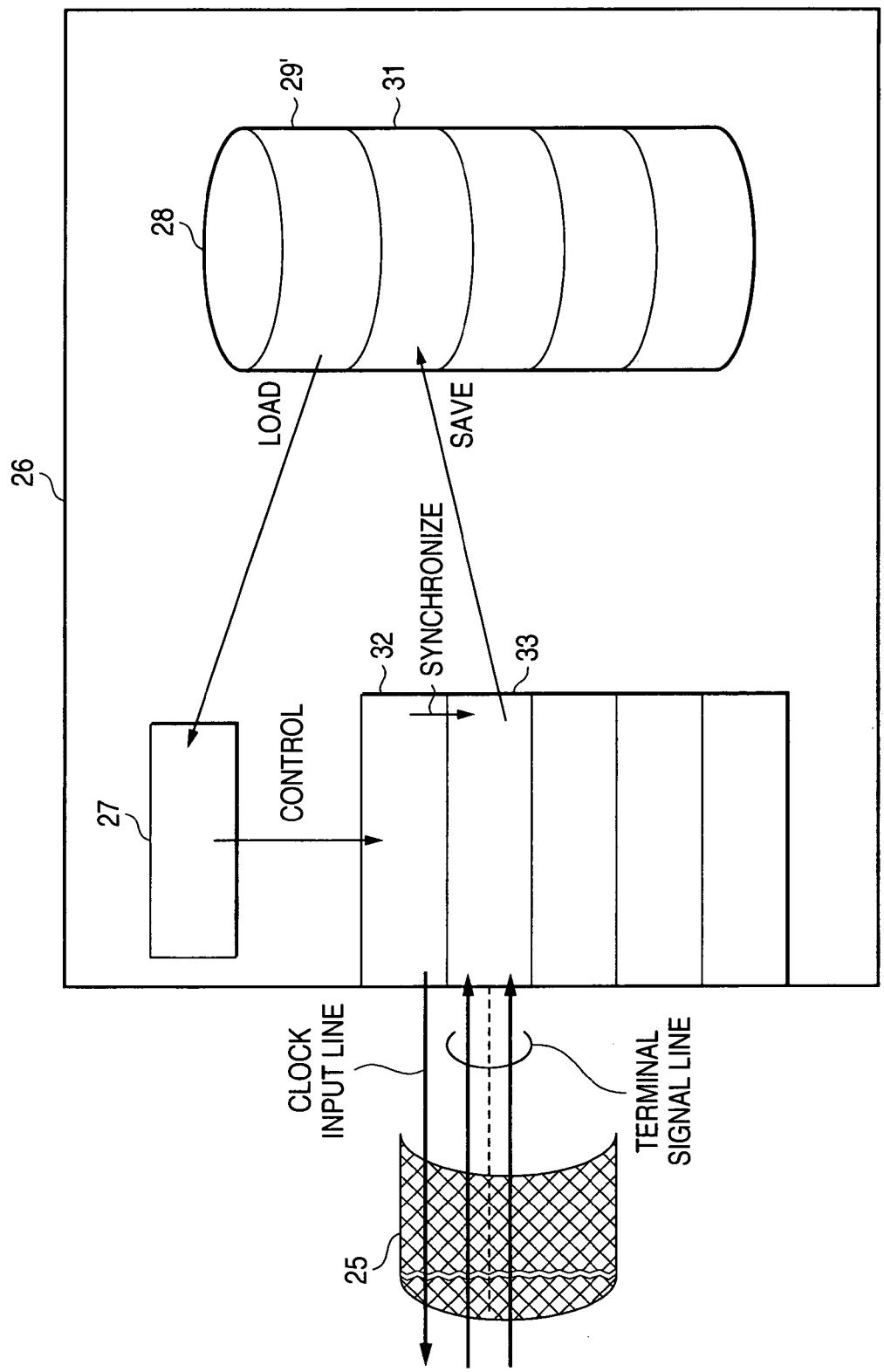
FIG. 12 is a structural diagram for showing a structure of a work station upon recording according to a second embodiment.

FIG. 12 is a structural diagram of the work station 26 upon recording according to the second embodiment The second embodiment shown in FIG. 12 is different from the first embodiment in that there are no control digital IO board 34 and no analysis board control line. Since the present embodiment does not use the microcomputer interface module 35, these are not needed.

Figure 13:
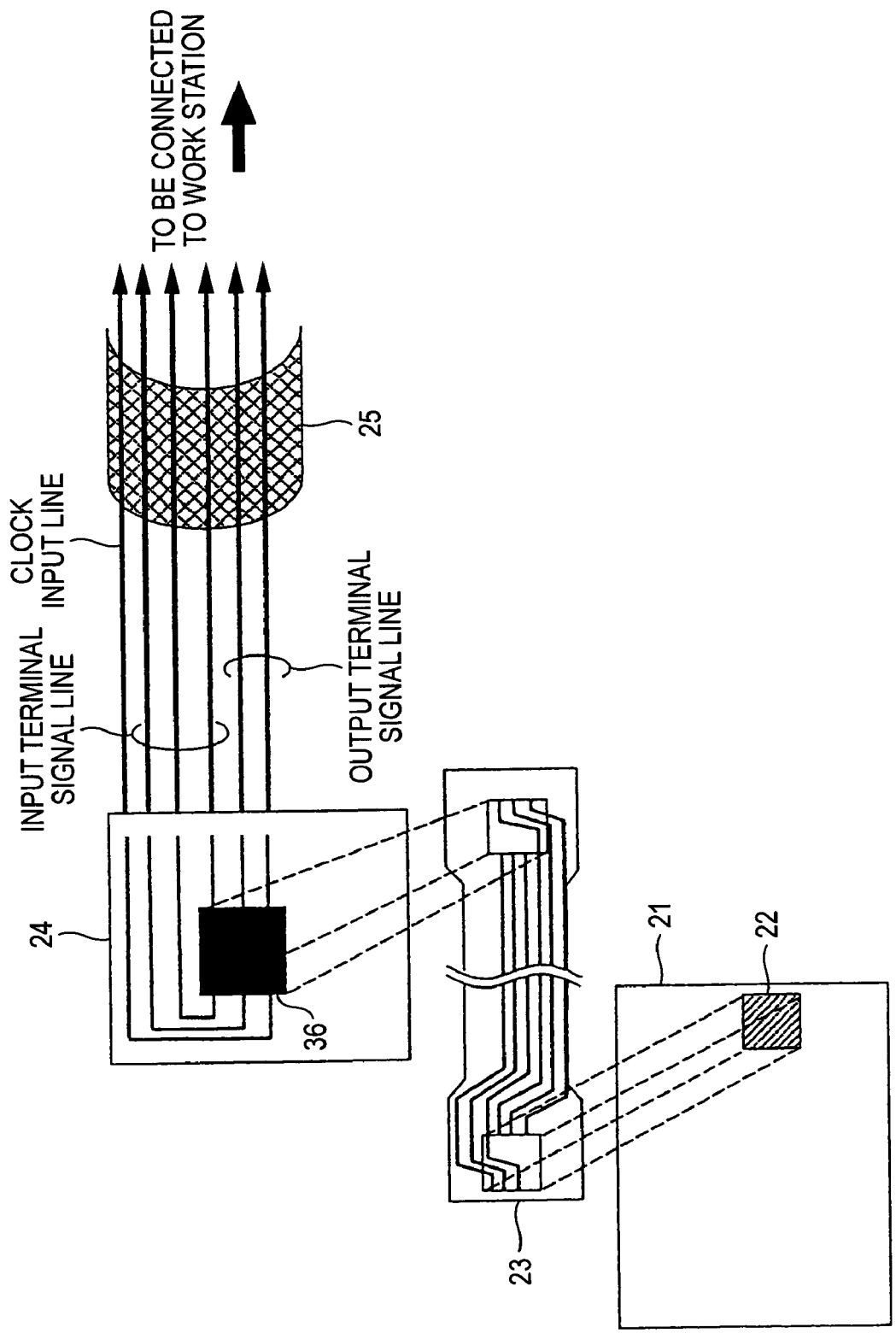
FIG. 13 is a conceptual diagram for showing a structure of an analysis board upon recording according to the second embodiment.

FIG. 13 is a structural diagram of the analysis board 24 upon recording according to the second embodiment. The present embodiment shown in FIG. 13 is different from the first embodiment in that the present embodiment does not use the microcomputer interface module. Therefore, each terminal signal line is directly connected to the microcomputer socket 36.

Figure 14:
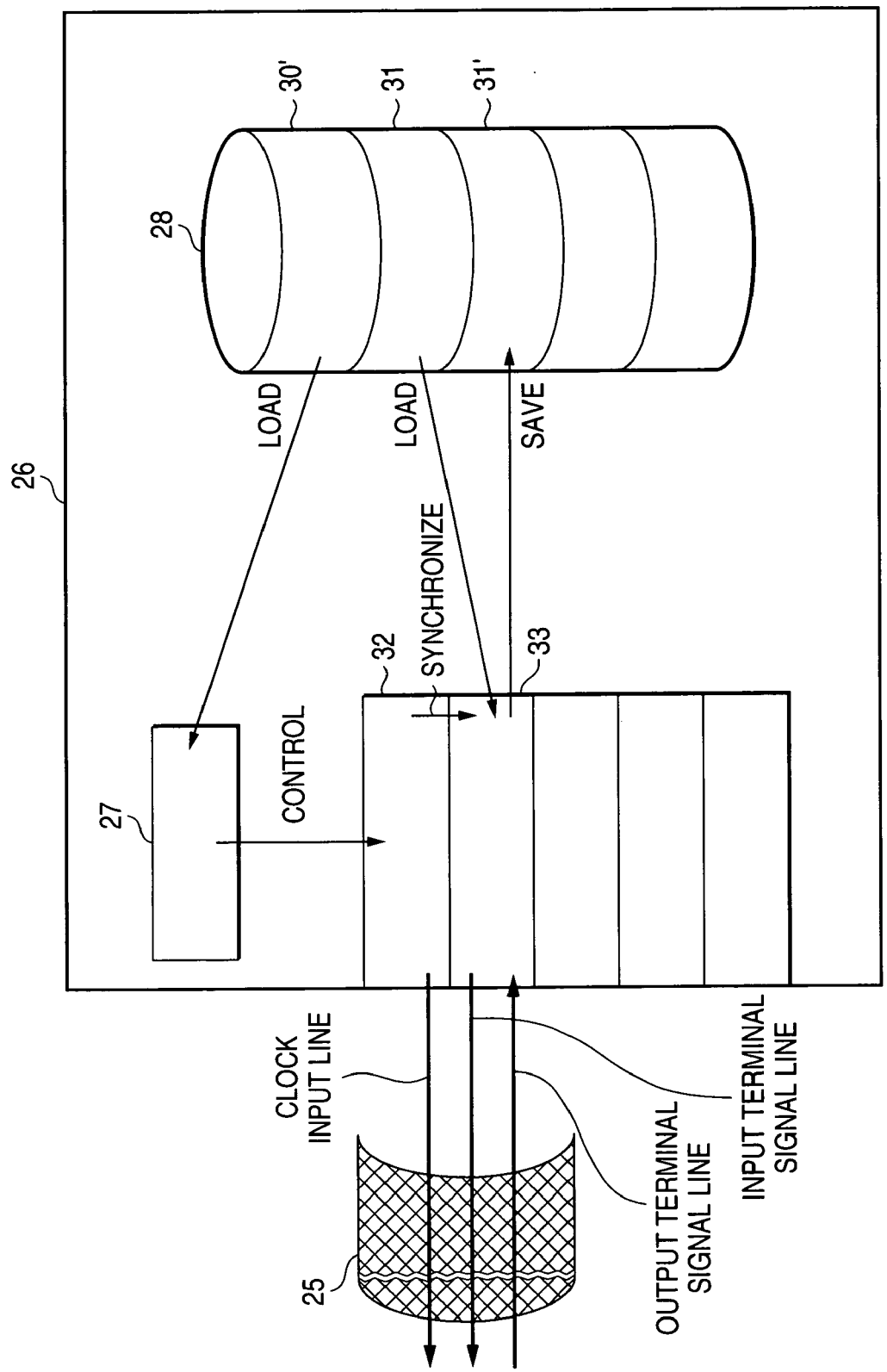
FIG. 14 is a conceptual diagram for showing a structure of a work station upon reproducing according to the second embodiment.

FIG. 14 is a structural diagram of the work station 26 upon reproducing according to the second embodiment. The present embodiment shown in FIG. 14 is different from the first embodiment in that there are no control digital IO board 34 and no analysis board control line. Since the present embodiment does not use the microcomputer interface module 35, these are not needed. The terminal trace data 31 is the data in which the condition of the output terminal of the microcomputer is recorded upon reproducing.

Figure 15:
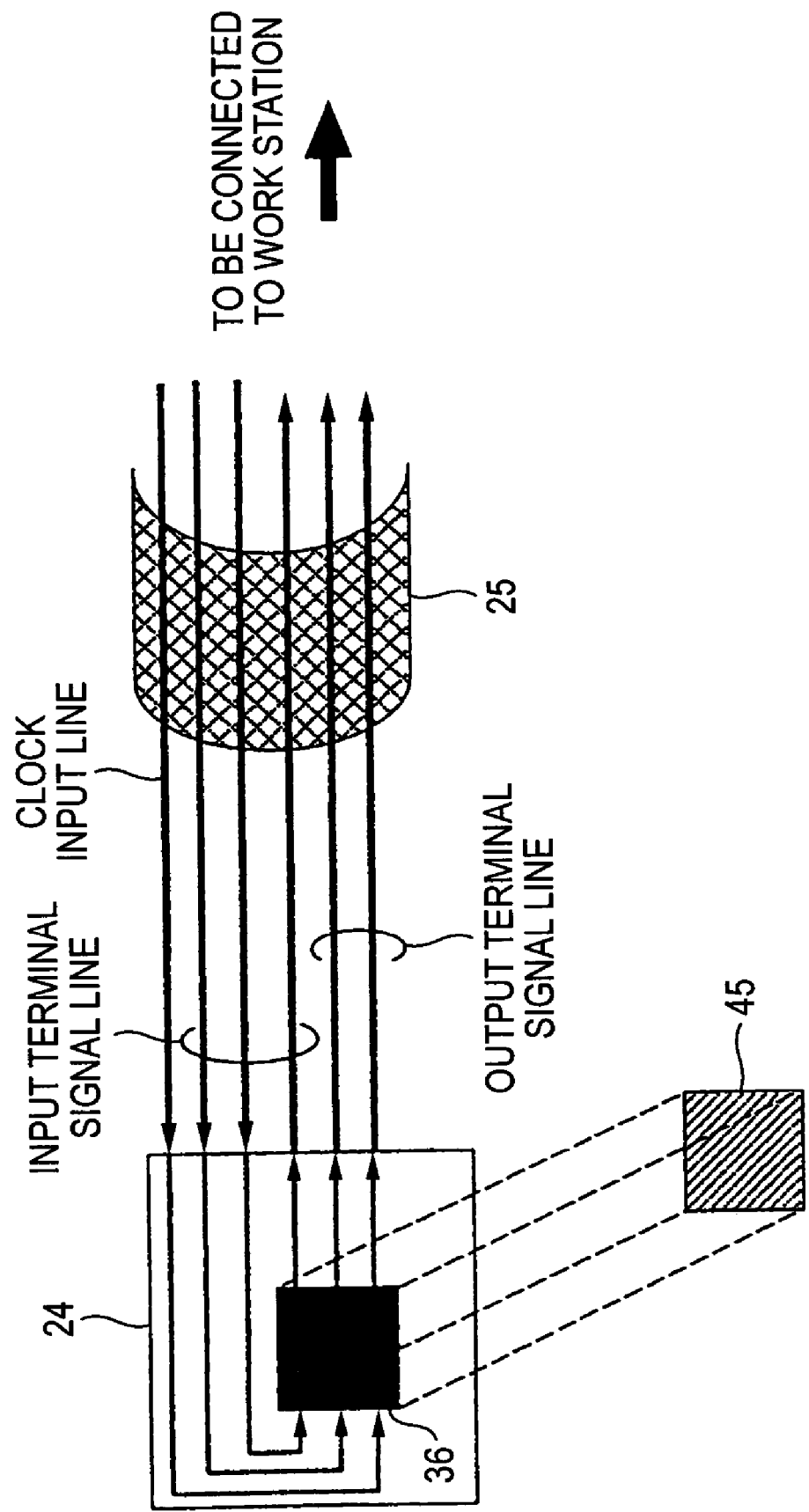
FIG. 15 is a conceptual diagram for showing a structure of an analysis board upon reproducing according to the second embodiment.

FIG. 15 is a structural diagram of the analysis board 24 upon reproducing according to the second embodiment. The present embodiment shown in FIG. 15 is different from the first embodiment in that there are no microcomputer interface module 35. Therefore, each terminal signal line is directly connected to the microcomputer socket 36. In addition, the direction of the terminal signal line is made as follows. The input terminal is directed from the work station 26 to the normal microcomputer 45, and the output terminal is directed from the normal microcomputer 45 to the work station 26.

The operation of the system according to the second embodiment upon recording the defective data is about the same as that of the first embodiment. However, since there is no microcomputer interface module 35, the operation of the system according to the second embodiment upon recording the defective data is partially different from that of the first embodiment. At first, record software corresponding to microcomputer without interface module 29' is loaded. Since there is no control digital IO board 34, the initial setting of the analysis board 24 is not necessary. In the next place, as in the first embodiment, the defective data is recorded to obtain the terminal trace data 31.

In the reproduction, at first, reproduce software corresponding to microcomputer without interface module 30' is loaded. When the microcomputer terminal is set at "input", as in the first embodiment, the terminal trace data 31 is outputted. When the microcomputer terminal is set at "output", the direction of the terminal digital IO board 33 is set to be from the normal microcomputer 45 to the work station 26, and the input signal to the terminal digital IO board 33 is saved in the terminal trace data 31' as in recording. The reproduction operation is terminated when the terminal trace data 31 during reproduction is terminated without detection of the end point unlike the first embodiment.

Figure 16:
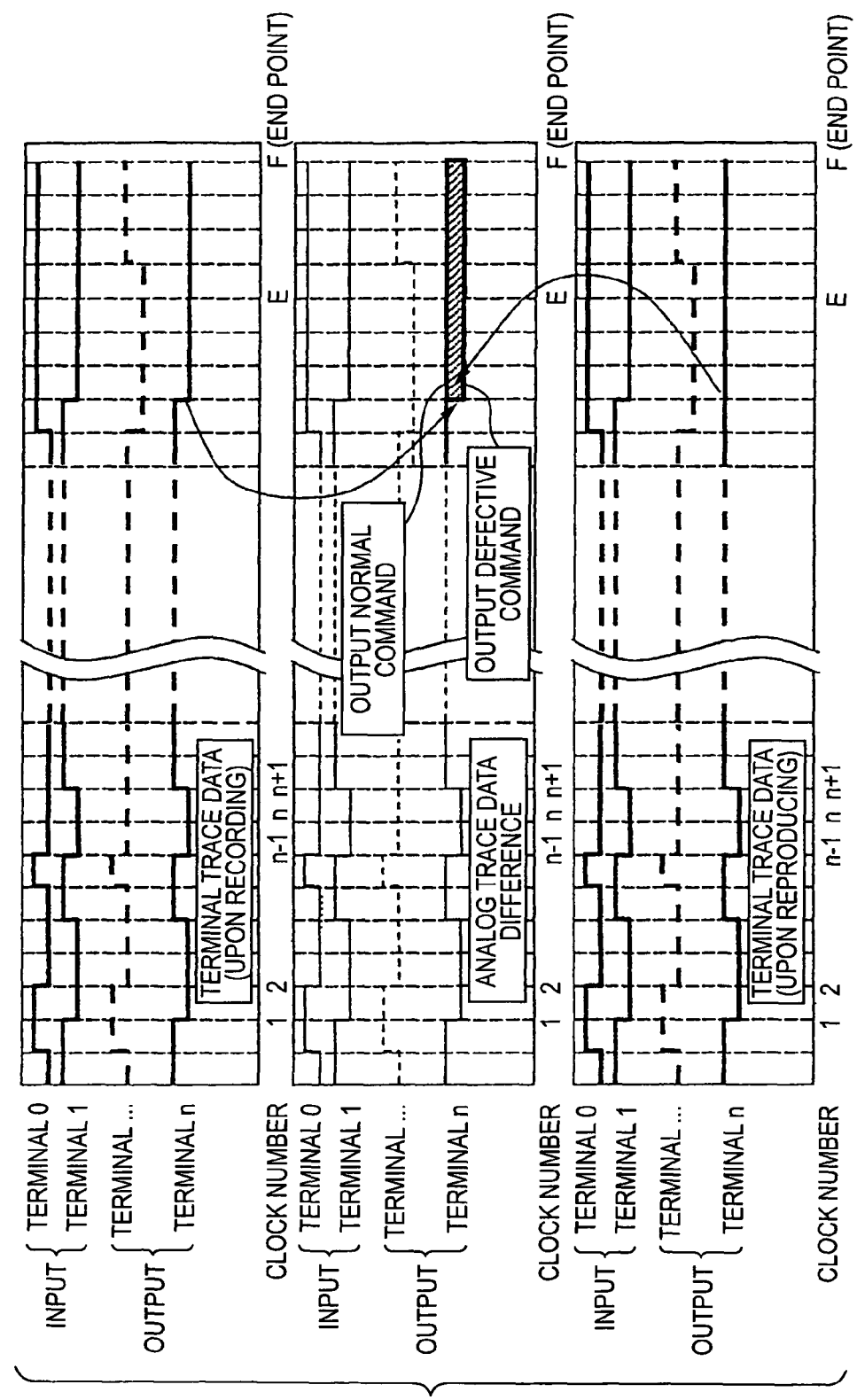
FIG. 16 is a terminal trace data comparative diagram according to the second embodiment.

The detection of the difference point will be described with reference to a terminal trace data comparative diagram of FIG. 16. Upon recording and reproducing, two data of each of the terminal trace data (upon recording) 31 and the terminal trace data (upon reproducing) 31' are obtained. These two data are compared in the work station 26 to be outputted as the terminal trace data difference. Due to the terminal trace data difference, it becomes possible to clearly discriminate the difference between the defective microcomputer 22 and the normal microcomputer 45, and thus, resulting in acquisition of the defect generation timing as in the first embodiment.

According to the second embodiment, it is possible to obtain a same effect as that of the first embodiment by a simplified system without the microcomputer interface module 35 and the control digital IO board 34. Accordingly, cost-reduction is made possible depending on amount of simplification of the system.

(Third Embodiment)

A third embodiment may solve the problem 1 that the repeatability of the defect is not good and the problem 2 that it is difficult to analyze relevance between the true defect and the detected defect.

Figure 17:
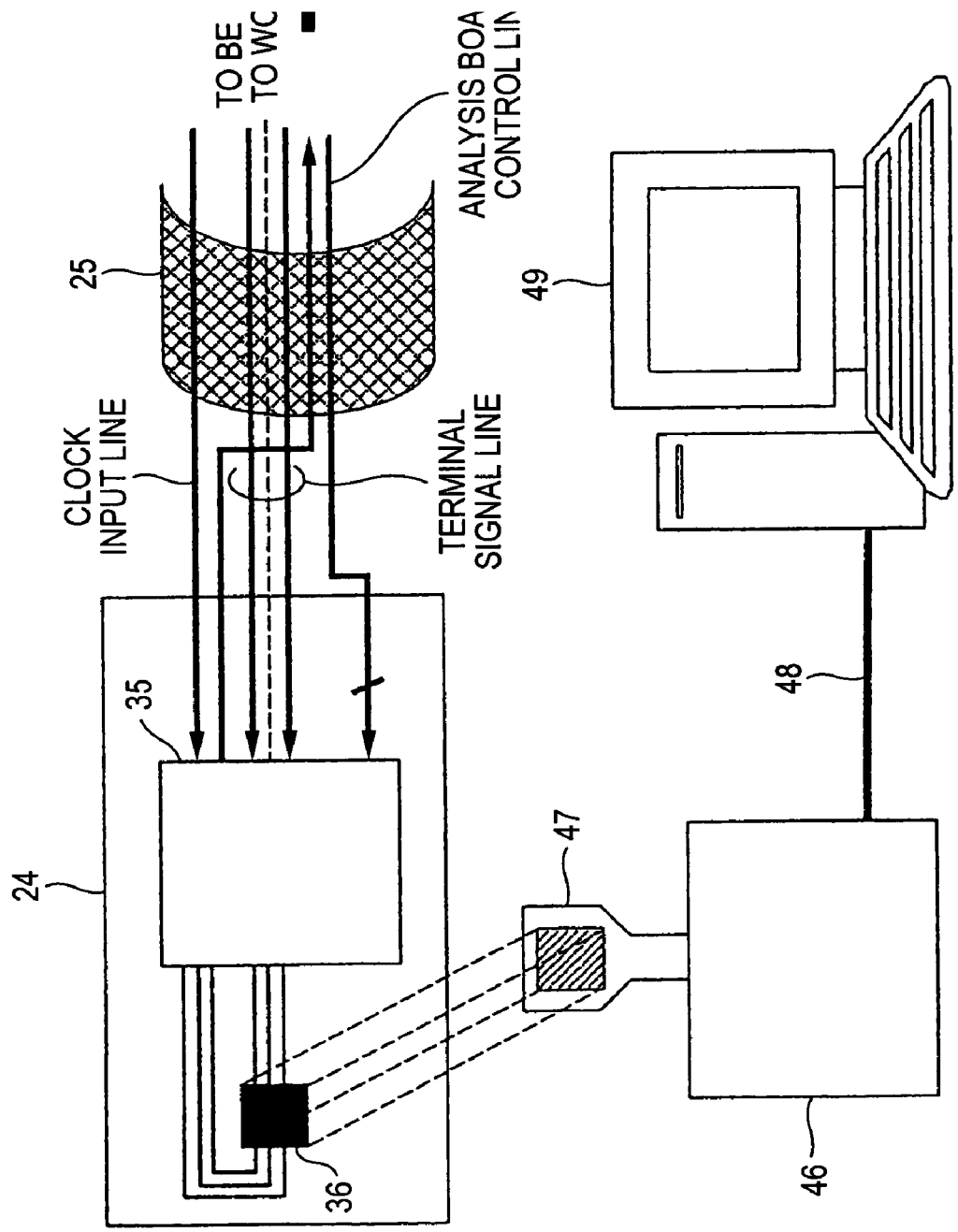
FIG. 17 is a structural diagram of a system upon reproducing the defective data according to a third embodiment.

A structure upon recording the defective data according to the third embodiment is the same as that of the first embodiment. FIG. 17 is a structural diagram of a system upon reproducing the defective data according to a third embodiment. As shown in FIG. 17, the normal microcomputer 45 of the first embodiment (FIG. 7) is replaced with an in-circuit emulator 46. According to the third embodiment, the operations upon recording and reproducing the defective data are the same as those of the first embodiment.

According to the third embodiment, by using the emulator 46, it becomes possible to analyze the inner condition of the normal microcomputer 45 at the time of generation of the defect. In addition, in order to seek a cause from this analysis result, it is possible to analyze the inner condition till the defect is generated by the following procedures.

At first, from the start till an arbitrary point before the defect generation point, a clock is supplied from the clock control board 32. After that, the clock is stopped, the in-circuit emulator 46 is stopped, and the inner condition of the microcomputer is analyzed with an execution mode changed into a monitor mode. Thereby, it is possible to analyze the inner condition of the microcomputer by tracing back the operation to the arbitrary point of time since the terminal trace data 31 till the generation of the defect is saved.

(Fourth Embodiment)

A forth embodiment may solve the problem 1 that the repeatability of the defect is not good and the problem 2 that it is difficult to analyze relevance between the true defect and the detected defect.

According to the third embodiment, by connecting the in-circuit emulator 46 to the normal microcomputer 45, it is possible to obtain the inner information of the normal microcomputer 45. If the inner information of the defective microcomputer 22 can be obtained, the more detailed analysis becomes possible upon analyzing and an analyze rate can be raised. According to the fourth embodiment, in the defective microcomputer 22 with the debug monitor mounted thereon, the inner information is obtained. Therefore, according to the fourth embodiment, as a microcomputer of the evaluation target, a microcomputer on which the debug monitor software has been mounted in advance may be used.

Figure 18:
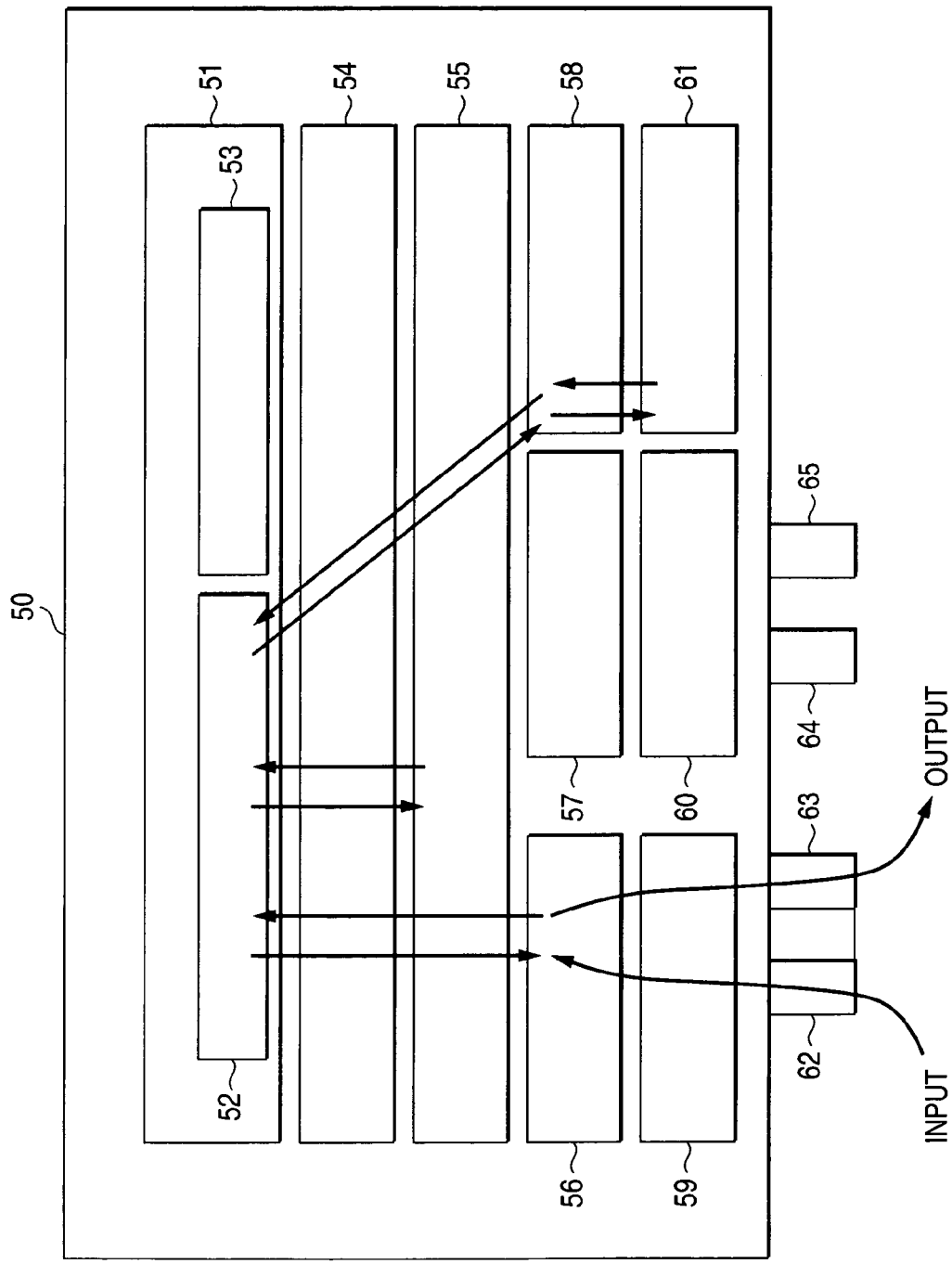
FIG. 18 is a conceptual diagram for showing an inner structure of a microcomputer according to a forth embodiment.

FIG. 18 is an inner structural diagram of a microcomputer according to the forth embodiment. As shown in FIG. 18, although debug monitor software 53 is mounted on a ROM 51 of a microcomputer 50, this debug monitor software 53 is not operated upon recording/reproducing. According to the fourth embodiment, the debug monitor software 53 will be activated at a point of time when a signal is inputted in a serial interface input terminal 64 that is not used in application software 52.

Figure 19:
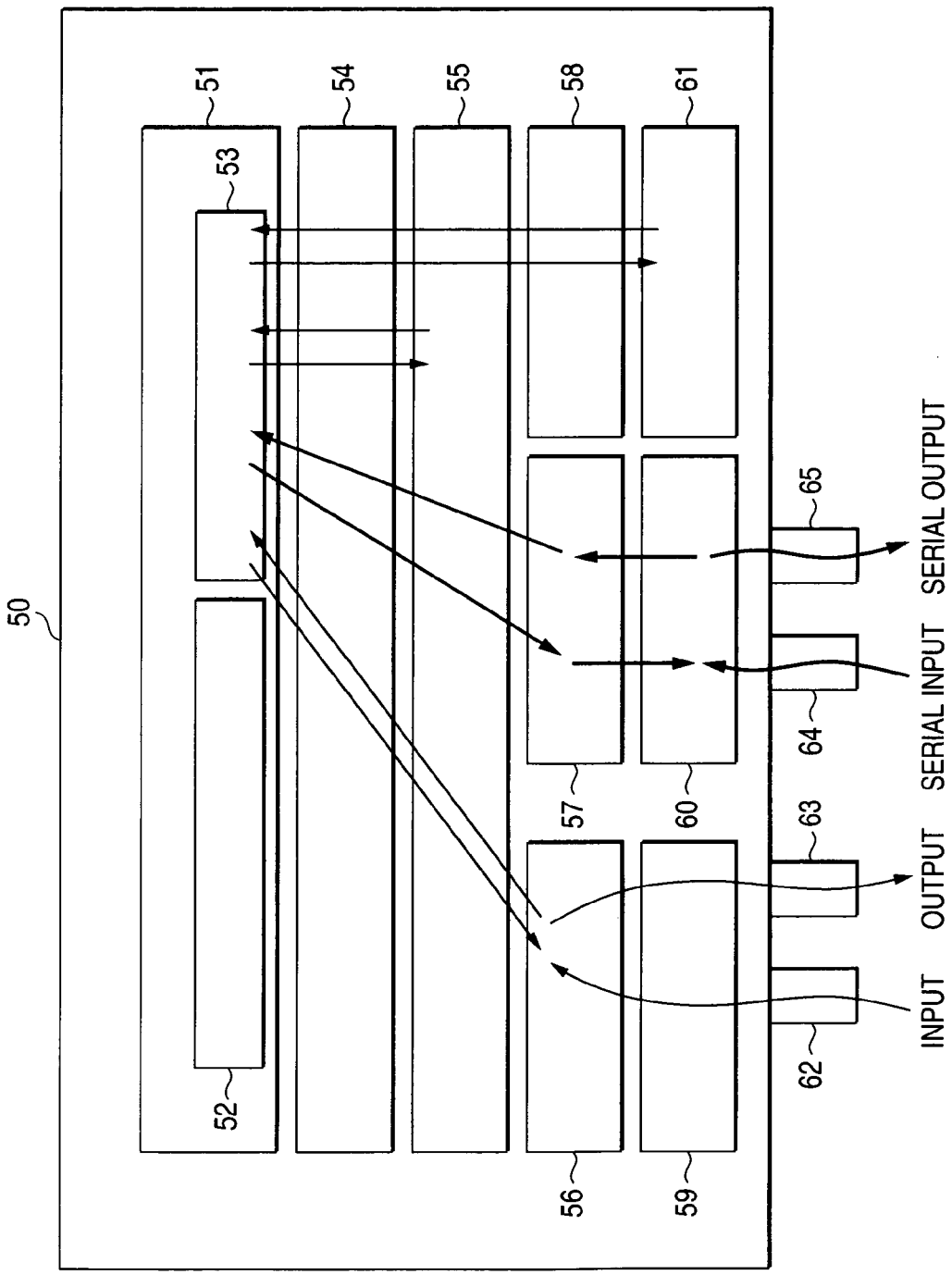
FIG. 19 is a conceptual diagram for showing an inner structure of a microcomputer upon analyzing according to the forth embodiment.

In the next place, an inner structure of a microcomputer upon analyzing according to the forth embodiment is shown in FIG. 19. In the case that the signal is inputted in the serial input terminal 64 during the operation of the application software 52, the operation is transited from the application software 52 to the debug monitor 53, the debug monitor 53 accepts the debug command via a serial interface 60, and thus resulting in making it possible to read out the inner register information from a serial output terminal 65 of the serial interface 60 as a response.

When a debug monitor function is executed, although the operation of the application software 52 is suspended, the circuit operation at the outside of the microcomputer 50 is not suspended. As a result, after activation of the debug monitor 53, the microcomputer 50 is not synchronized with an outer circuit and after activation of the debug monitor 53, the application software 52 is not executed normally.

A structure of the forth embodiment upon recording and reproducing the defective data is the same as that of the first embodiment.

Figure 20:
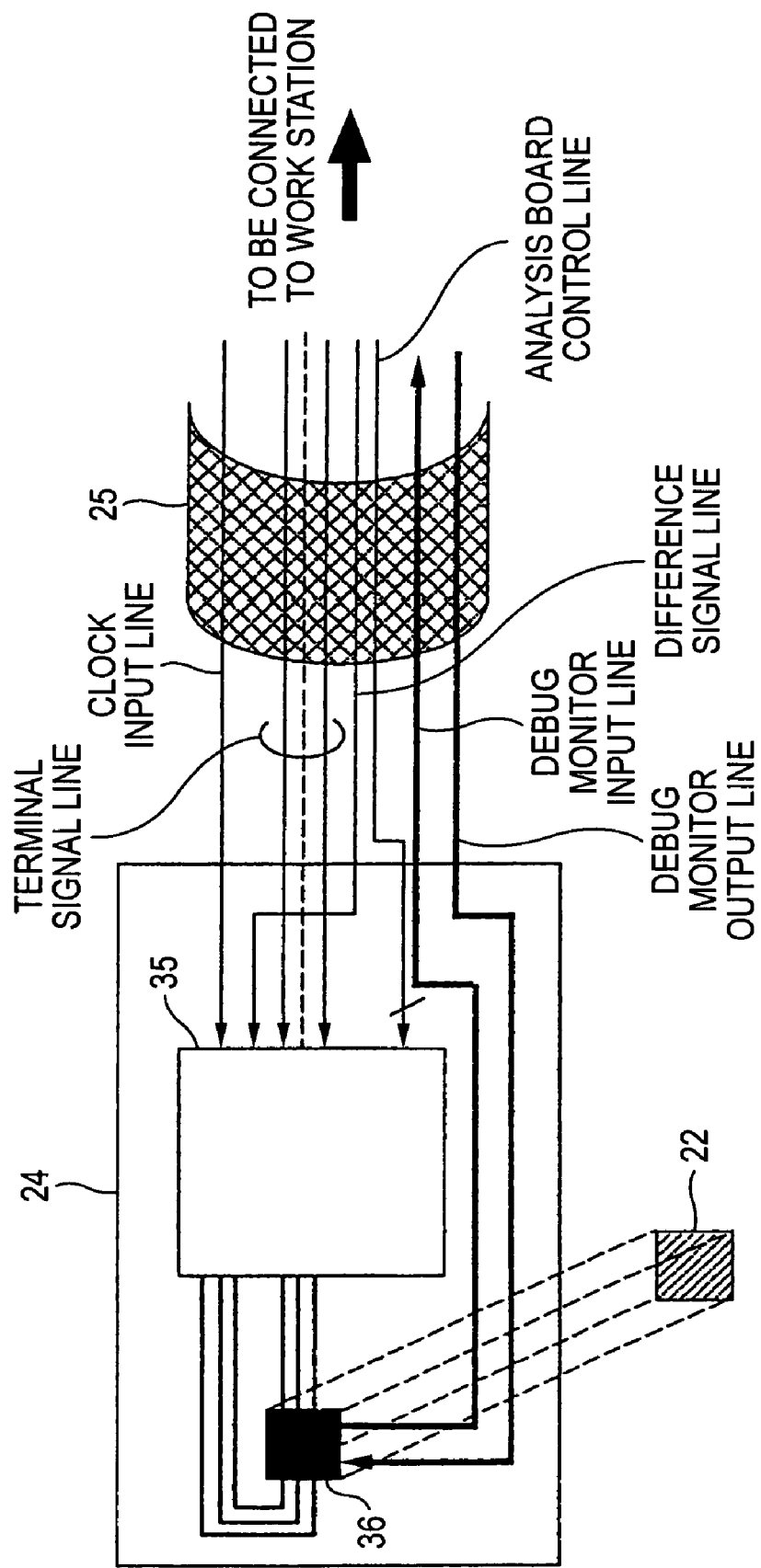
FIG. 20 is a conceptual diagram for showing a structure of an analysis board upon analyzing the defective data according to the fourth embodiment.

FIG. 20 is a structural diagram of an analysis board upon analyzing the defective data according to the fourth embodiment. According to the first embodiment, the normal microcomputer 45 is mounted upon reproducing, however, the fourth embodiment serves to analyze the defective microcomputer 22. Therefore, the microcomputer in which the defect is generated is removed from the target system to be mounted on the analysis board 24. As compared to the first embodiment, in the forth embodiment, a debug monitor input line and a debug monitor output line for operating the debug monitor 53 are added to the analysis board 24.

Figure 21:
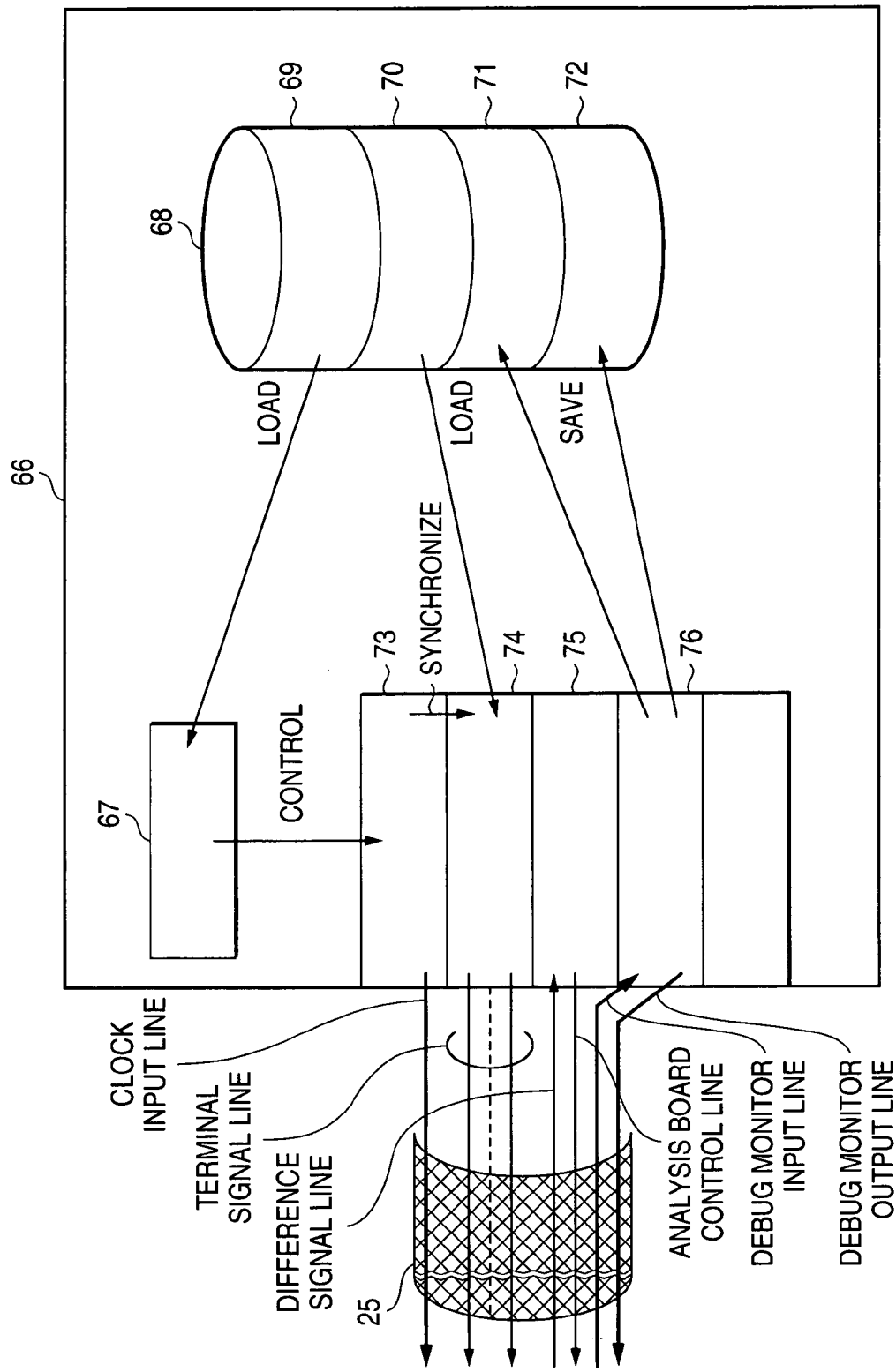
FIG. 21 is a conceptual diagram for showing a structure of a work station upon analyzing according to the fourth embodiment.

In the next place, a structure of a work station 66 upon analyzing will be described with reference to FIG. 21. Constituent elements that are modified from the first embodiment are indicated below. Analysis software 69 serves to obtain the register condition and the RAM condition from the microcomputer 50. A serial IO board 76 transmits and receives a serial signal in order to operate the debug monitor 53. The register condition data 71 is a region on a storage 68 for saving the data of the obtained resister.

The RAM condition data 72 is a region on the storage 68 for saving the data of the obtained RAM. For simplification, in this microcomputer, it is assumed that a memory-mapped IO is provided and the registers are arranged at RAM addresses 0 to 0FFH. Further, in the present specification and drawings, "H" added to a back of a numeral represents that this numeral is a hexadecimal numeral.

Figure 22:
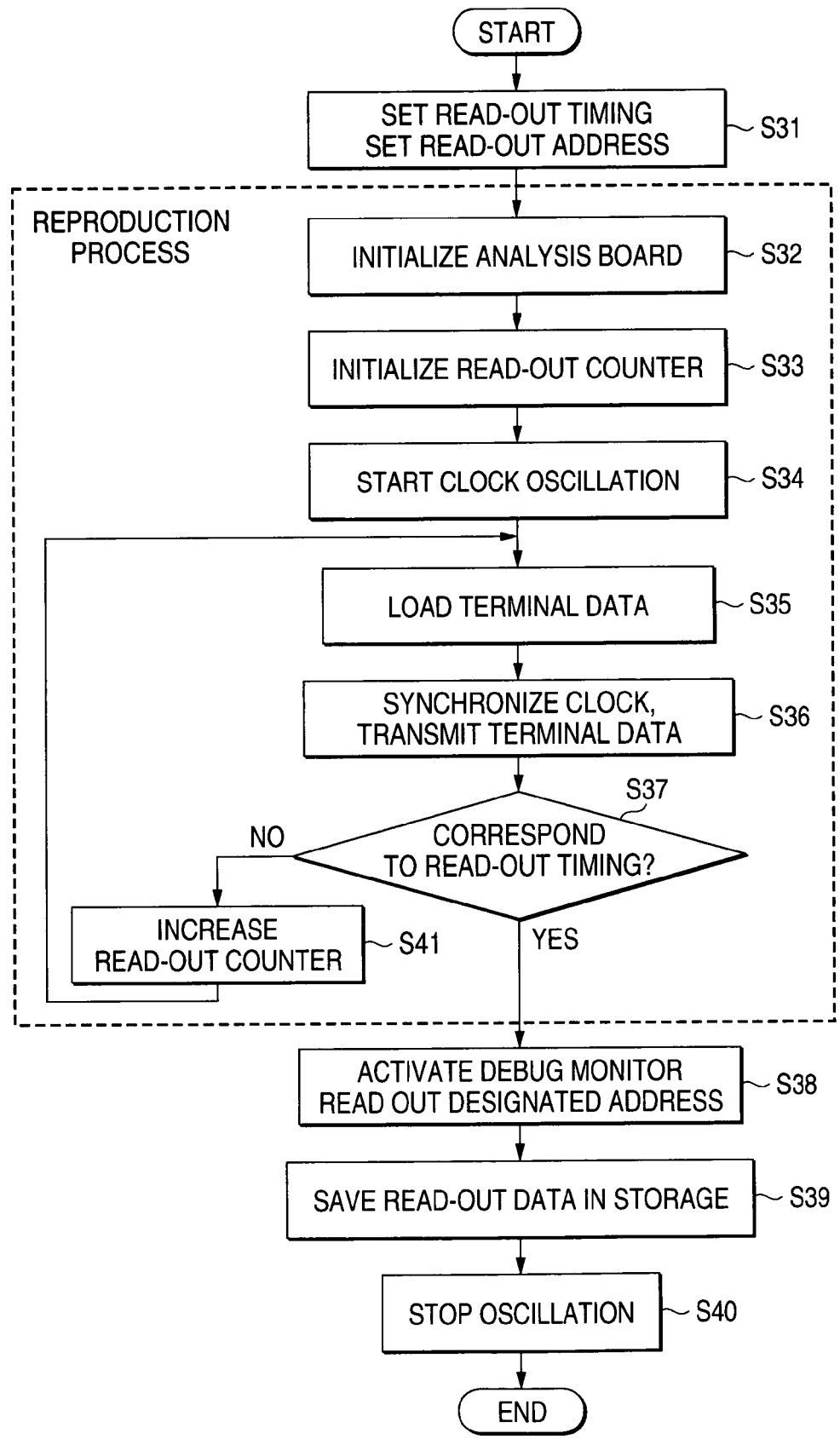
FIG. 22 is a flow chart for showing the operation of analysis software according to the fourth embodiment.

According to the fourth embodiment, the operations upon recording and reproducing are the same as those of the first embodiment. Upon analyzing, analysis software 69 will be activated. A flow chart of the analysis software 69 is shown in FIG. 22.

When the analysis software is started, at first, reading-out timing of the RAM 55 and a reading-out address are set at S31 (S31).

In the next place, the reproduction operation for performing the reproduction operation till the set timing at S32 to S37, and S41 is carried out. The reproduction processing is the same as the reproduction, however, reproducing the data till the set read-out timing terminates the reproduction processing. In the next place, at S38, the RAM read-out command (serial signal) to the debug monitor 53 is transmitted by the serial IO board, a signal is inputted in the serial terminal of the defective microcomputer, the debug monitor is activated, and the processing of the microcomputer is switched to the debug monitor (S38). If the debug monitor is activated, it accepts the command and transmits the designated RAM data as a response from a serial interface output. The data read out at S39 is saved in the storage 68 (S39) and the oscillation is stopped at S40 (S40).

In the operation of the debug monitor 53, time-lag till the RAM reading out is generated due to the transmission of the read-out command, however, according to the analysis by the in-circuit emulator 46 shown in the second embodiment, the inner operation in the debug monitor operation is discriminated, and thus, this makes it possible to grasp the accurate timing in advance after the transmission of the command till reading-out of the RAM.

As described above, according to the fourth embodiment, since the RAM of the microcomputer in which the defect is generated, and the operation of the register are grasped, it becomes easy to analyze the defect.

(Fifth Embodiment)

A fifth embodiment may solve the problem 1 that the repeatability of the defect is not good and the problem 2 that it is difficult to analyze relevance between the true defect and the detected defect. Also in the case of the fourth embodiment, the time-lag required from the transmission of one command of the debug monitor operation till the reception of the response may be generated. During this time, the peripheral maintains the operation, so that a peripheral related register has the potential to be modified. Even if the addresses for reading out the RAM are sequentially increased and the RAMs are read by rotation, there is a high probability that the RAM and the registered content are modified during the read-out operation. Accordingly, this RAM data may become far removed from the RAM data when the debug monitor is activated, this results in a low reliability. According to the fifth embodiment, the RAM data necessary for analysis are collected along a time axis.

According to the fifth embodiment, the RAM data is obtained by the same method as that of the fourth embodiment, however, in the fifth embodiment, the number of the obtained data is limited to the one where the influence of the time-lag can be ignored. Since the reproduction can be repeated any number of times, the range to obtain the RAM is sequentially scanned and the RAMs of the necessary range are repeatedly obtained plural number of times. When the RAM of the specific timing has been completely obtained, the timing to be obtained in the next time is changed, and the range is sequentially scanned in a direction of time axis. Thus, according to the fifth embodiment, it may lead to acquisition of the designated RAM range, the register in the designated time range, and the modified data of the RAM.

Figure 23:
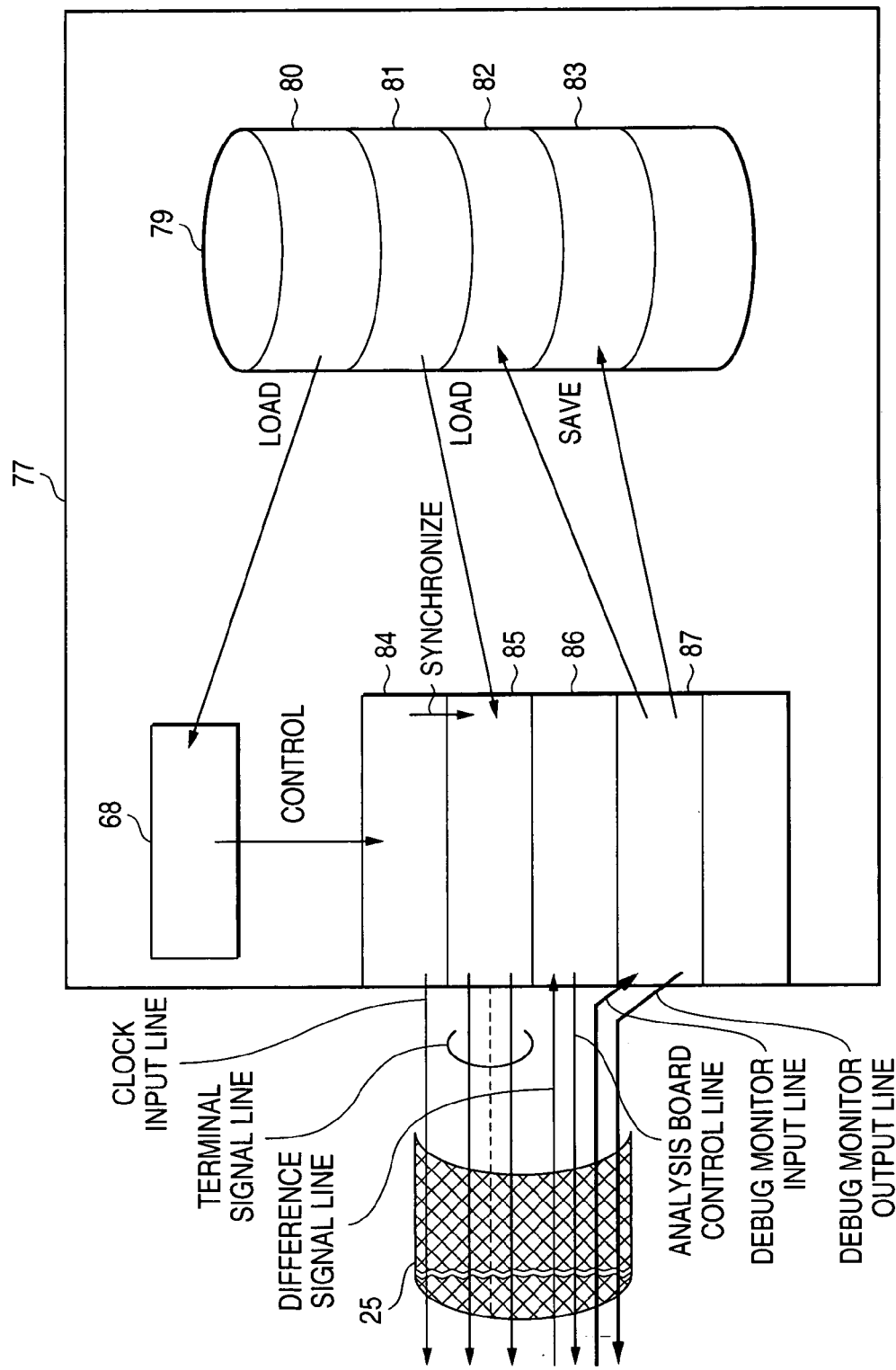
FIG. 23 is a conceptual diagram for showing a structure of a system upon analyzing the defective data according to a fifth embodiment.

According to the fifth embodiment, the structure upon recording the defective data is the same as that of the first embodiment. In addition, the operation upon recording the defective data is also the same as that of the first embodiment. FIG. 23 is a structural diagram upon analyzing the defective data according to a fifth embodiment.

To a work station 77, an automatic trace software 80 will be operated. In a storage 79, the terminal trace data 81, the register trace data 82, and the RAM trace data 83, which are generated upon recording, are saved.

Figure 24:
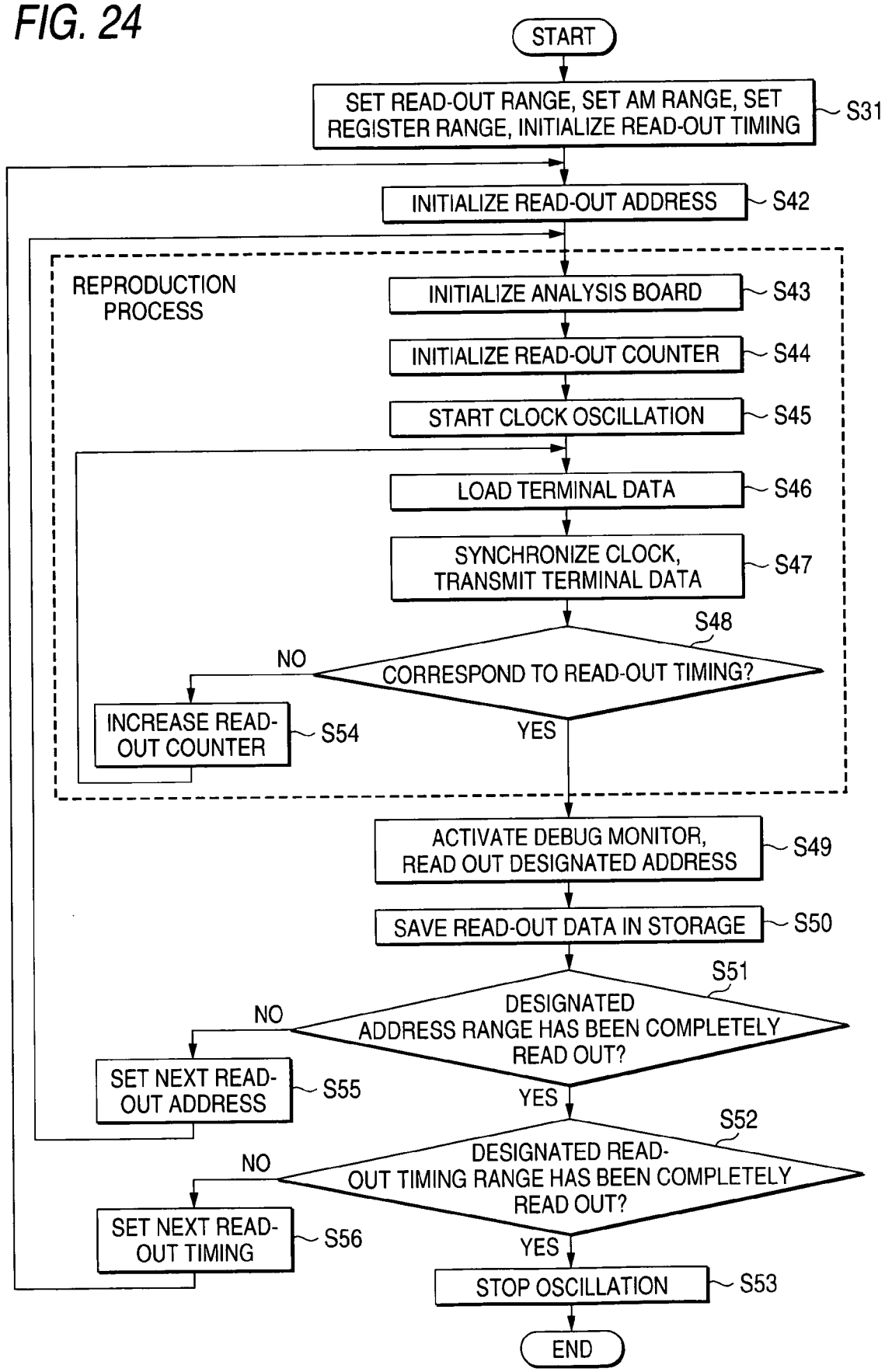
FIG. 24 is a flow chart of automatic trace software for showing the operation upon analyzing the defective data according to the fifth embodiment.

The operation upon analyzing the defective data according to the fifth embodiment is shown in a flow chart of the automatic trace software in FIG. 24. If the program is started, at S31, the reading timing range and the reading address range are set (S31), the read-out address is initialized at S42 (S42), and at S43 to S48, and S54, as in the fourth embodiment, the conditions of the register and the RAM are obtained.

Figure 25:
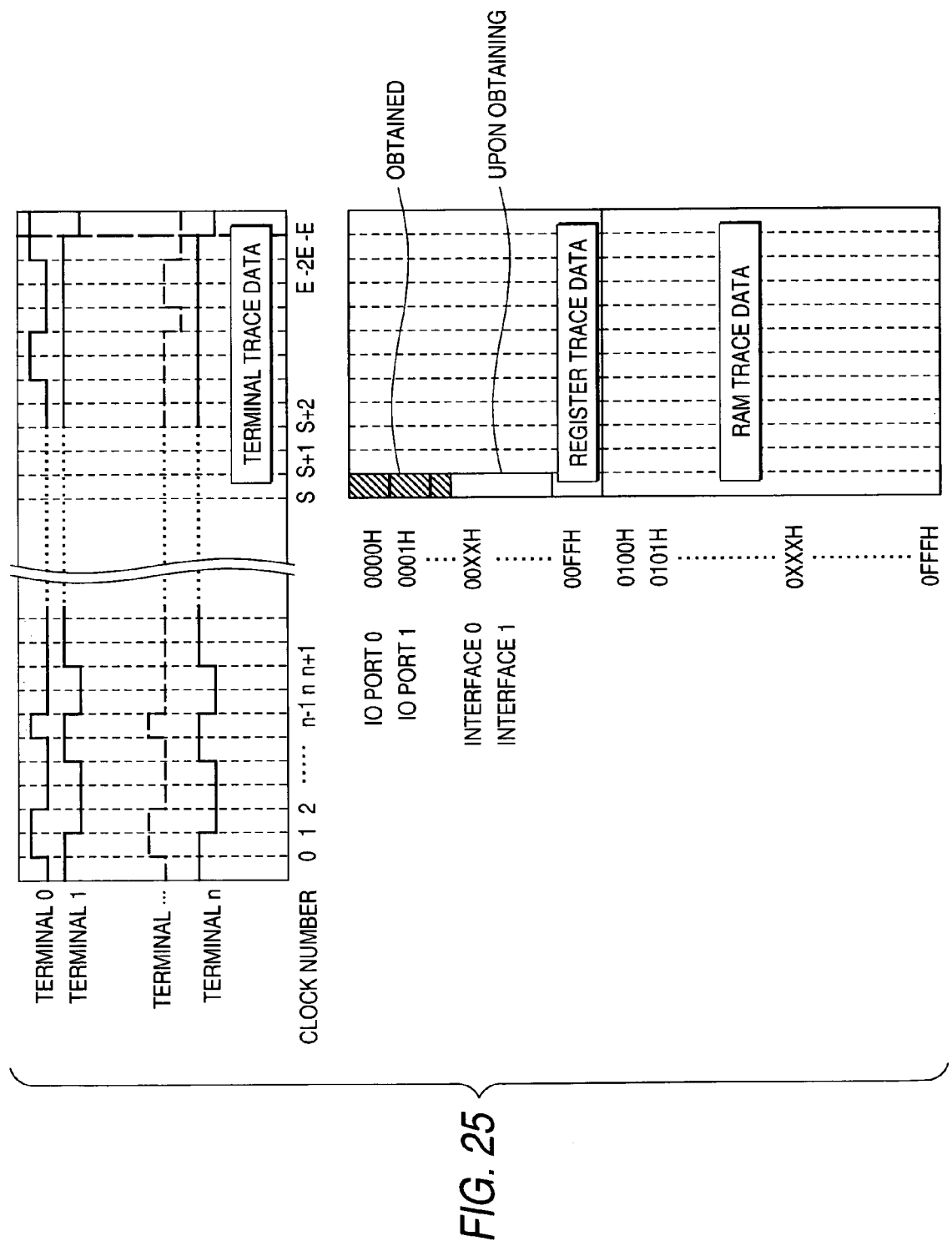
FIG. 25 is a correlation diagram of the terminal trace data, the register trace data and the RAM trace data during acquisition of the condition according to the fifth embodiment.

FIG. 25 shows a correlation between the terminal trace data 81, the register trace data 82 and the RAM trace data 83 under the above described condition. In the first time, the register data of the range represented by "obtained" is obtained to be saved in the register trace data. Since the address range has not been completely read-out, this register data is set as the next read-out address (i.e., the range represented by "upon obtaining"), and then, the register read-out will be sequentially repeated due to the processing from the reproduction processing to the debug monitor.

In the case that all of the designated addresses are completely read, the next read-out timing is set to be increased by +1 from an initial value S, and in the same way, the collection of the register and the trace data of the RAM is maintained.

Figure 26:
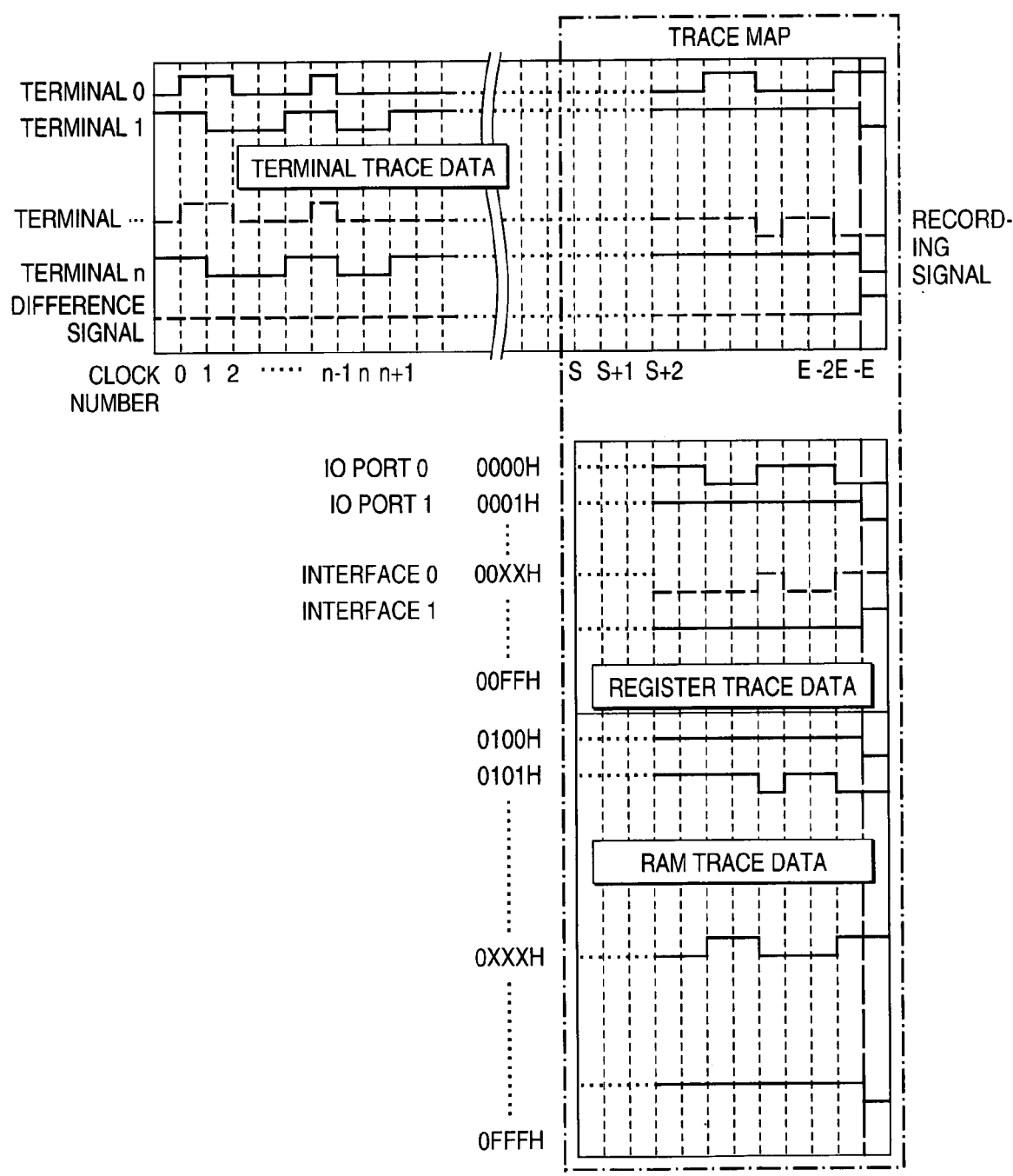
FIG. 26 is a correlation diagram of the terminal trace data, the register trace data and the RAM trace data after the condition is completely obtained according to the fifth embodiment.

If all of the designated addresses are completely read, it is possible to obtain the terminal trace data 81, the register trace data 82 and the RAM trace data 83 shown in FIG. 26.

As described above, according to the fifth embodiment, analysis of the terminal trace data 81, the register trace data 82 and the RAM trace data 83 makes the detailed defective analysis operation along time series possible.

(Sixth Embodiment)

A sixth embodiment may solve the problem 1 that the repeatability of the defect is not good and the problem 2 that it is difficult to analyze relevance between the true defect and the detected defect. Although the fifth embodiment makes it possible to collect each trace data of the terminal, the register, and the RAM, it is still necessary to analyze the defective portions. Therefore, an object of the sixth embodiment is to clarify the defective portions upon tracing. According to the sixth embodiment, in addition to the trace data that is obtained according to the fifth embodiment, the same trace data is obtained with respect to the normal microcomputer so as to discriminate a clear portion where the difference is generated.

Figure 27:
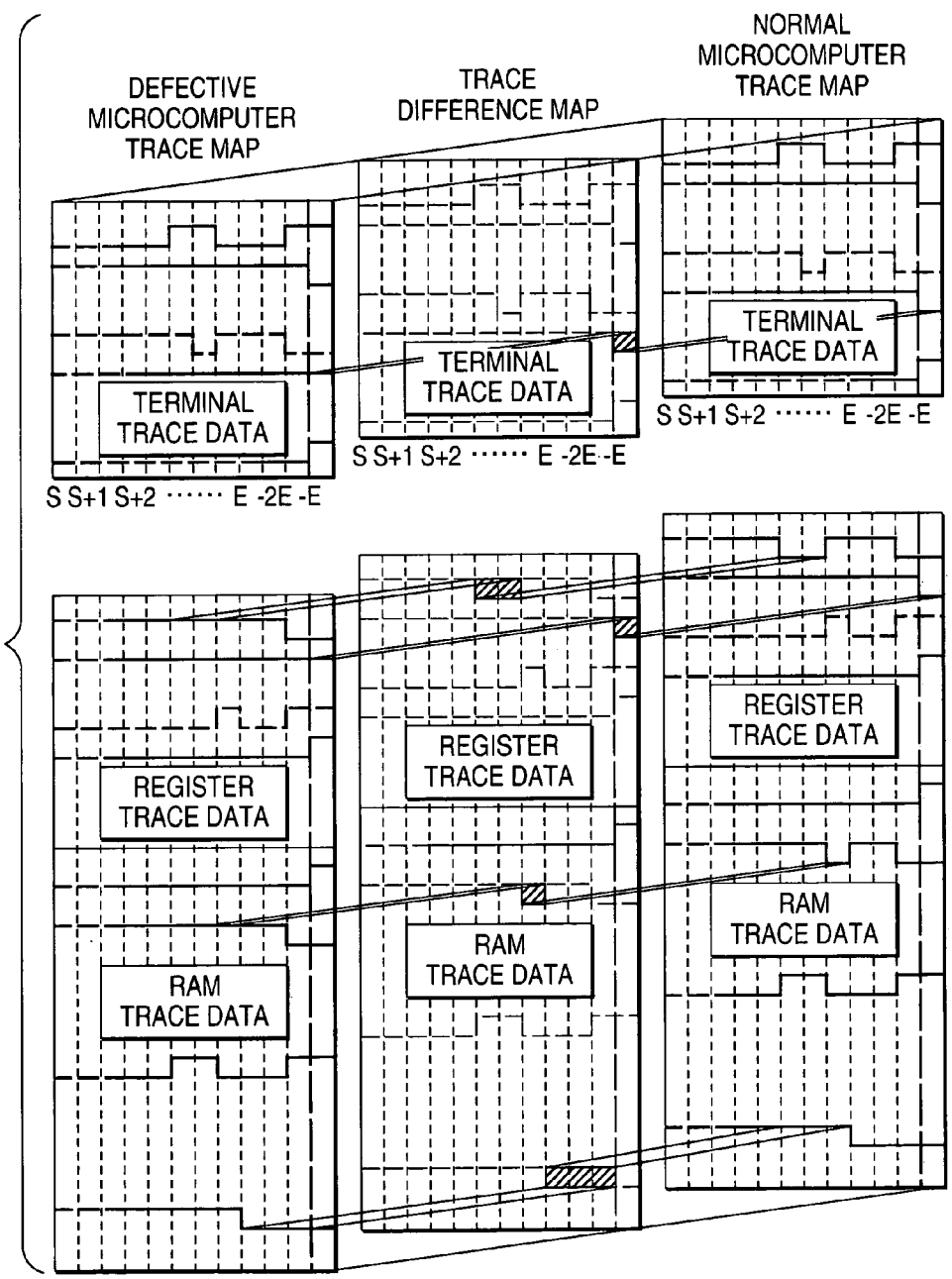
FIG. 27 is a trace difference map according to a sixth embodiment.

The sixth embodiment will be described by a trace difference map shown in FIG. 27. FIG. 27 is composed by a defective microcomputer trace map, a normal microcomputer trace map, and a trace difference map as the difference between the both.

According to the sixth embodiment, normal microcomputer 45 is mounted on the analysis board 24, and as in the fifth embodiment, the normal microcomputer trace maps are collected. After the collection, comparing the normal microcomputer trace map with the defective microcomputer trace map in the work station, if they are the same values, the trace difference map of 0 is formed, and if they are not the same values, the trace difference map of 1 is formed.

As described above, according to the sixth embodiment, in the trace difference map, a portion of "1" (i.e., a portion where the difference is generated) indicates a distinct defect located at a portion where the value of the normal microcomputer and the value of the defective microcomputer are different from each other, and this leads to improvement of an analysis accuracy by attending to a portion where the difference is generated and performing the analysis operation.

(Seventh Embodiment)

A seventh embodiment may solve the problem 1 that the repeatability of the defect is not good and the problem 2 that it is difficult to analyze relevance between the true defect and the detected defect. According to the sixth embodiment, it becomes possible to clarify the difference portion, however, an event causing the defect has the potential to depend on the other event and there are many cases that the analysis is necessary from a plurality of generation cases. According to the present embodiment, a data processing method of the analysis from a plurality of generation cases will be described below.

Figure 28:
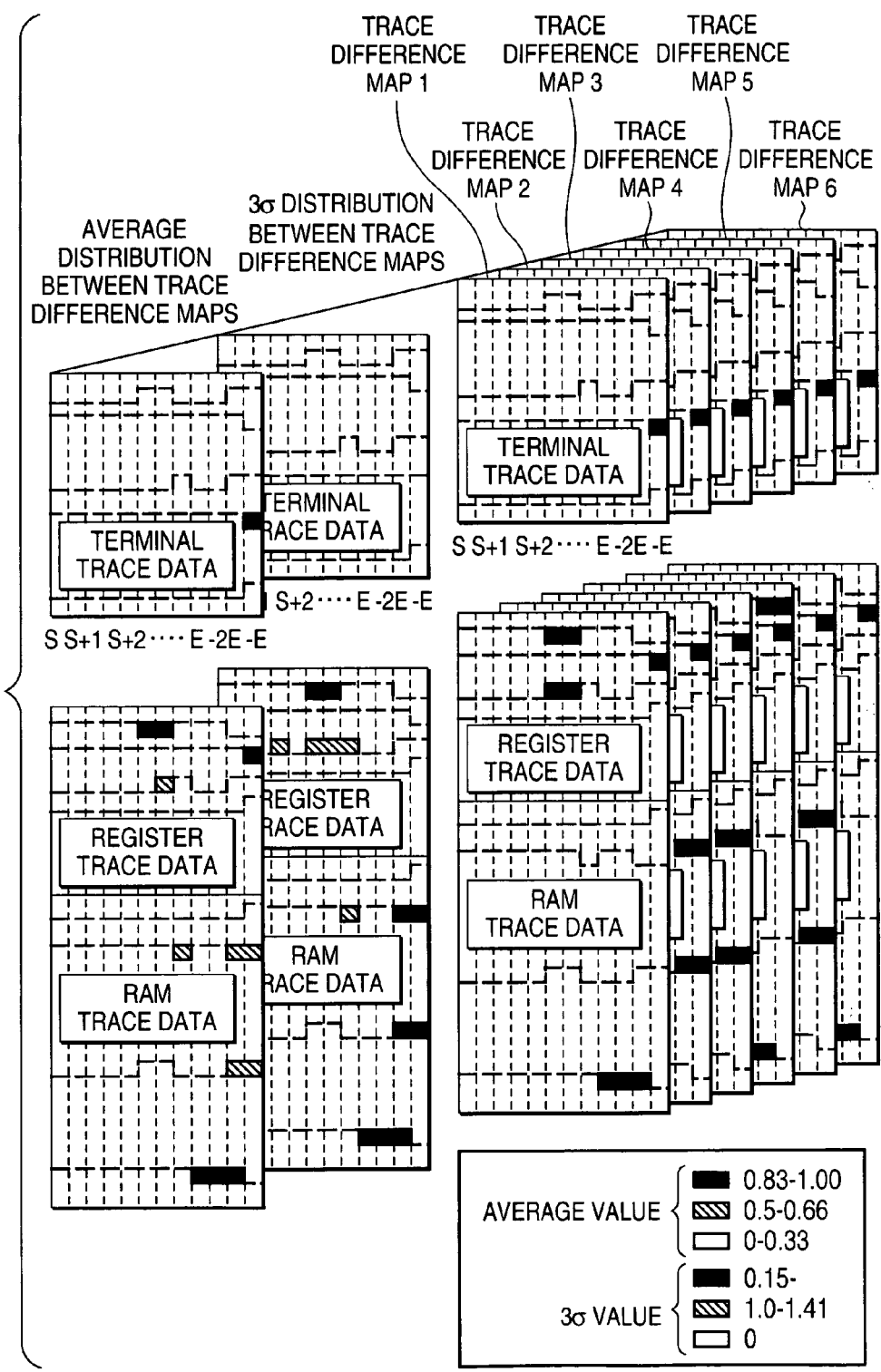
FIG. 28 is a trace difference map according to a seventh embodiment.

The seventh embodiment will be described with reference to a comparative explanatory diagram of a trace difference map in FIG. 28. According to the present embodiment, by using the defective microcomputer, six cases of the defective generation are generated so as to obtain the trace difference map with respect to each of the generation cases as in the fifth embodiment. In each defective case, the timing from resetting to detection of the defect is not fixed, however, by aligning each map so as to match the difference points of the terminal trace data defect generations of which are detected, it becomes possible to compare the trace conditions before detecting the defect. In FIG. 28, a distribution of average values of the six cases of data that are aligned is represented as "average distribution between trace difference maps" and a distribution of data spread (3σ) is represented as "3σ distribution between trace difference maps".

According to the seventh embodiment, the obtained six case of trace maps are normalized into the most narrow map by at first performing the alignment operation so as to match the portions where the differences are generated in the terminal trace data in the work station. In the next place, the average of all trace points between the maps and the map of 3σ value of the normalized map are obtained by a statistical work.

As described above, according to the seventh embodiment, by grouping the portion where a difference is certainly generated and a portion where there is variation depending on the generation case or the like due to the average map and the 3σ map, it becomes possible to discriminate a main case and a dependent case and further, even in the case that the dependent case is generated, the analysis becomes possible.

(Eighth Embodiment)

An eighth embodiment may solve the problem 1 that the repeatability of the defect is not good. Upon obtaining the trace data according to the fifth embodiment, when it takes a long time from resetting to generation of the defect, the reproduction for a long time must be repeated upon obtaining the trace, so that it takes a long time to obtain the trace. Therefore, an object of the eighth embodiment is to reduce the repetition time by obtaining/resuming the condition of an arbitrary microcomputer.

Figure 29:
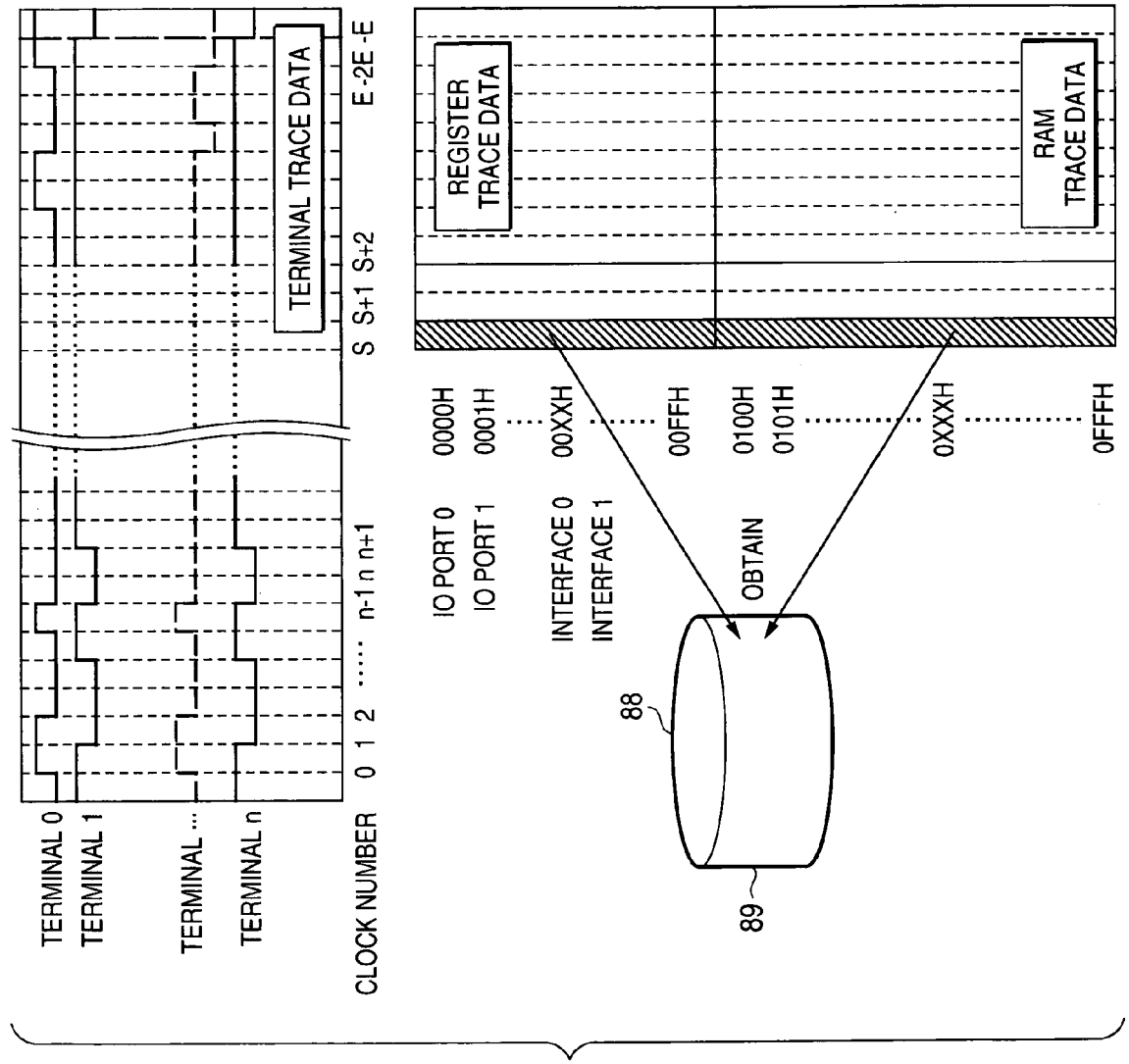
FIG. 29 is a map for showing the condition of the resume data acquisition according to an eighth embodiment.

According to the eighth embodiment, a structure upon recording the defective data is the same as that of the first embodiment. In addition, the operation upon reproducing the defective data is the same as that of the first embodiment. FIG. 29 shows an explanatory diagram upon obtaining the resume data according to the eighth embodiment. After the defective data is reproduced, a resume timing R is set at the timing before the trace obtaining timing S.

Figure 30:
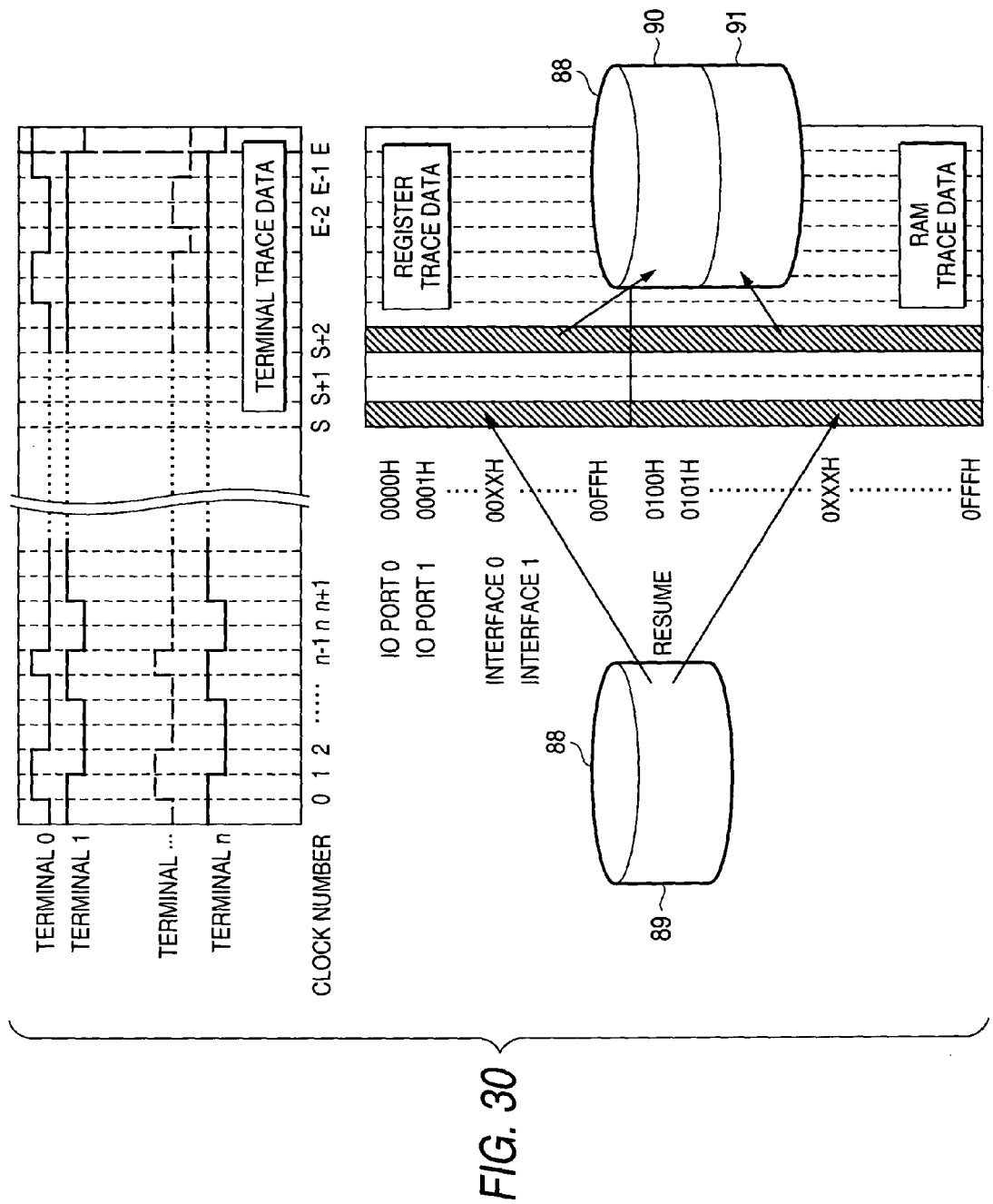
FIG. 30 is a map for showing the resume of the condition and the condition of the trace acquisition.

According to the eighth embodiment, by the same method as that of the fifth embodiment, the register and the RAM trace at the resume timing R are obtained to be saved as the resume data 89. FIG. 30 shows the resume of the condition and the condition of the trace acquisition. In FIG. 30, the terminal condition at the resume timing R is outputted to the microcomputer, and by using the debug monitor, the RAM conditions of the resume data are sequentially written in the microcomputer. In the next place, leaving the register that is modified on its own account such as a timer, the register condition is written therein. Writing into the register that is left at last, the saved condition can be resumed. Reaching to the trace data obtaining timing S after the saved condition is resumed, the trace data is obtained.

As described above, according to the eighth embodiment, by resuming the condition, it is possible to reduce the reproduction time to a large extent and this results in reduction of the obtaining time of the trace data.

(Ninth Embodiment)

A ninth embodiment may solve the problem 1 that the repeatability of the defect is not good and the problem 2 that it is difficult to analyze relevance between the true defect and the detected defect. According to the fifth embodiment, it becomes possible to obtain the defective/normal microcomputer trace data, however, a command to be processed by a CPU is not discriminated by the terminal, the RAM, and the register trace data. An object of the ninth embodiment is to merge the trace data with the command during execution.

Figure 31:
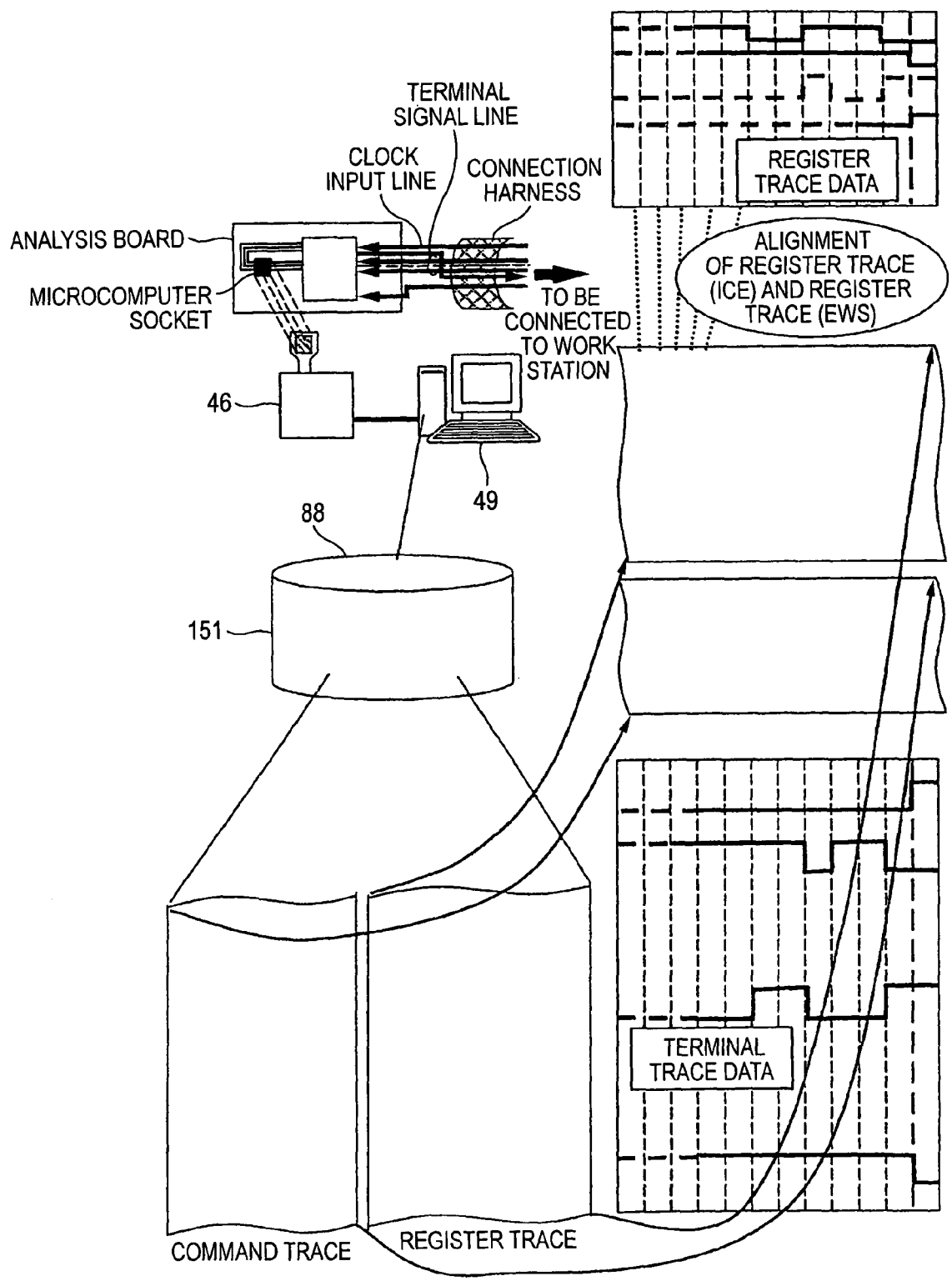
FIG. 31 is a map for showing the condition of the data acquisition according to a ninth embodiment.

A system according to the ninth embodiment will be described with reference to FIG. 31. Upon reproducing the normal microcomputer, in place of the normal microcomputer, the emulator 46 is used. Due to the emulator function, it is possible to obtain the condition trace of the input/output terminal and the command trace.

According to the ninth embodiment, the trace data 90 and 91 due to the emulator 46 are obtained by a host computer 49 to be transferred to a storage 88 of the work station. The trace data 151 includes the command trace data and the register trace data.

Comparing the condition of the register trace data that has been obtained in advance to the condition of the register trace data due to the emulator 46, alignment is carried out to obtain the offset. By applying this offset command to the trace data, the trace of the synchronized terminal-register-RAM-command can be obtained.

As described above, according to the ninth embodiment, by synchronizing the command trace data, it becomes possible to grasp the operation of the microcomputer in more detail, and this lead to improvement of the analysis accuracy.

(Tenth Embodiment)

A tenth embodiment may solve the problem 1 that the repeatability of the defect is not good. In the case of analyzing the defect, since the actual processing speed is too fast, the defect may be overlooked. The tenth embodiment may solve this problem.

Figure 32:
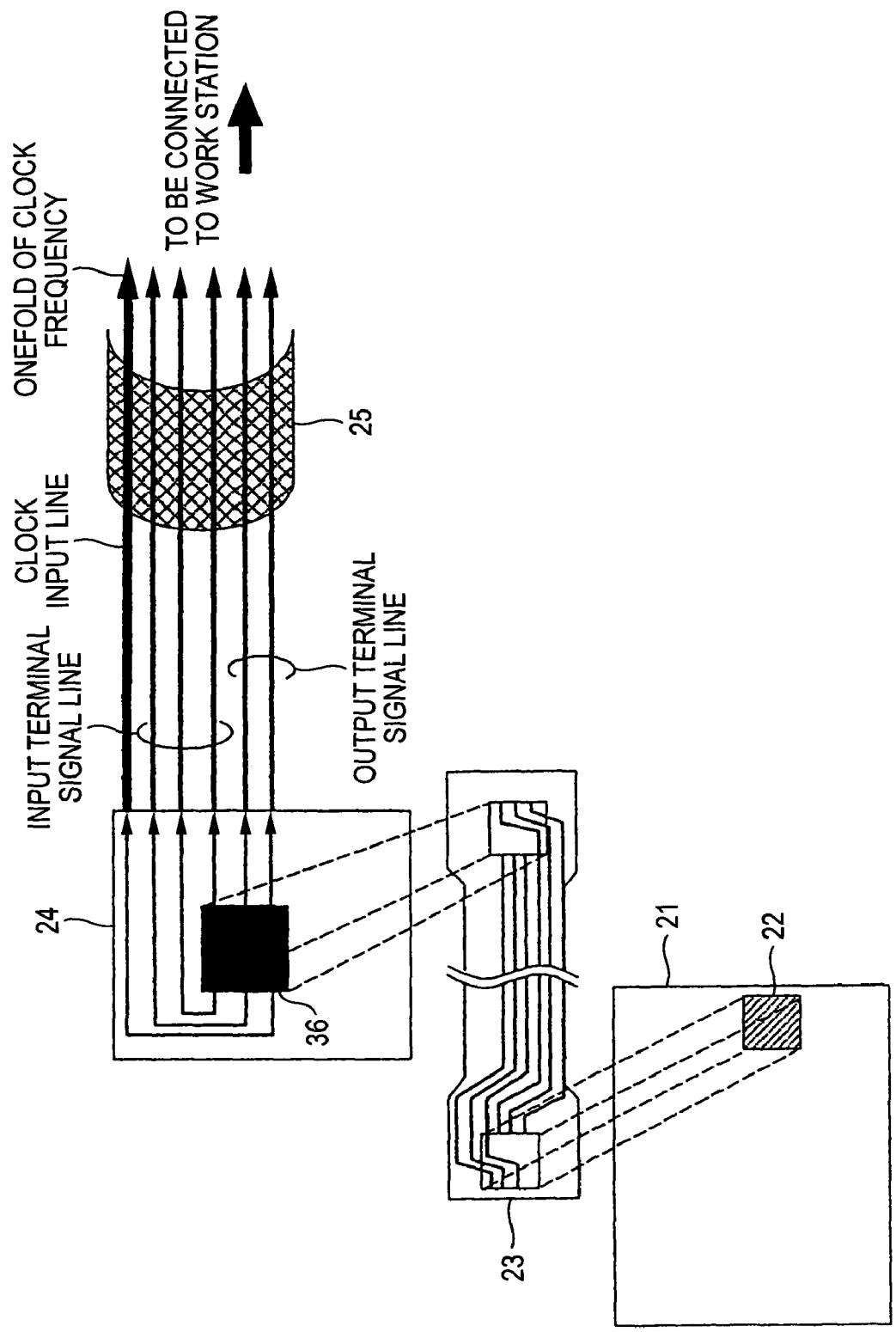
FIG. 32 is a conceptual diagram for showing a structure of an analysis board upon recording according to a tenth embodiment.
Figure 33:
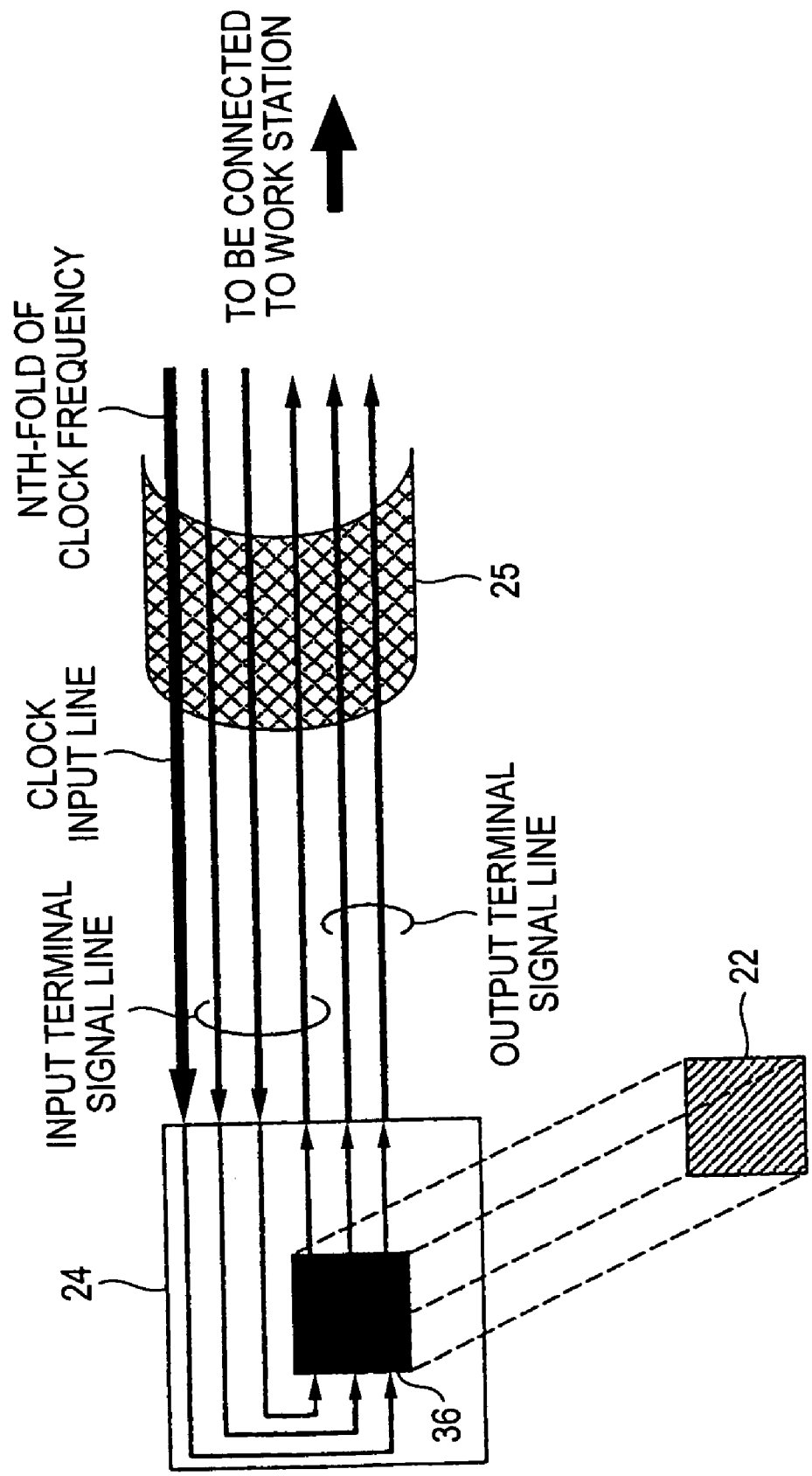
FIG. 33 is a conceptual diagram for showing a structure of the analysis board upon reproducing according to the tenth embodiment.

With respect to recording according to the second embodiment, a structural diagram of an analysis board is shown in FIG. 32. Upon recording, the data is recorded at the actual speed. In addition, with respect to the reproduction according to the second embodiment, FIG. 33 shows a structural diagram of an analysis board (upon reproducing).

According to the tenth embodiment, upon reproducing, a clock control board is operated by the work station to adjust a clock frequency. If the defect is overlooked, a clock speed is lowered. Upon recording, due to an outer circuit, the clock control board may be operated only at the actual speed, however, upon reproducing, the clock speed to be supplied to the microcomputer may be merely changed, thereby, it is possible to vary the clock speed within a range allowed by the microcomputer.

As described above, according to the tenth embodiment, by varying the clock speed upon reproducing, it becomes easy to find the defect that cannot be found upon recording. In addition, if it takes a long time for reproduction at the actual speed, it is possible to reduce the reproduction time by raising the clock speed.

(Eleventh Embodiment)

An eleventh embodiment may solve the problem 1 that the repeatability of the defect is not good and the problem 3 that it is difficult to establish a test method to prevent reappearance of the defect. Conventionally, the defect of the microcomputer is found, and then, the analysis operation will be performed, and after its cause is found out, a test program is prepared, whereby the microcomputer in which the defect is generated is regarded as failure by an inspection. However, it takes a very long time to prepare this. The eleventh embodiment provides an inspection method whereby the defective microcomputer is regarded as failure for a short time.

Figure 34:
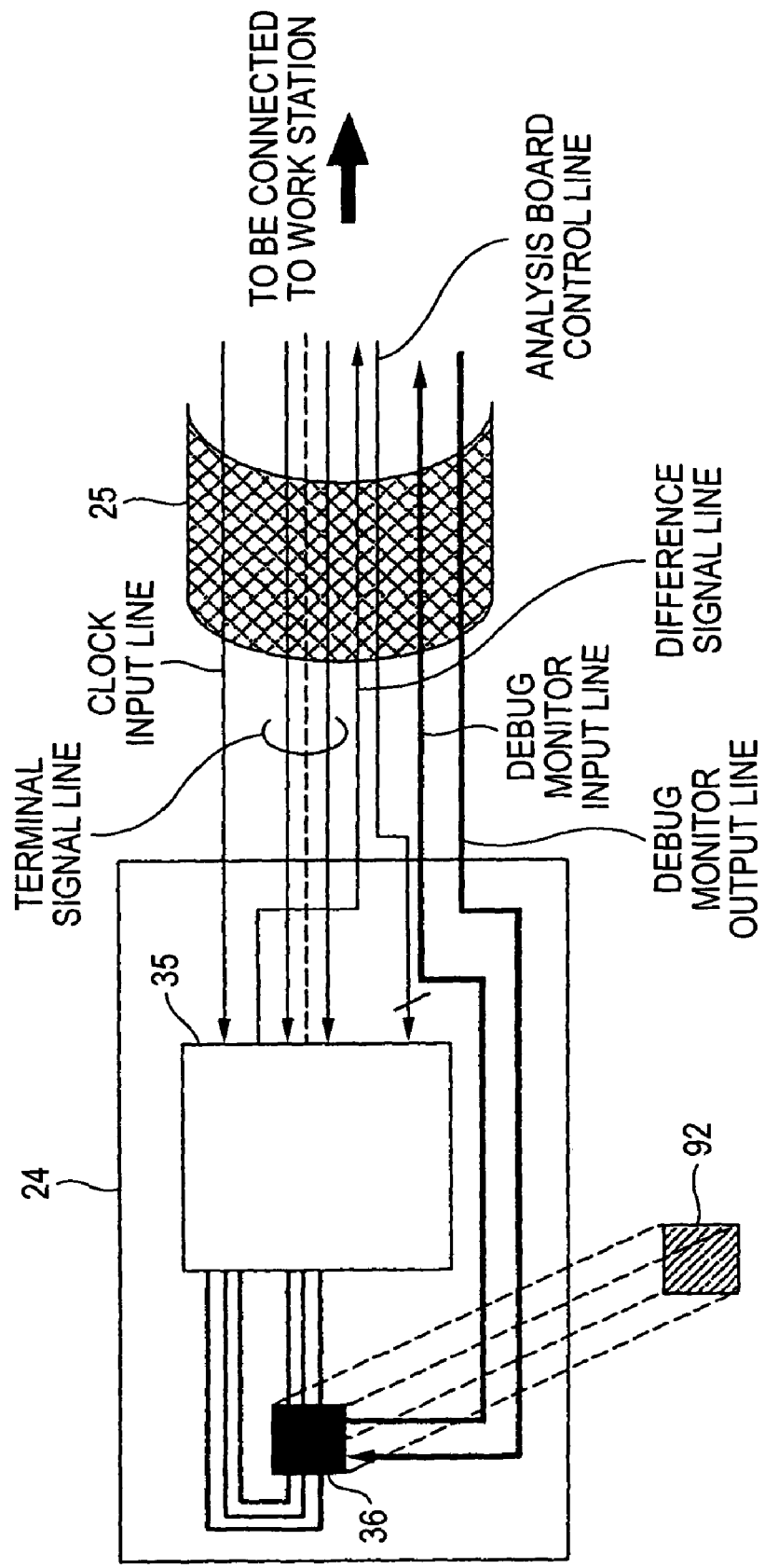
FIG. 34 is a conceptual diagram for showing a structure of an analysis board upon inspecting according to an eleventh embodiment.

An inspection method according to the eleventh embodiment is shown in a structural diagram of an analysis board in FIG. 34. In the inspection method according to the eleventh embodiment, as I the second embodiment, the terminal trace data where the defect is generated in the defective microcomputer 22 is obtained to be reproduced by the normal microcomputer, and the terminal trace data of the normal microcomputer is obtained. Then, upon the inspection, an evaluation microcomputer 92 may reproduce the terminal trace data of the normal microcomputer.

When the evaluation microcomputer 92 is normal, since there is no difference between terminal output of the microcomputer and the terminal trace data, the reproduction will be terminated with the difference signal left to be "L". In the case that the evaluation microcomputer 92 has the defect equivalent to the defect of the defective microcomputer 22, the difference between the output terminal of the microcomputer and the terminal trace data is generated upon reproducing and the difference signal is changed from "L" to "H", which enables to detect that an error has been generated.

Figure 35:
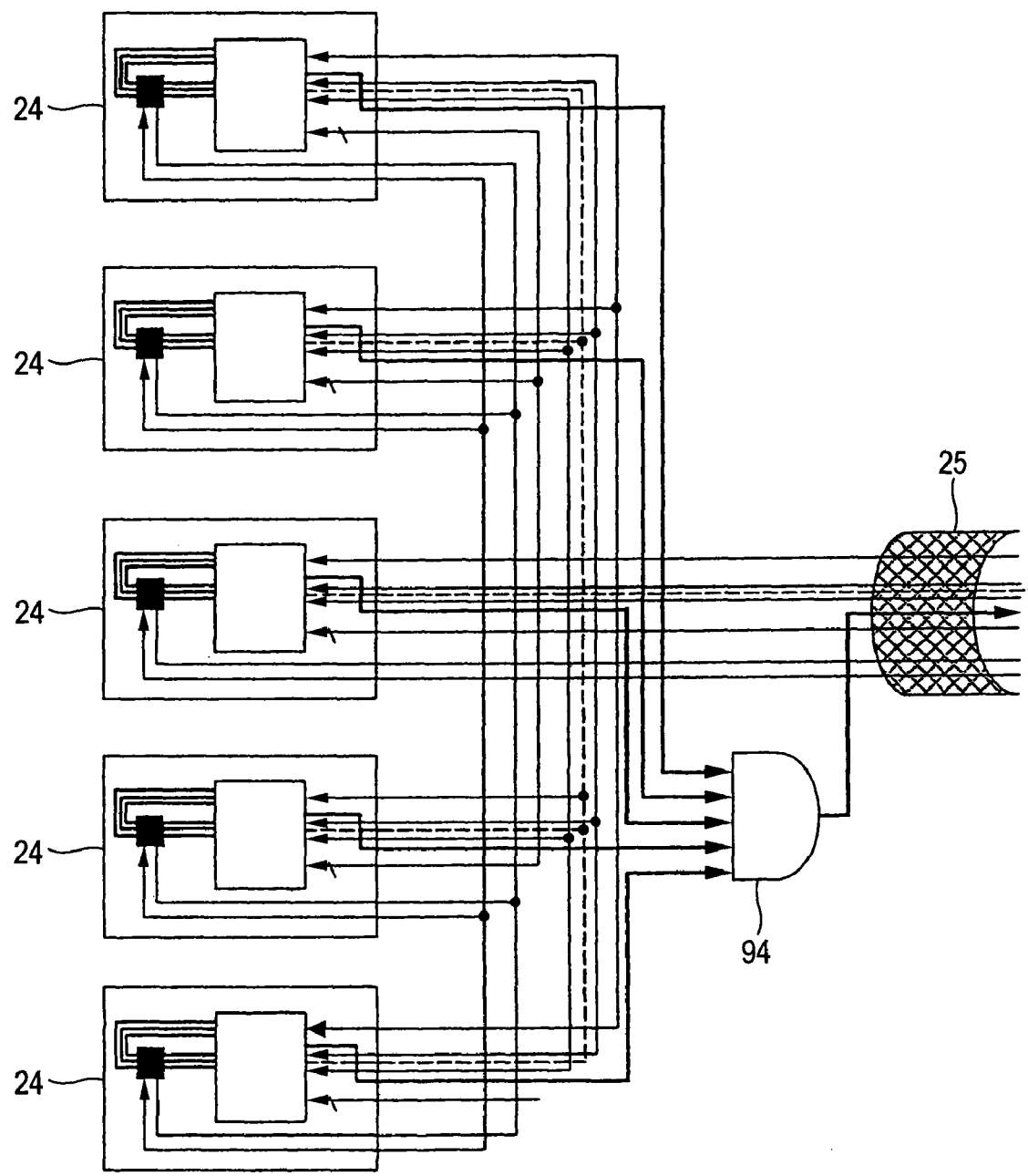
FIG. 35 is a conceptual diagram for showing a structure of a plurality of analysis boards according to the eleventh embodiment.

As described above, even at a stage that the cause of the defect cannot be analyzed, according to the detection method of the eleventh embodiment, the detection of the microcomputer where the defect arises becomes possible. In addition, as its application, as shown in FIG. 35, a plurality of analysis boards 24 are provided, the difference signal of each analysis board is inputted in a multiinput (multi gate) OR 94, and a signal of logical add is connected to the work station as the difference signal, and this makes it possible to inspect a plurality of microcomputers at the same time and to expect the improvement of an inspection throughput.

(Twelfth Embodiment)

The above described embodiments 1 to 11 adapt to the microcomputer that is only provided with a digital input terminal. A twelfth embodiment 12 is applied to the microcomputer to support an analog input terminal, i.e., the microcomputer that is provided with analog-to-digital conversion. As described above, according to the twelfth embodiment, upon recording, an applied voltage of the analog input terminal is recorded. Then, by applying the reproduced voltage to the analog input terminal upon reproducing, the present embodiment is applied to the microcomputer that is provided with the analog input terminal. A structure of the twelfth embodiment upon recording or upon reproducing will be described below.

Figure 36:
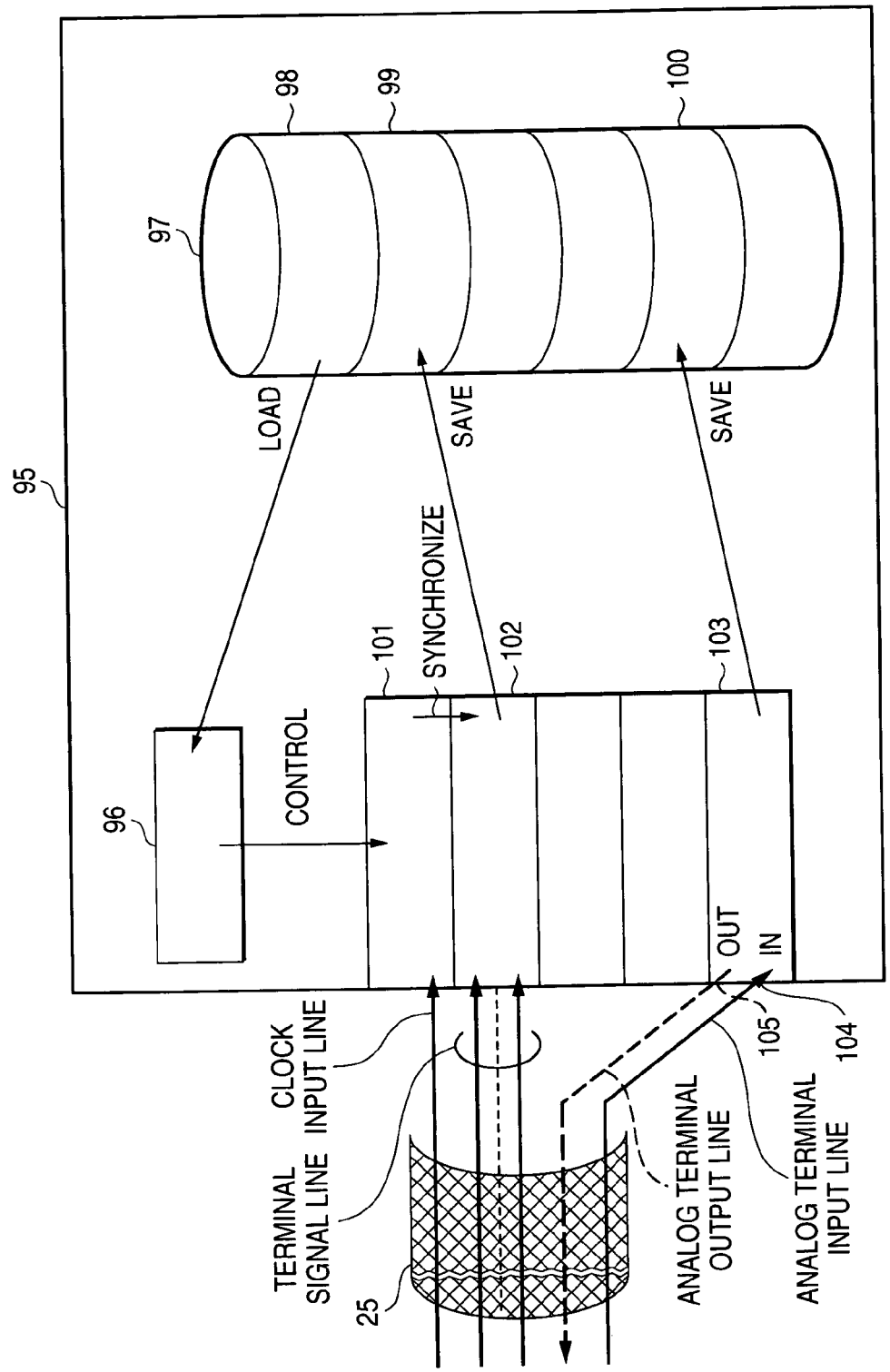
FIG. 36 is a conceptual diagram for showing a structure of a work station to support an analog terminal upon recording according to a twelfth embodiment.

With respect to a work station to support the microcomputer that is provided with the analog input terminal, upon recording, FIG. 36 shows a structural diagram of the work station to support the analog terminal (upon recording). To the work station according to the second embodiment, the following items are added.

An analog IO board 103 performs analog-to-digital conversion of an analog input board 104 under the control of record software to support analog 98 and it records a conversion result in the recorded analog trace data 100 on a storage 97. An analog terminal input line is connected to the analog input board 104 and the analog input board 104 is set at the input condition under the control of the record software to support analog 98 to perform the analog-to-digital conversion. The analog terminal output line is connected to an analog output board 105, and the analog output board 105 is set at a stop high impedance) condition under the control of the record software to support analog 98. The recorded analog trace data 100 is the trace data of the voltage that is inputted in the analog input board 104.

Figure 37:
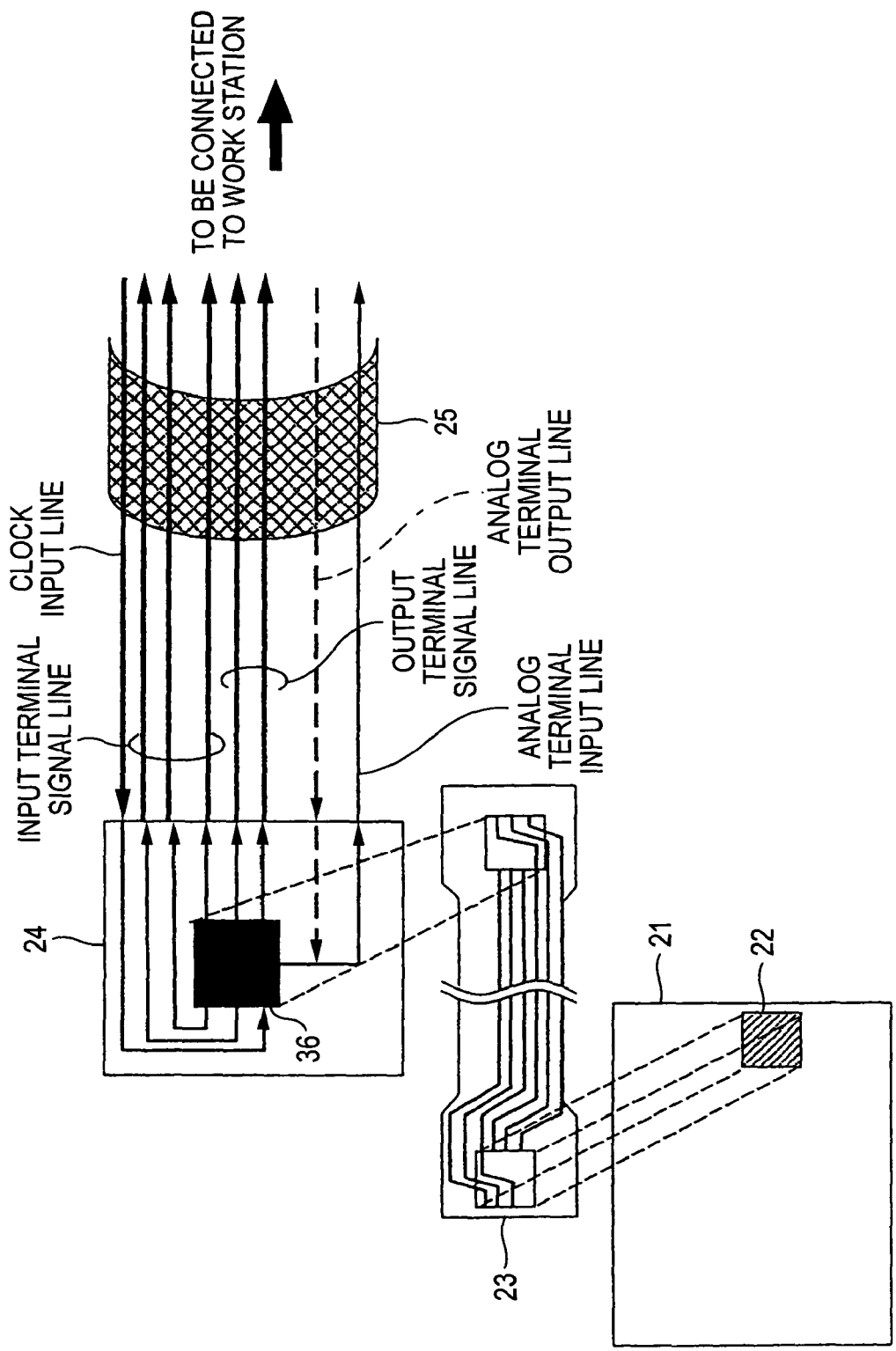
FIG. 37 is a conceptual diagram for showing a structure of an analysis board to support the analog terminal upon recording according to the twelfth embodiment.

In the next place, an analysis board to support the microcomputer that is provided with the analog input terminal will be described with reference to a structural diagram of the analysis board to support analog (upon recording) shown in FIG. 37. According to the twelfth embodiment, the following items are added to the analysis board according to the second embodiment. An analog input terminal is an analog input terminal of the microcomputer. The analog terminal input line transmits the applied voltage of the analog input terminal. The analog terminal output line is invalid because it is set at a high impedance (stop) condition. The above described two lines are connected to the analog input terminal of the microcomputer socket 36 and they are conducted with each other.

Figure 38:
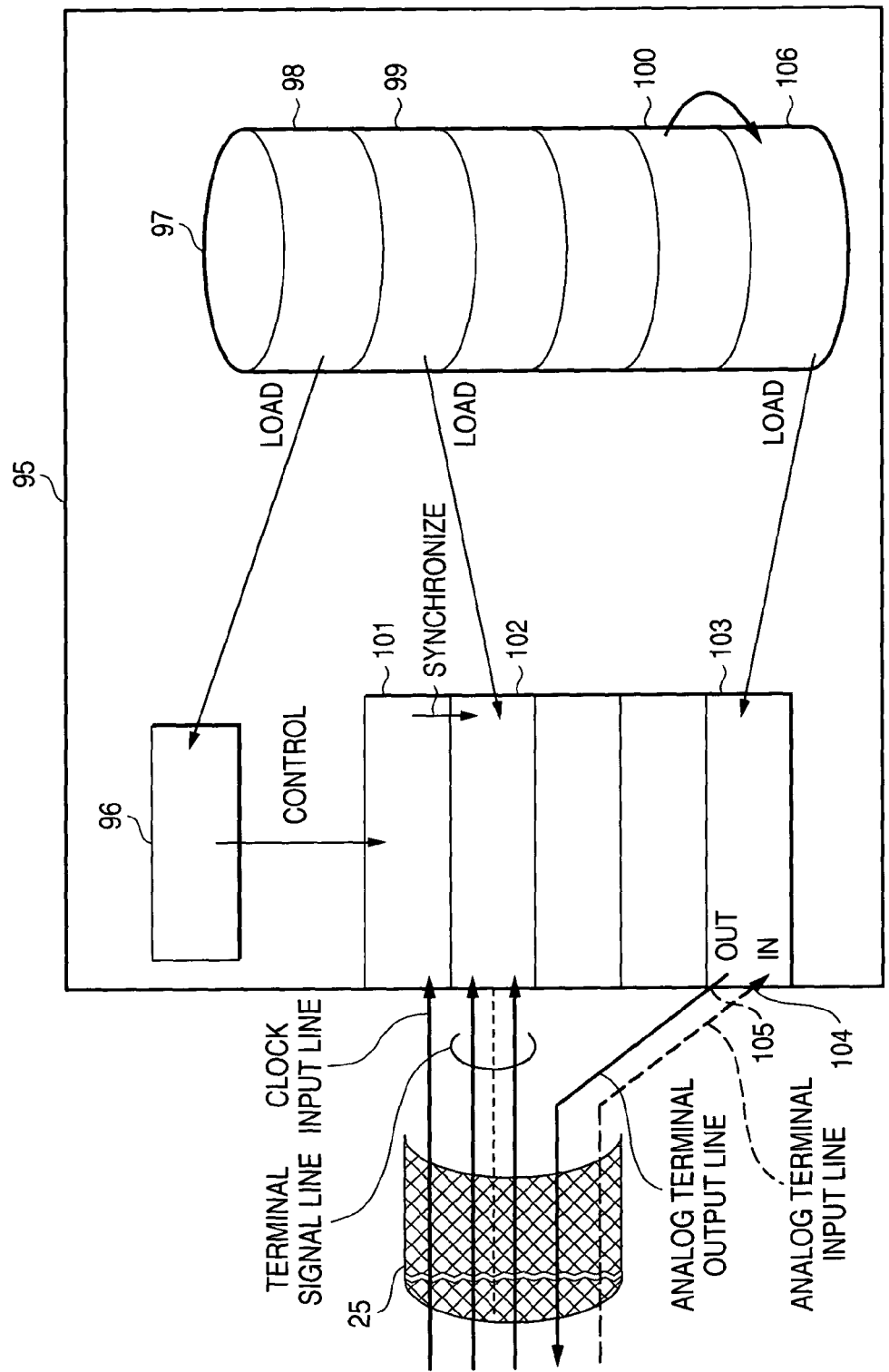
FIG. 38 is a conceptual diagram for showing a structure of a work station to support an analog input terminal upon reproducing according to the twelfth embodiment.

The reproduction according to the twelfth embodiment will be described with reference to a structural diagram of the work station to support the microcomputer that is provided with the analog input terminal (upon reproducing) shown in FIG. 38.

To the work station upon recording, the following items are modified. The output analog trace data 106 is the copy of the recorded analog trace data 100 under the control of the record software to support analog 98. In accordance with this data, the voltage to be applied to the analog input terminal is generated. The analog terminal input line is set at a stop condition under the control of the record software to support analog. The analog terminal output line is set at an output condition under the control of the record software to support analog 98 to output the voltage that sequentially digital-to-analog-converts the output analog trace data 106.

Figure 39:
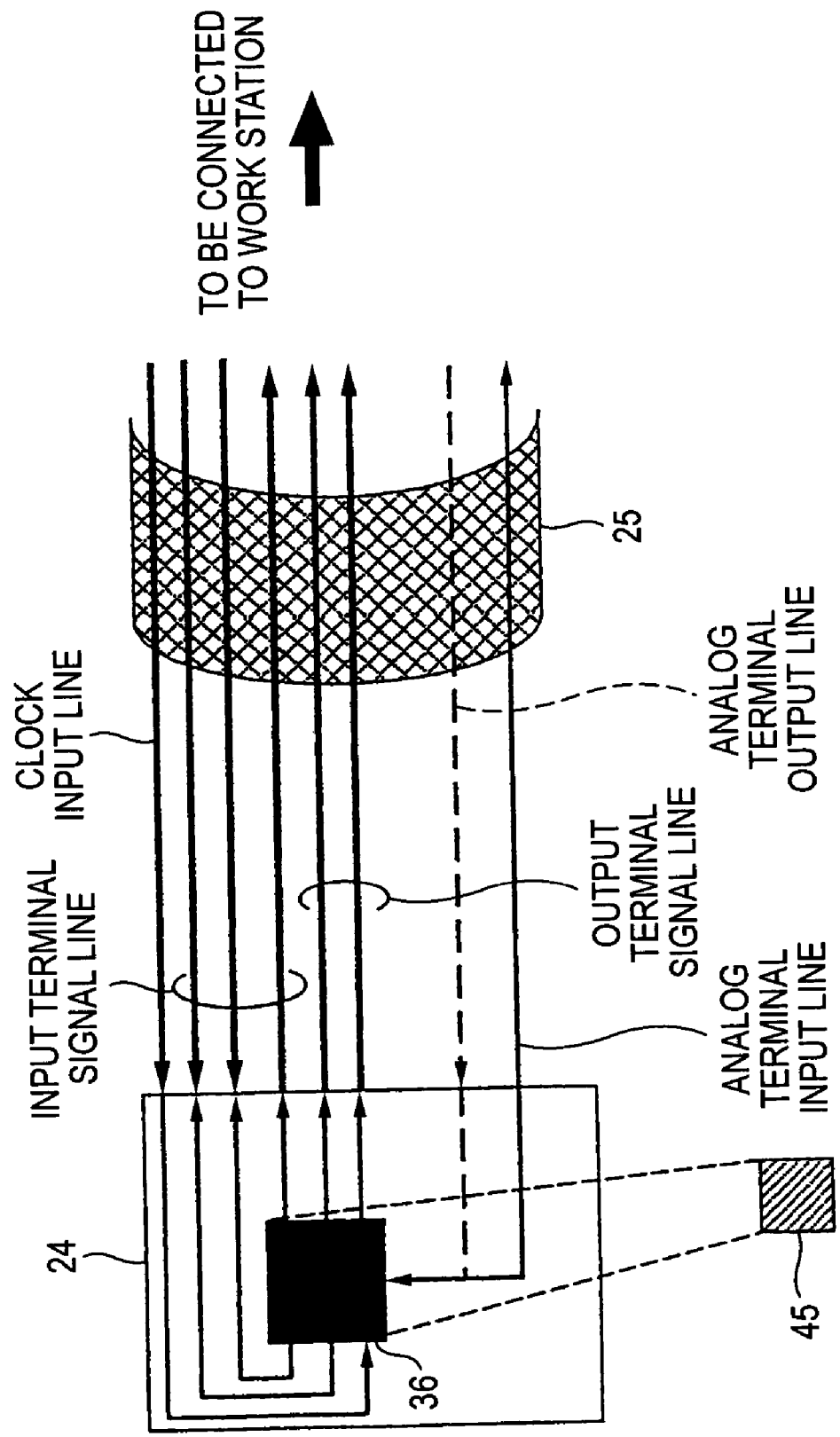
FIG. 39 is a conceptual diagram for showing a structure of an analysis board to support the analog input terminal upon reproducing according to the twelfth embodiment.

In the next place, the reproduction according to the twelfth embodiment will be described with reference to a structural diagram of the analysis board to support the analog input terminal (upon reproducing) shown in FIG. 39. The analog terminal input line is set at the stop condition. The analog terminal output line is set at the output condition to apply the voltage to the analog input terminal. The above described two lines are connected to the analog input terminal of the microcomputer socket 36.

According to the twelfth embodiment, upon recording, the voltage is applied to the analog input terminal of the defective microcomputer 22 from the target system. This voltage reaches to the analog IO board 103 through a path of the analog input terminal, the inspection probe, the microcomputer socket, the analog input terminal line, and the analog input port. Then, the voltage data that is analog-to-digital converted is saved in the recorded analog trace data 100 as well as the terminal trace data 99.

Upon reproducing the analog input terminal, after the recorded analog trace data 100 is copied into the output analog trace data 106, this data is loaded in the analog IO board 103, the digital-to-analog conversion is carried out in synchronization with the terminal trace data 99, and the analog voltage is applied to the analog input terminal by way of the analog output port, the analog terminal output line, the microcomputer socket, and the analog input terminal. Depending on this operation, to the analog input terminal of the normal microcomputer 45, the same voltage as that upon recording is applied.

As described above, according to the twelfth embodiment, the microcomputer having the analog input terminal also can record, reproduce, and analyze the data.

(Thirteenth Embodiment)

Figure 40:
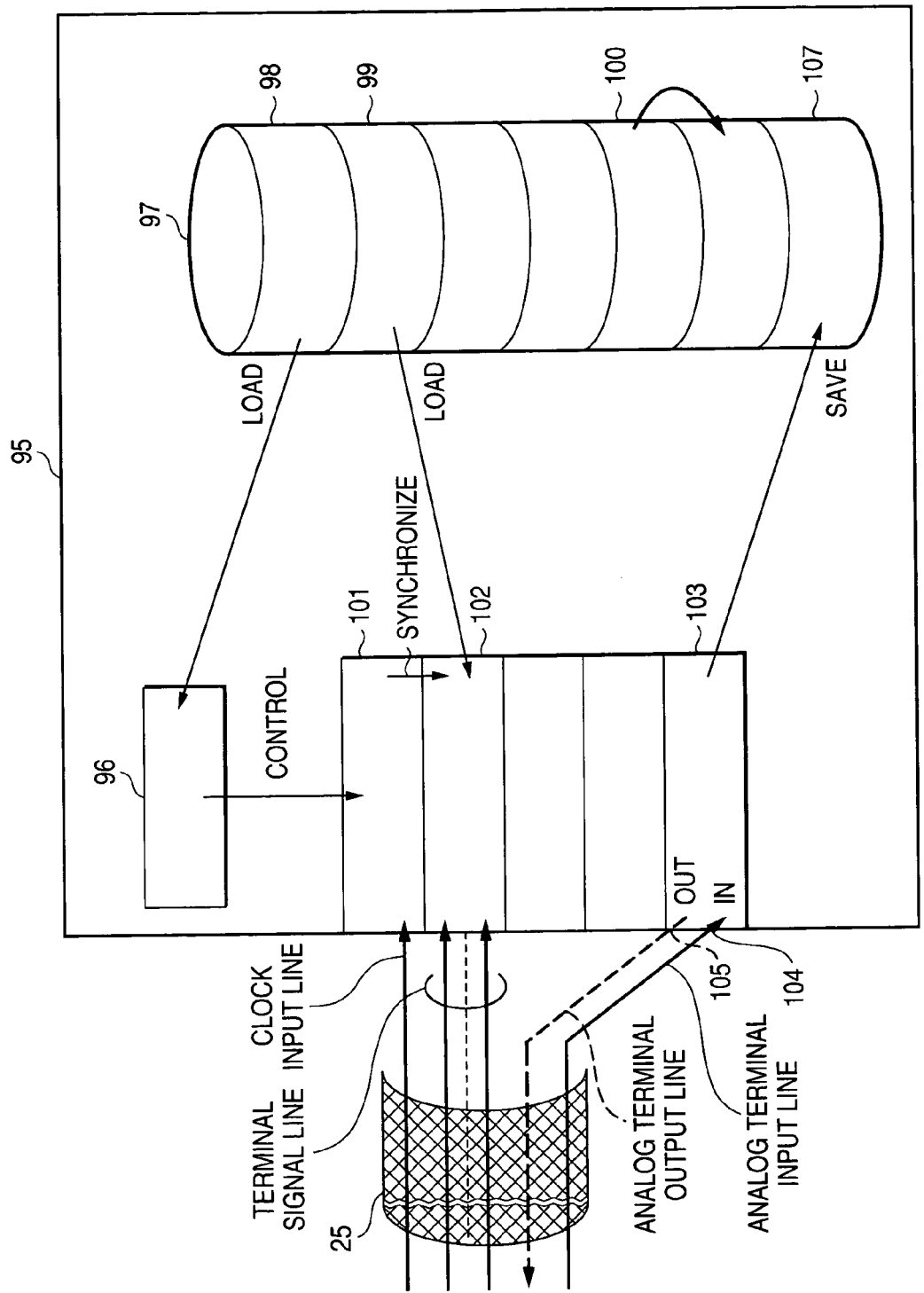
FIG. 40 is a conceptual diagram for showing a structure of a work station to support an analog output terminal upon reproducing according to a thirteenth embodiment.

According to the twelfth embodiment, a method to support the analog input terminal was described, however, an object of a thirteenth embodiment is to adapt to the microcomputer to support the analog input terminal, i.e., the microcomputer that is provided with analog-to-digital conversion. According to the thirteenth embodiment as described with respect to FIGS. 40 and 41, upon recording, the applied voltage of an analog output terminal 155 is recorded. Then, upon reproducing, the voltage outputted from the analog output terminal 155 is compared to the voltage upon recording.

The structure corresponding to each condition will be described below. The condition upon reproducing is the same as that of the twelfth embodiment. The condition upon reproducing will be described with reference to a structural diagram of a work station to support the analog output terminal (upon reproducing) shown in FIG. 40. With respect to the work station upon recording, the following items are modified. A reproduced analog trace data 107 saves the data that analog-to-digital converts the voltage of the analog terminal input line by the analog IO board 103.

Figure 41:
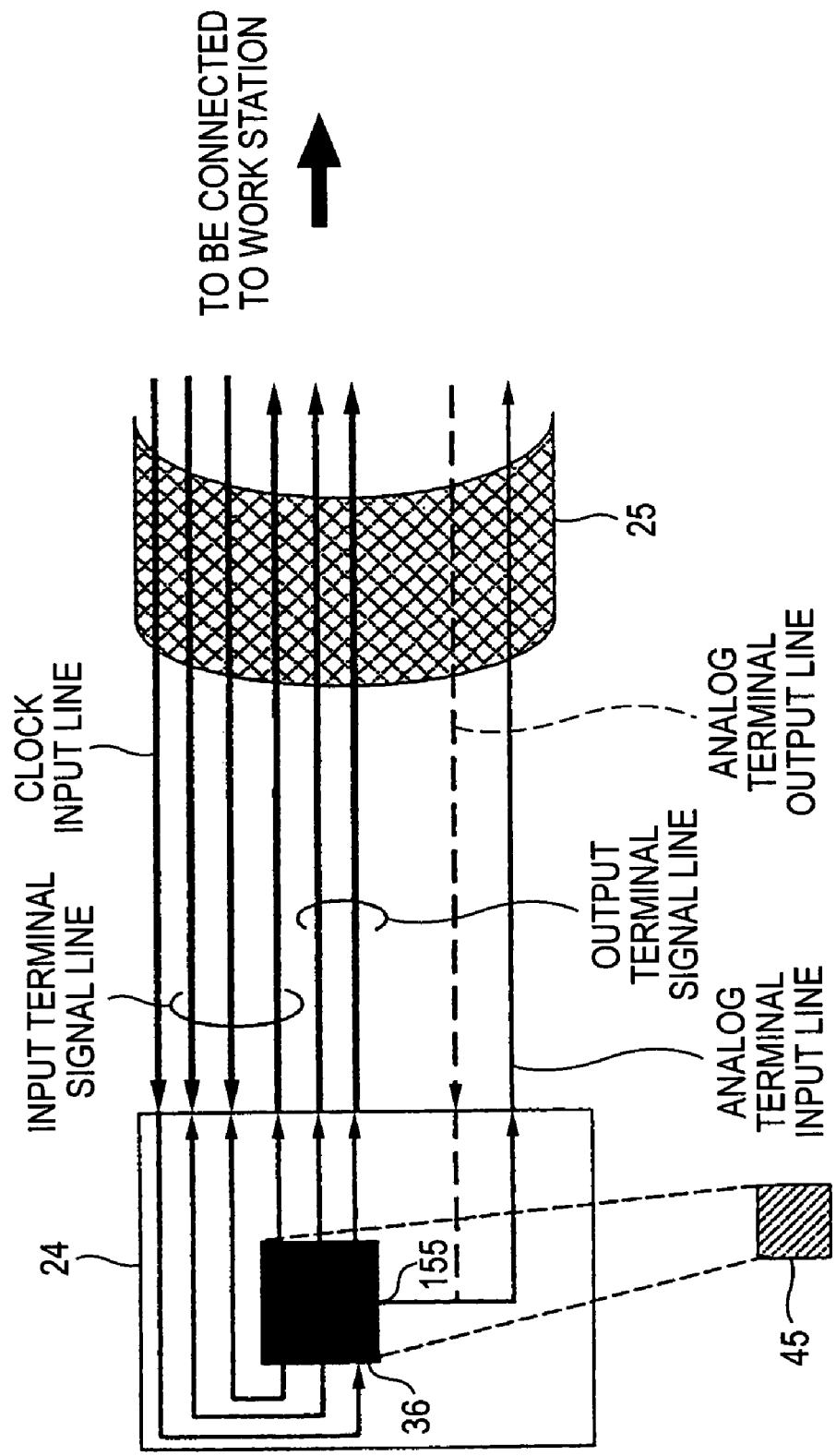
FIG. 41 is a conceptual diagram for showing a structure of an analysis board to support an analog output terminal upon reproducing according to the thirteenth embodiment.

In the next place, FIG. 41 shows a structural diagram of an analysis board to support the analog output terminal (upon reproducing) to described the thirteenth embodiment. There is no modification to the condition upon recording. The condition upon recording is the same as that according to the twelfth embodiment. Upon reproducing, as well as upon recording, the voltage of the analog output terminal 155 is recorded in the reproduced analog trace data 107. After the completion of the reproduction, the recorded analog trace data 100 that is recorded upon recording is compared to the reproduced analog trace data 107 that is recorded upon reproducing.

Figure 42:
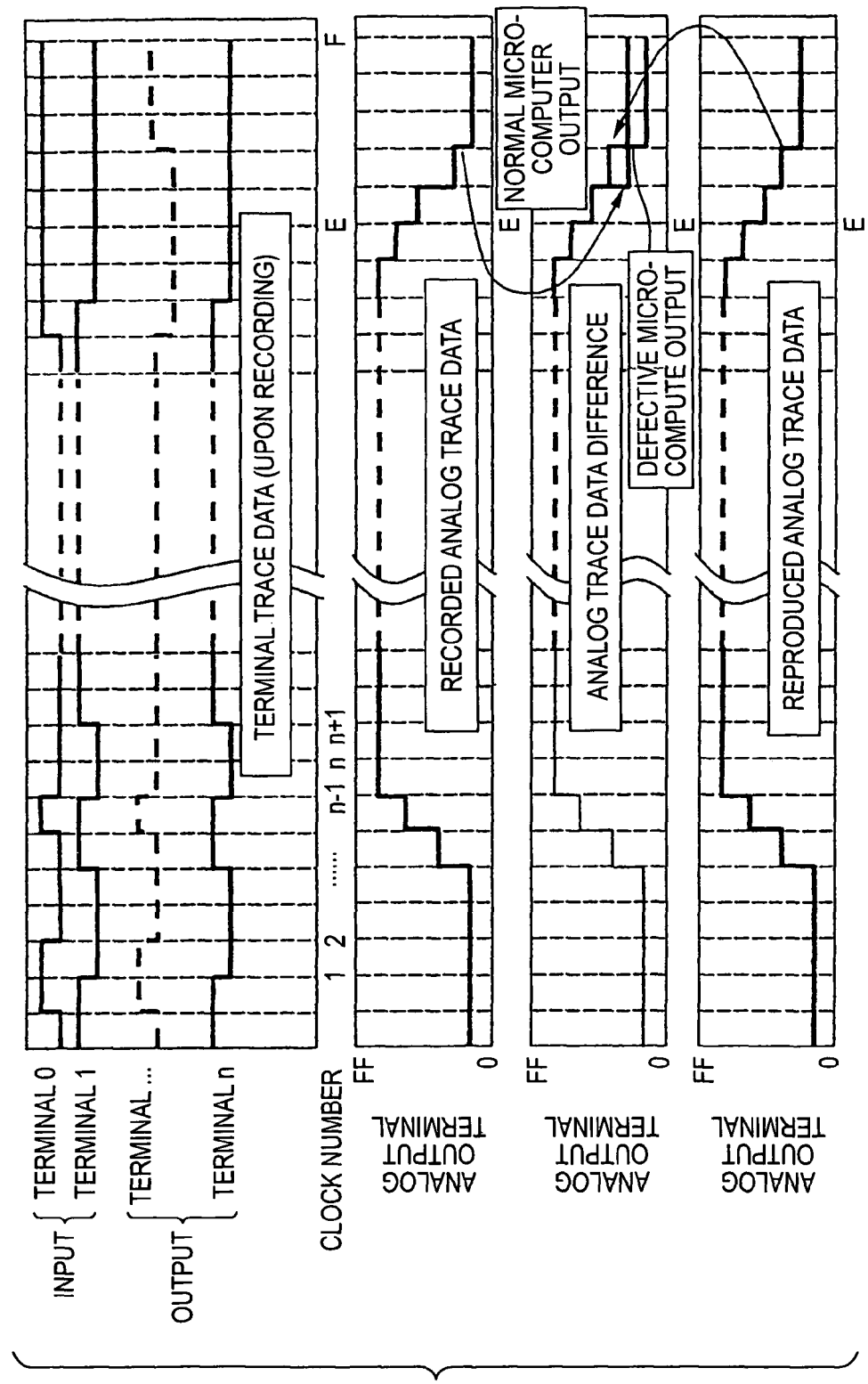
FIG. 42 is a comparative diagram of the analog output terminal trace data according to the thirteenth embodiment.

This comparison will be described with reference to a comparative diagram of the analog output terminal trace data shown in FIG. 42. FIG. 42 shows the terminal trace data (upon recording), the recorded analog trace data, the difference of the analog trace data, and the reproduced analog trace data. As comparing the recorded analog trace data of the defective microcomputer 22 that is obtained upon recording to that of the twelfth embodiment, the trace voltage is different at a difference point E, so that the defect that the analog output voltages are different is detected at this point of time.

As described above, according to the thirteenth embodiment, the microcomputer having the analog output terminal 155 can perform the operations such as recording, reproducing, and analyzing and it can detect even the defect that the analog output voltages are different.

(Fourteenth Embodiment)

A fourteenth embodiment solves the problem 1 that the repeatability of the defect is not good. According to the twelfth embodiment, the recording of the microcomputer having the analog input terminal, the reproduction, and the analysis operation become possible, however, in the analog-to-digital conversion, the individual difference of analog-to-digital conversion for each microcomputer is found, and even in the case that the same terminal voltage is applied, a conversion value may be different and thereby, the reproduction and analysis operations are not normally carried out. According to the fourteenth embodiment, a method to absorb this individual difference of the microcomputer is provided.

Figure 43:
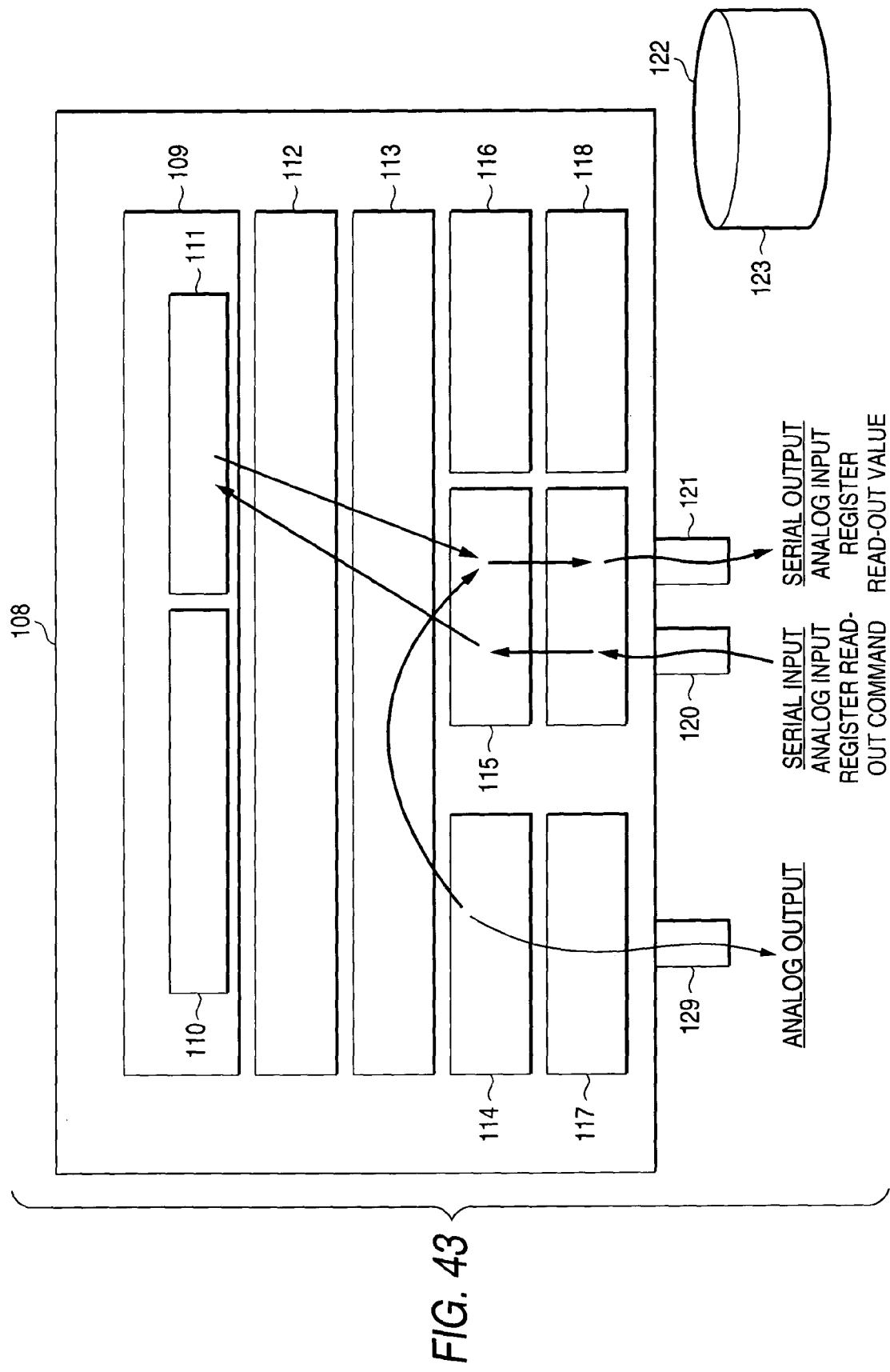
FIG. 43 is a conceptual diagram for showing an inner structure of a microcomputer in which a debug monitor is used according to a fourteenth embodiment.

The fourteenth embodiment basically comprises a method to collect the mutual analog difference properties of the microcomputers to be compared and to correct the microcomputers before using the trace. The microcomputer with a debug monitor mounted therein is used because it is necessary to read a conversion value of an analog-to-digital converter, i.e., an analog input resister in order to evaluate the analog-to-digital property of the analog input terminal. FIG. 43 shows an inner structure of a microcomputer in which the debug monitor is used. The present embodiment is different from the fourth embodiment that is explained with respect to the microcomputer with the debug monitor mounted thereon in that the present embodiment has an analog input terminal and an analog input register 114 holding a value calculated by analog-to-digital converting the analog input terminal voltage.

According to the fourteenth embodiment, at first, the analog/digital difference properties of the normal microcomputer and the defective microcomputer may be obtained. On the microcomputer socket 36 on the analysis board 24, the normal microcomputer is mounted, and at the work station, an analog input correction software 123 is operated, an initial value in the range of measurement (in the present embodiment, 0H) is set (by inputting an analog input register read-out command, a response of a read-out value is obtained), and the corresponding analog voltage is outputted to be applied to the analog input terminal of the microcomputer.

Figure 44:
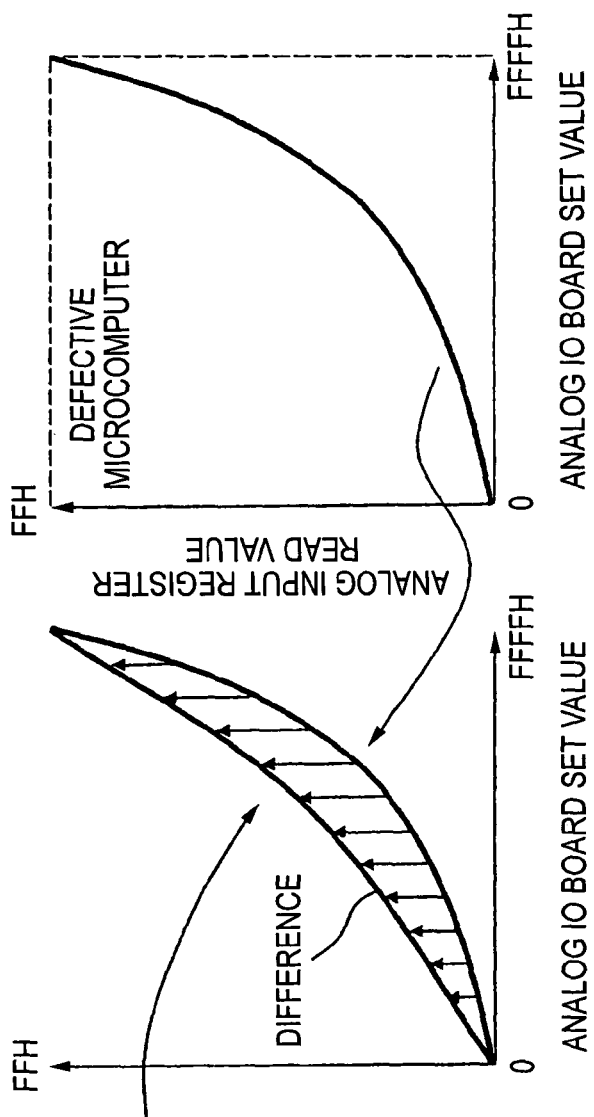
FIG. 44 is a correlation diagram between an analog IO board value and an analog input resister value according to the fourteenth embodiment.

In the next place, by using a function of the debug monitor, the analog-to-digital conversion is carried out on the microcomputer so as to obtain the conversion value of an analog-to-digital converter, i.e., the analog input resister. In the next place, the set value of the analog IO board is increased (01H) to change the output voltage and obtain the analog input resister in the same way. By repeating this operation up to an upper limit (in the present embodiment, FFFFH), the correlation between an output set value of an analog IO board and an analog input resister value may be obtained. FIG. 44 is a correlation diagram between the analog IO board value and the analog input resister value according to the fourteenth embodiment. FIG. 44(A) shows the output set value of the analog IO board.

Figure 45:
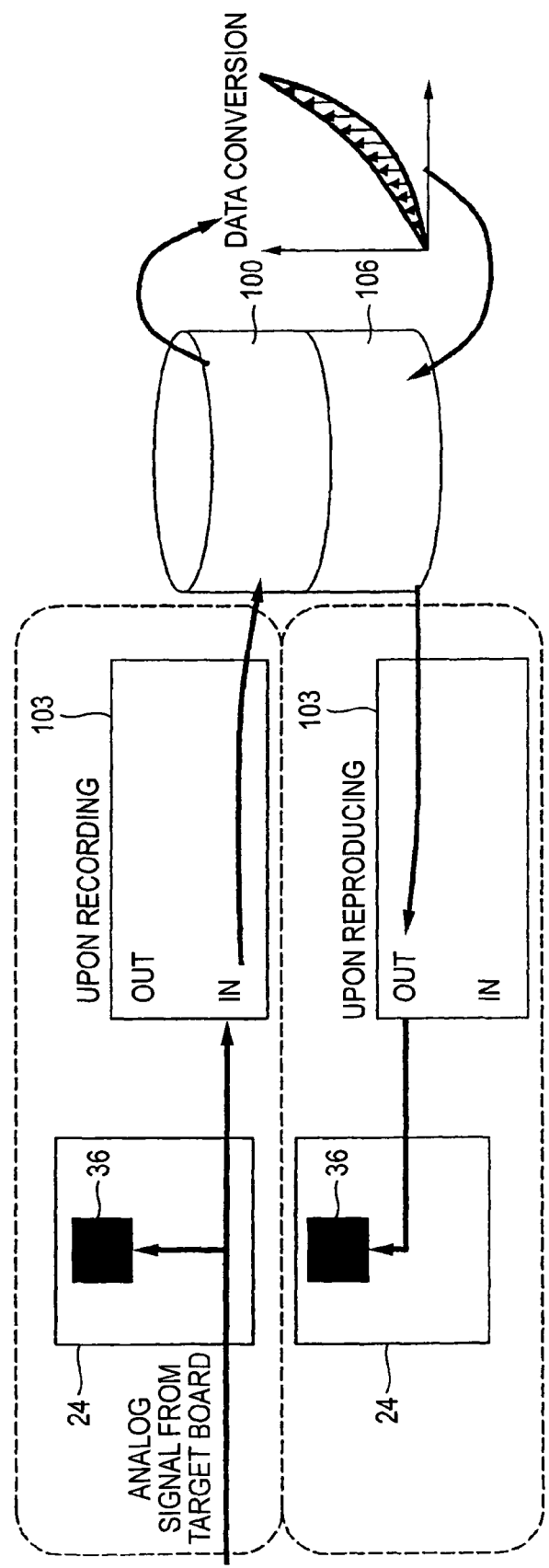
FIG. 45 is a conceptual diagram for showing the operation to correct an analog conversion property from a difference of a correlation property according to the fourteenth embodiment.

In the next place, the microcomputer to be mounted is replaced with the defective microcomputer to obtain the correlation in the same way. FIG. 44(C) shows an analog input resister value. From these correlations, the difference of the correlation properties ((B) in FIG. 44) can be obtained. According to this difference, it becomes possible to correct the analog conversion property (FIG. 45).

In the next place, as in the twelfth embodiment, the data with respect to the defective microcomputer is recorded to obtain the recorded analog trace data. According to the twelfth embodiment, the recorded analog trace data is duplicated into the output analog trace data without processing, however, according to the present embodiment, the recorded analog trace data is corrected due to the difference property to generate the output analog trace data. According to this correction, the analog input resister values of the normal microcomputer and the defective microcomputer after analog-to-digital conversion should synchronize with each other. Then, upon reproducing, the generated output analog trace data may be used.

As described above, according to the fourteenth embodiment, even the defective microcomputer and the normal microcomputer having different analog input properties can obtain the equivalent reproduction conditions by correcting the analog input properties due to the difference.

(Fifteenth Embodiment)

A fifteenth embodiment solves the problem 1 that the repeatability of the defect is not good. According to the thirteenth embodiment, the recording operation, the reproducing operation, and the analysis operation have been possible in the microcomputer having the analog output terminal 155, however, in the digital-to-analog conversion, the individual difference of digital-to-analog conversion for each microcomputer is found, and even in the case that the same value is set, the output voltage may be different and thereby, the reproduction and analysis operations are not normally carried out. According to the fifteenth embodiment, a method to absorb this individual difference is provided.

Figure 46:
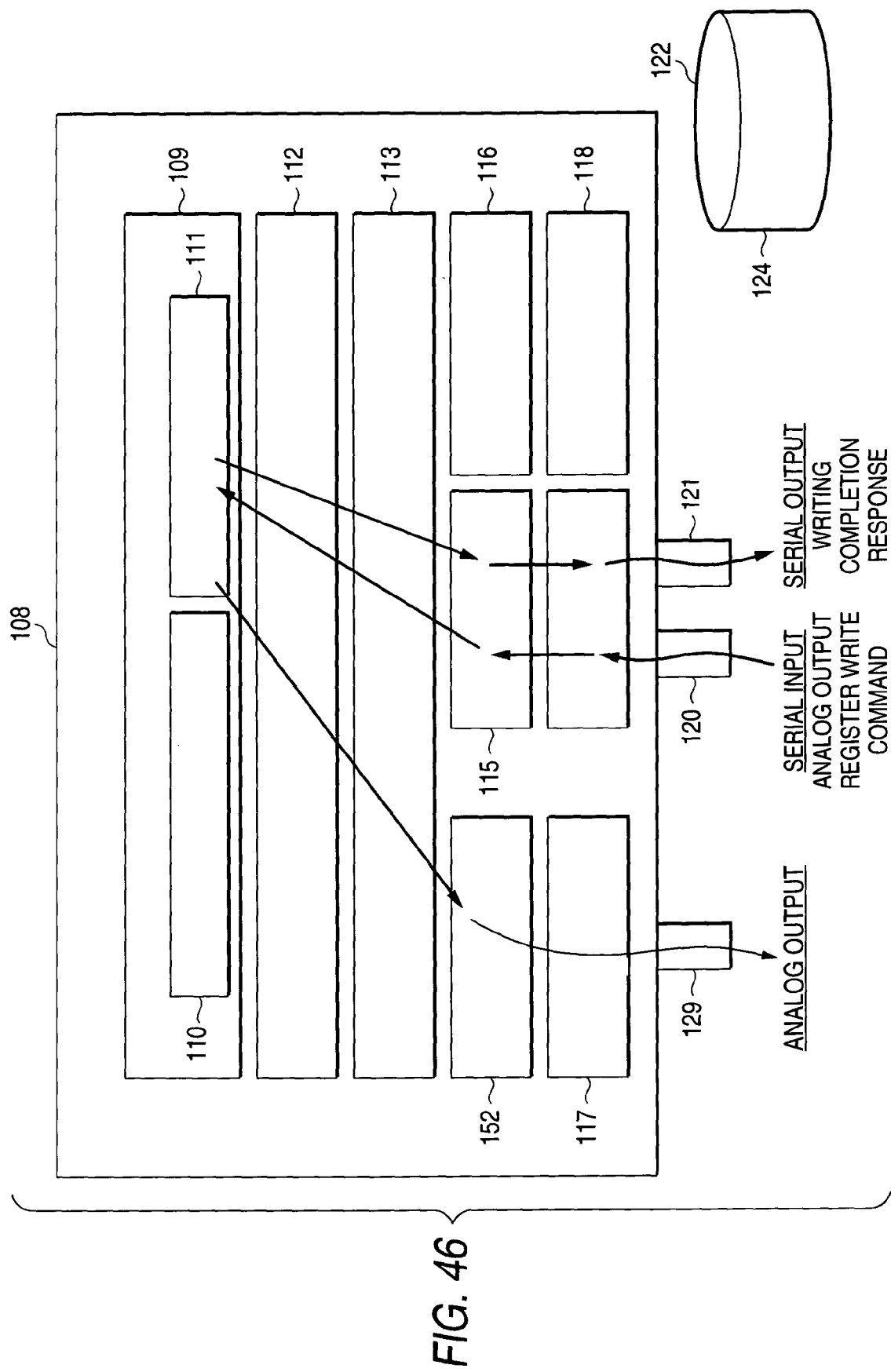
FIG. 46 is a conceptual diagram for showing an inner structure of a microcomputer in which a debug monitor is used according to a fifteenth embodiment.

The fifteenth embodiment comprises a method to collect the mutual analog difference properties of the microcomputers to be compared and to correct the microcomputers due to the trace comparison. The microcomputer with a debug monitor mounted therein is used because it is necessary to write a set value of a digital-to-analog converter, i.e., an analog output resister in order to evaluate the digital-to-analog property of the analog output terminal. FIG. 46 shows an inner structure of a microcomputer in which the debug monitor is used.

The present embodiment is different from the fourth embodiment that is explained with respect to the microcomputer with the debug monitor mounted thereon in that the present embodiment has an analog output terminal 129 and an analog output register 152 holding a set value of the analog output voltage.

According to the fifteenth embodiment, at first, the digital/ analog difference properties of the normal microcomputer and the defective microcomputer may be obtained. At first, on the microcomputer socket on the analysis board, the normal microcomputer is mounted, and at the work station, an analog output correction software 124 is operated, a debug monitor 111 is operated, an initial value in the range of setting (in the present embodiment, 0H) is set in an analog output resister 152 (by inputting an analog output register write command seriably, a response of completion of writing is obtained), the digital-to-analog conversion operation is carried out, the digital-to-analog conversion value is outputted to the analog output terminal, and this voltage is analog-to-digital converted by the analog IO board 103 to read the analog-to-digital conversion value.

In the next place, the analog output resister value is increased (01H) and the output voltage is changed to read the analog-to-digital conversion value of the analog IO board 103 in the same way. This operation is repeated up to the upper limit (in the present embodiment, FFH) so as to obtain the correlation between the set value of the analog output register 152 and the analog-to-digital conversion value of the analog IO board. FIG. 47 is a correlation diagram between the analog output set value and the analog IO board input value. FIG. 47 shows an analog output set value (A).

Figures 47A, 47B, 47C:
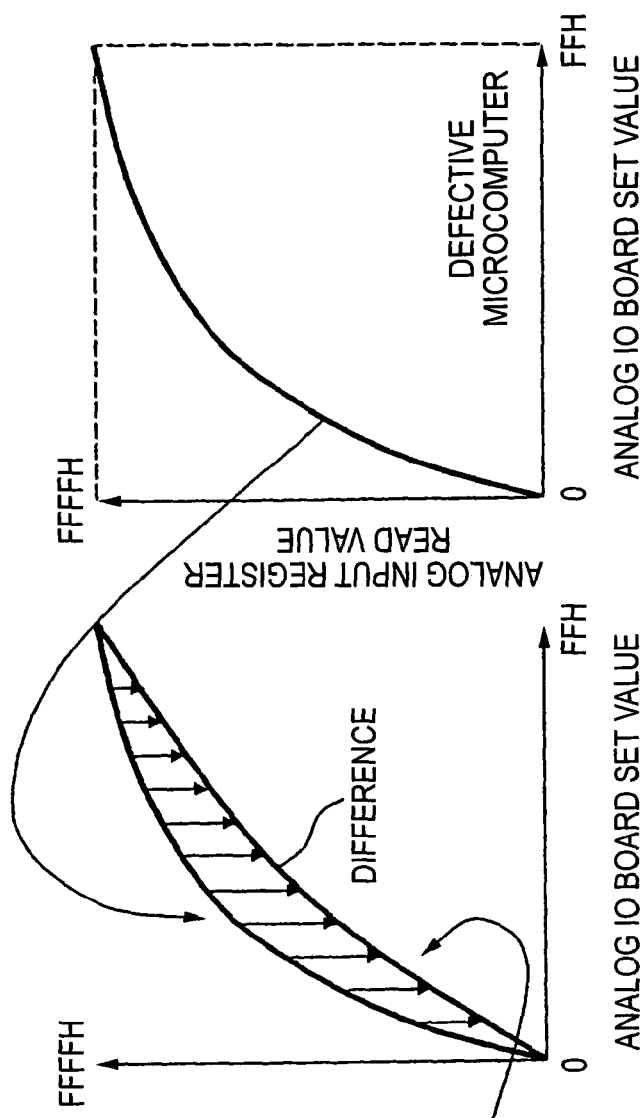
FIG. 47 is a correlation diagram between an analog output set value and an analog IO board input value according to the fifteenth embodiment.

In the next place, by replacing the mounted microcomputer with the defective microcomputer, the correlation is obtained in the same way. The analog IO board input value is shown in FIG. 47(C). Due to the correlation between the both microcomputers, the difference of the correlation properties, i.e., (B) shown in FIG. 47 may be obtained, and due to this difference, it becomes possible to correct the analog conversion property.

In the next place, as in the thirteenth embodiment, the data is recorded with respect to the defective microcomputer and the correction due to the difference property is carried out to generate the comparative analog trace data. According to this correction, the comparative analog trace data should synchronize with the analog output value of the defective microcomputer. Then, upon reproducing, as in the thirteenth embodiment, the reproduced analog trace data is obtained. In the next place, as in the thirteenth embodiment, the comparative analog trace data is compared to the reproduced analog trace data (FIG. 48).

As described above, according to the fifteenth embodiment, even the defective microcomputer and the normal microcomputer having different analog output properties can be compared with each other without depending on the individual difference by correcting the analog output properties due to the difference.

(Sixteenth Embodiment)

A sixteenth embodiment solves the problem 1 that the repeatability of the defect is not good and the problem 2 that it is difficult to analyze relevance between the true defect and the detected defect. According to the fourth embodiment, by using the debug monitor, the inner information of the microcomputer is obtained, however, this involves a problem that the resource competition with the application software may arise since the debug monitor is software, and this results in difficulty of coexistence. An object of the sixteenth embodiment is to prevent the above described problem due to on-chip debugger mounting.

Figure 49:
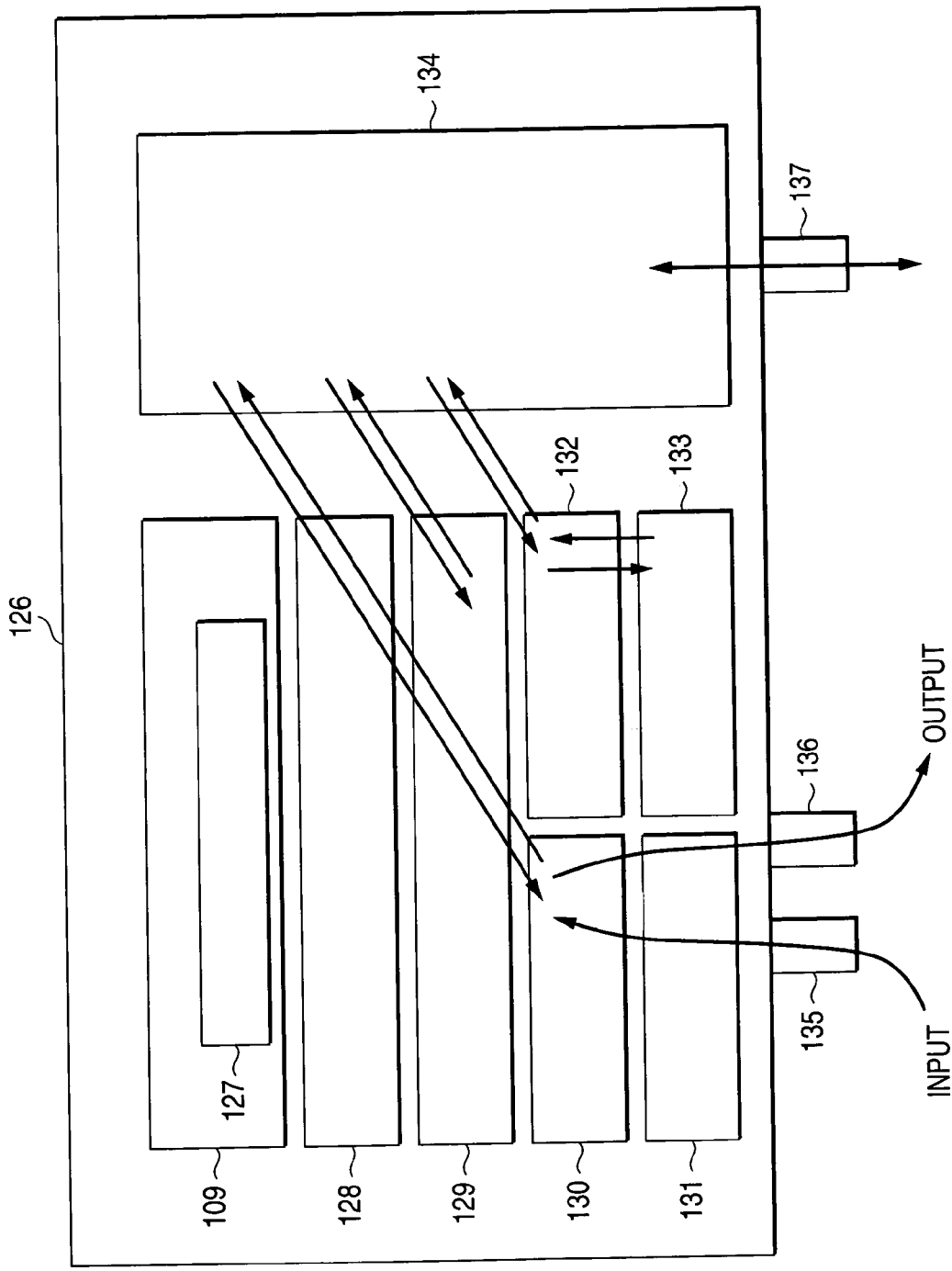
FIG. 49 is a conceptual diagram for showing an inner structure of a microcomputer in which an on-chip debugger is mounted according to a sixteenth embodiment.

FIG. 49 shows an inner structure of the microcomputer in which an on-chip debugger 134 is mounted. The on-chip debugger 134 has an interface 137 exclusively for the debug and it has a function to stop application software 127 by activating this debugger interface 137 and to enable the resources of a microcomputer 126 such as a RAM 129, resisters 130 and 132 or the like to be operated.

Figure 50:
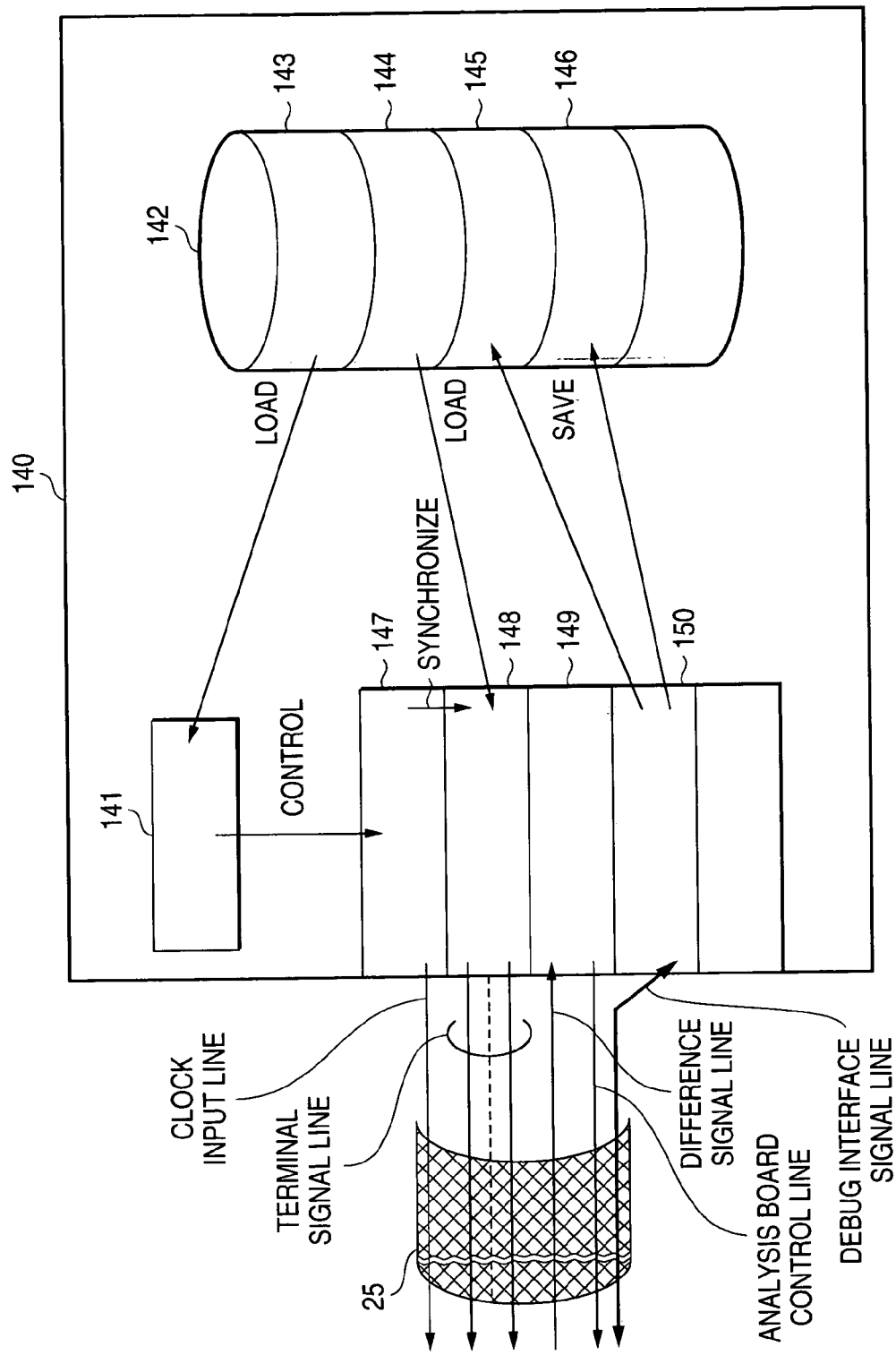
FIG. 50 is a conceptual diagram for showing a structure of a work station to support the on-chip debugger upon analyzing according to the sixteenth embodiment.

FIG. 50 shows a structure of a work station to support this on-chip debugger (upon analyzing). The present embodiment is modified in the following points as compared to the fourth embodiment. A debug interface board 150 is a dual-directional interface to support the on-chip debugger 134. A debug interface signal line serves to connect the debugger interface 137 of the microcomputer 126 to the debug interface board 150 of a work station 140.

According to the sixteenth embodiment, as same as the fourth embodiment, the information within the microcomputer upon analyzing is obtained and the on-chip debugger is operated in place of the debug monitor.

As described above, according to the sixteenth embodiment, since the monitor debugger is needed to be installed in a program, the present evaluation system cannot be used with respect to the microcomputer without loading the debug monitor in the software. In addition, in each application, a resource to be used for the debug monitor is changed, which has the potential that the interface is changed. However, in the case of using the microcomputer on which the on-chip debugger is loaded, the present embodiment can be applied to all the corresponding microcomputers, and since these microcomputer have the same debug interfaces, the debug interface board can be shared therebetween, so that the applicable range of the present on-chip debugger can extend.

(Seventeenth Embodiment)

A seventeenth embodiment solves the problem 4 that it is difficult to build an analysis system. According to the following embodiments 1 to 16, in order to build the system according to the present invention, the following many softwares should be developed to be used for the work station. For example, record software (with module, digital); record software (with module, digital, analog); record software (without module, digital); record software (without module, digital, analog); reproduce software (without module, digital, analog); analysis software (without module, digital, analog, supporting the monitor debugger); analysis software (without module, digital, analog, supporting the on-chip debugger); automatic trace software (without module, digital, analog); resume software; . . . may be cited.

With respect to each software, a complicated parameter for each target microcomputer such as with or without analog, with or without a debug monitor, a type of interfaces is required, and thereby, many developing steps are needed to develop all softwares. Therefore, an object of the seventeenth embodiment is to provide a software structure for raising a development efficiency of these softwares.

Figure 51:
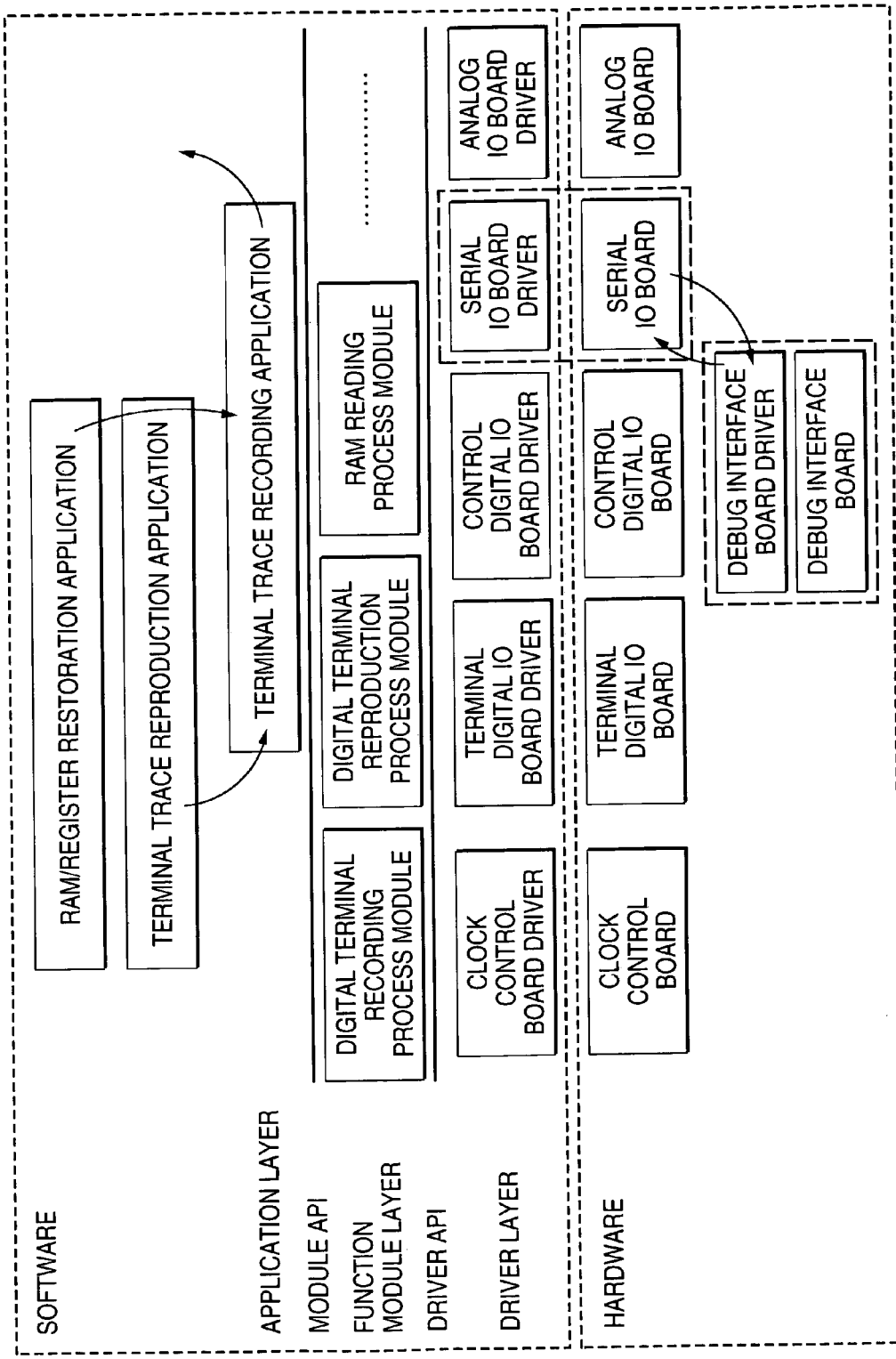
FIG. 51 is a conceptual diagram for showing a structure of host software according to a seventeenth embodiment.

FIG. 51 shows a structure of host software. Depending on the debug monitor and the on-chip debugger, there are two types of host softwares in which the debugger interface is a serial IO or a debug interface. In FIG. 51, items in an enclosure of the software relate to the inner structure of the software of the work station.

The software is composed of three layers. The lowest layer is a driver layer and this layer provides a driver to support a board to be mounted. A clock control board driver supports a clock control board.

At a top of the driver layer, functional module layers are located and between these layers, a driver API (an application interface) is defined. Through this interface, the communication between processes will be established.

An object of the driver layer is to absorb the difference of the board within the driver even in the case that the different board is mounted and to provide the same driver API. As an example, the serial IO that is used as the debug interface in the fourth embodiment is used here, and in the case of changing this into the on-chip debugger that is used in the sixteenth embodiment, by replacing the both of the interface board and the driver, the driver absorbs the difference of the hardware and there is no need to change the driver API for the debugger, and thereby, it is not necessary to change the software module of the functional module layer.

At a top of the functional module layer, application layers are located and between these layers, a module API is defined. Through this interface, the communication between processes will be established. An object of the module layer is to uncompress a process module in function unit that is required to manufacture the software for such as the digital terminal recording process and the digital terminal reproduction process.

With respect to the access to the hardware, the functional module establishs the communication between the processes with the driver through the driver API, and with respect to the application layer, the functional module provides the module API.

An object of the application layer is to provide applications such as the above mentioned record software and reproduce software and the application layer serves to simplify the implementation of the functions by accessing the functional module through the module API.

According to the seventeenth embodiment, in the actual software development, the definitions of the driver API and the module API are clarified and, with respect to the required hardware, individual function and application, a driver, a module, and an application are developed individually.

As described above, by realizing the software layered structure according to the seventeenth embodiment, it becomes possible to develop each of driver, module and application independently and the common resources can be used, which results in making it possible to develop an evaluation system having a good efficiency of development and much flexibility.

(Eighteenth Embodiment)

An eighteenth embodiment solves the problem 2 that it is difficult to analysis reliability between the true defect and the detected defect. The target system may involve a problem that the defect other than that of the microcomputer is difficult to be analyzed because the repeatability of the defect is poor and the reduction cannot be caught at a real speed. Therefore, by applying the system according to the present invention to the target system mounting the microcomputer thereon, the defect analysis of the entire system is made possible.

Figure 52:
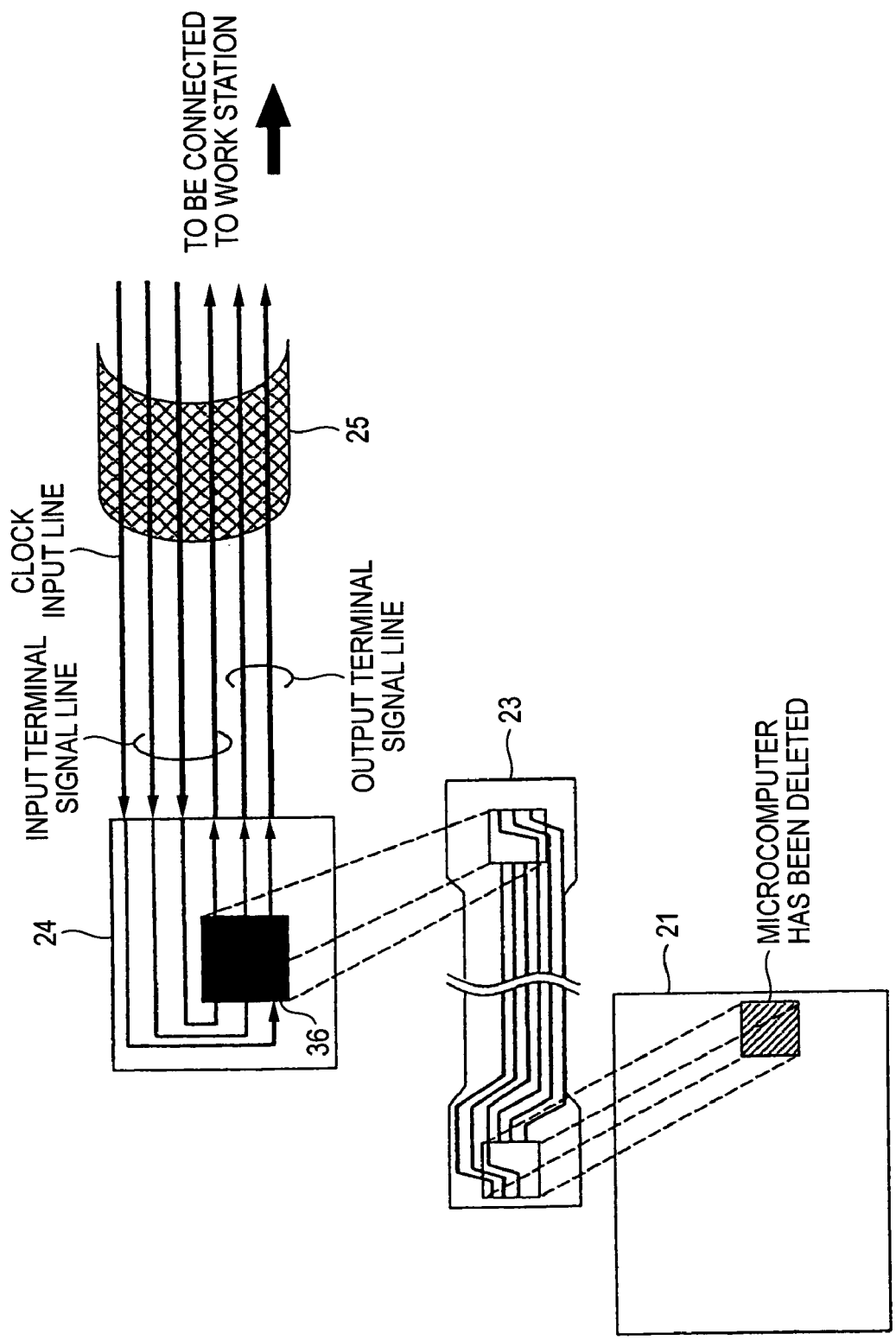
FIG. 52 is a conceptual diagram for showing an application to a target system according to the seventeenth embodiment.
Figure 53:
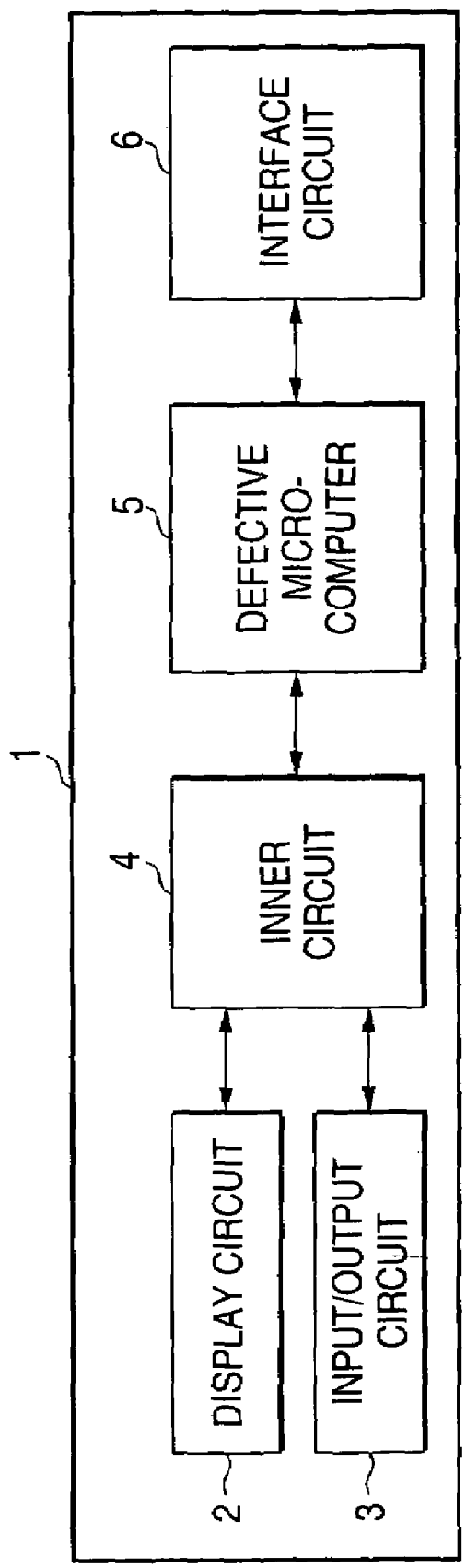
FIG. 53 is a conceptual diagram for showing a condition that a defective microcomputer is incorporated in a target system of a conventional failure analysis.
Figure 54:
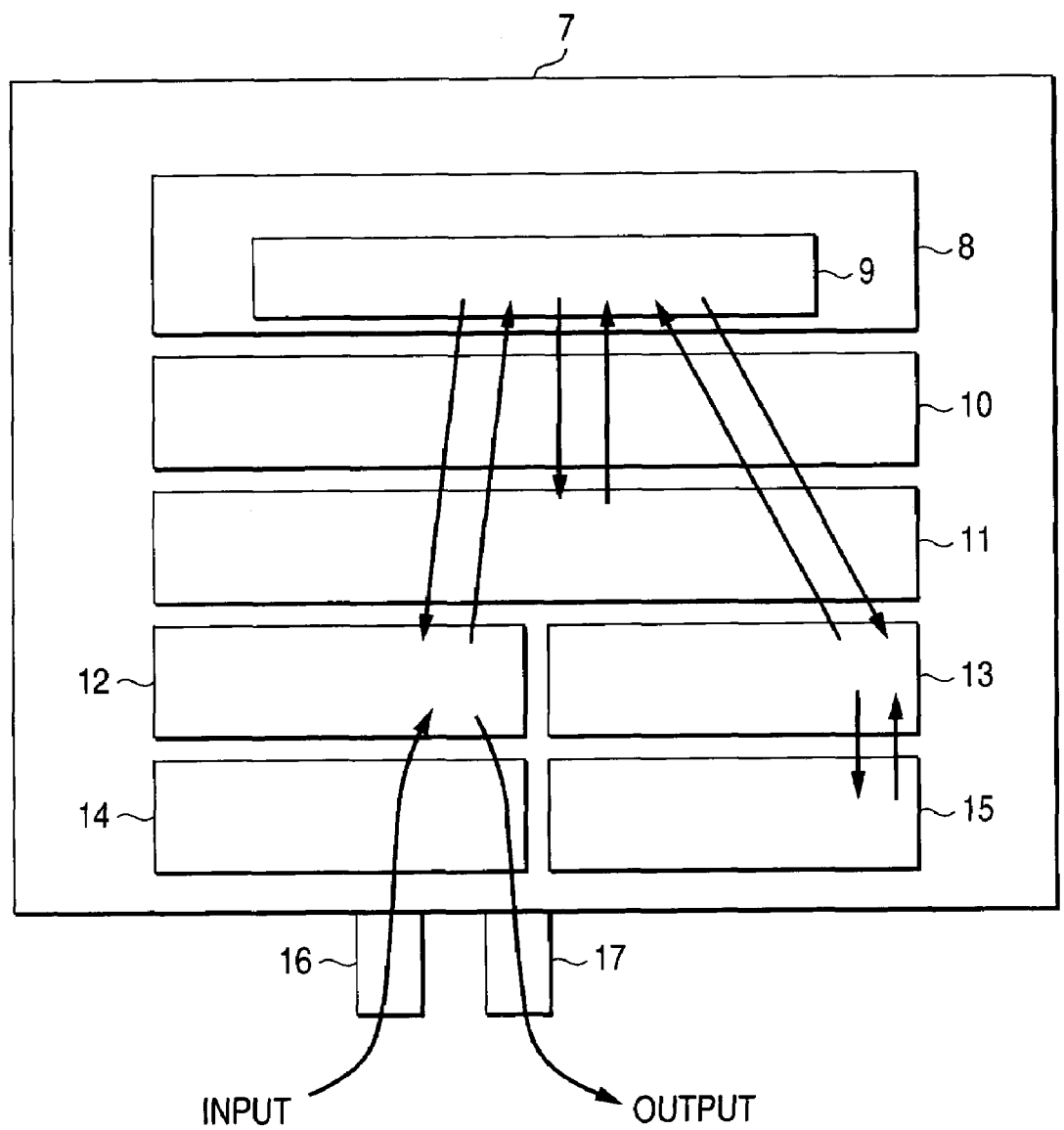
FIG. 54 is a conceptual diagram for showing an inner structure of a normal microcomputer.
Figure 55:
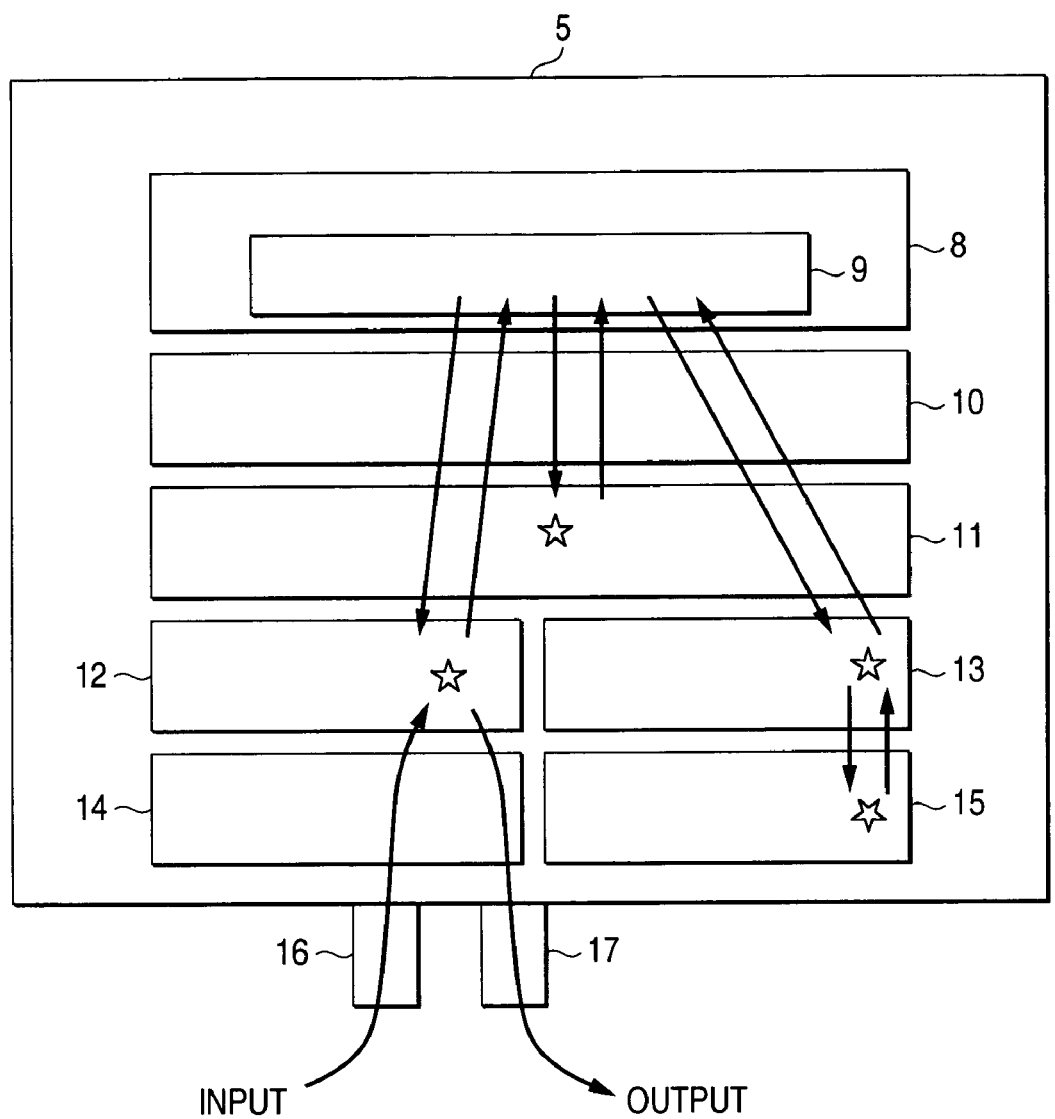
FIG. 55 is a conceptual diagram for showing an inner structure of a defective microcomputer.

FIG. 52 shows an application to a target system. Through the inspection probe, the analysis board is connected to the system from which the microcomputer is removed.

By reproducing the terminal trace in which the generation of the defect obtained in advance is recorded, it is possible to reproduce the defect of the system any number of times. In addition, lowering the clock speed decreases a signal speed for transmitting a signal from the microcomputer to the outside and makes it possible to easily catch the decrease in the defect of the system.

As described above, according to the eighteenth embodiment, in the microcomputer having mounted a system thereon, at a speed suitable for the analysis, the defect can be reproduced certainly. Therefore, the analysis efficiency of the defect as the system is improved.

As above, the preferable examples of the failure analysis system of the logic LSI and the failure analysis method according to the present invention are described with reference to the attached drawings, however, the present invention is not limited to these examples. It is obvious for so called skilled person in the art to make various altered or modified examples within a range of a technical idea that is described in What is claimed is, and it is appreciated that these altered or modified examples belong to a technical range of the present invention obviously.

As described above, according to the present invention, it is possible to provide a failure analysis system and a failure analysis method of a logic LSI, whereby the reproductbility of the defect is excellent, it is easy to analyze the relativity between the true defect and the detected defect, it is easy to establish the test method to prevent the reappearance of the defect, and it is easy to build the analysis system.

What is claimed is:

1. A failure analysis system having software incorporated therein, comprising:
    a function to record a test terminal signal information of a testing logic LSI as a target of analysis in synchronization with a clock signal;
    a function to reproduce said test recorded terminal signal information in synchronization with the clock signal; and a function to compare said reproduced terminal signal information with a reference terminal signal information of a normal logic LSI,
    wherein the test terminal signal information includes a trace data map of a condition change in a register data and a RAM data for a specific period of time.

2. A failure analysis system according to claim 1, wherein said failure analysis system further has a function to generate a plurality of trace difference maps by generating a plurality of defects and to obtain an average and a data spread of a difference by a statistical work.

3. A failure analysis system according to claim 1, wherein said failure analysis system further has a function to record a command trace data of a CPU in synchronization with said reference terminal signal information.

4. A failure analysis system according to claim 1, wherein said failure analysis system further has a function to connect comparative signals of a plurality of logic LSIs to multiinput OR terminals and to analyze a plurality of logic LSIs at the same time.

5. A failure analysis system according to claim 1, wherein said test terminal signal information also includes an analog signal information.

6. A failure analysis system according to claim 5, wherein said failure analysis system further has a function to obtain in advance analog/digital difference properties of the testing logic LSI and the normal logic LSI, or digital/analog difference properties thereof and to correct an analog conversion property.

7. A failure analysis system according to claim 5, wherein said testing logic LSI has an on-chip debugger mounted thereon.

8. A failure analysis system according to claim 1, wherein said failure analysis system further has layered software.

9. A failure analysis system according to claim 1, wherein the target of analysis is a system having a logic LSI mounted thereon.

10. A failure analysis method comprising:
    recording a test terminal signal information of a testing logic LSI as a target of analysis in synchronization with a clock signal;
    reproducing the recorded test terminal signal information in synchronization with the clock signal; and
    comparing the reproduced test terminal signal information with a reference terminal signal information of a normal logic LSI,
    wherein the test terminal signal information includes a trace data map of a condition change in a register data and a RAM data for a specific period of time.

11. A failure analysis method according to claim 10, further comprising:
    generating a plurality of trace difference maps by generating a plurality of defects; and
    obtaining an average and a data spread of a difference by a statistical work.

12. A failure analysis method according to claim 10, further comprising recording a command trace data of a CPU in synchronization with the reference terminal signal information.

13. A failure analysis method according to claim 10, further comprising:
    connecting a plurality of comparative signals of a plurality of logic LSIs to a plurality of multiinput OR terminals; and
    analyzing the plurality of logic LSIs at the same time.

14. A failure analysis method according to claim 10, wherein the test terminal signal information also includes an analog signal information.

15. A failure analysis method according to claim 14, further comprising:
    obtaining in advance analog/digital difference properties of the testing logic LSI and the normal logic LSI, or digital/analog difference properties thereof; and
    correcting an analog conversion property.

16. A failure analysis method according to claim 14, wherein the testing logic LSI has an on-chip debugger mounted thereon.

17. A failure analysis method according to claim 10, wherein the target of analysis is a system having a logic LSI mounted thereon.

* * * * *